US012628471B2

(12) United States Patent
Park et al.

(10) Patent No.: US 12,628,471 B2
(45) Date of Patent: May 12, 2026

(54) LIGHT-EMITTING DIODE INCLUDING AN ACTIVE LAYER DISPOSED BETWEEN A FIRST SEMICONDUCTOR LAYER AND A SECOND SEMICONDUCTOR LAYER AND DISPLAY DEVICE COMPRISING SAME

(71) Applicant: Samsung Display Co., LTD., Yongin-si (KR)

(72) Inventors: Hoo Keun Park, Yongin-si (KR);
Moon Jung An, Hwaseong-si (KR);
Dong Eon Lee, Hwaseong-si (KR);
Chul Jong Yoo, Seongnam-si (KR);
Hye Lim Kang, Hwaseong-si (KR);
Dong Gyun Kim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 904 days.

(21) Appl. No.: 17/757,218

(22) PCT Filed: Dec. 7, 2020

(86) PCT No.: PCT/KR2020/017737
§ 371 (c)(1),
(2) Date: Jun. 10, 2022

(87) PCT Pub. No.: WO2021/118181
PCT Pub. Date: Jun. 17, 2021

(65) Prior Publication Data
US 2023/0006095 A1     Jan. 5, 2023

(30) Foreign Application Priority Data
Dec. 10, 2019     (KR) ........................ 10-2019-0163904

(51) Int. Cl.
*H10H 20/819*     (2025.01)
*H01L 23/00*     (2006.01)
(Continued)

(52) U.S. Cl.
CPC ........... *H10H 20/819* (2025.01); *H01L 24/05* (2013.01); *H01L 24/24* (2013.01); *H01L 24/25* (2013.01);
(Continued)

(58) Field of Classification Search
CPC .............. H10H 20/818; H10H 20/819; H10H 20/01335; H10H 20/835; H10H 20/83;
(Continued)

(56) References Cited

U.S. PATENT DOCUMENTS 8,129,710 B2     3/2012   Cho et al.
9,997,561 B2 *   6/2018   Cha ........................ H10H 20/81
(Continued)

FOREIGN PATENT DOCUMENTS

CN     107452763 A     12/2017
CN     108695416 A     10/2018
(Continued)

OTHER PUBLICATIONS

International Search Report of PCT/KR2020/017737, Mar. 22, 2021, 4 pages.
(Continued)

*Primary Examiner* — Khiem D Nguyen
(74) *Attorney, Agent, or Firm* — Womble Bond Dickinson (US) LLP

(57) ABSTRACT

A light-emitting element including: a first semiconductor layer doped with a first type of dopant; a second semiconductor layer doped with a second type of dopant that is different from the first type of dopant; and an active layer between the first semiconductor layer and the second semiconductor layer, wherein a length of the light-emitting element measured in a first direction, which may be a direction in which the first semiconductor layer, the active layer, and the second semiconductor layer may be arranged, (Continued)

may be shorter than the width measured in a second direction that is perpendicular to the first direction.

21 Claims, 48 Drawing Sheets

(51) Int. Cl.
    *H01L 25/16*         (2023.01)
    *H10H 20/857*      (2025.01)

(52) U.S. Cl.
    CPC ......... *H01L 25/167* (2013.01); *H10H 20/857* (2025.01); *H01L 24/95* (2013.01); *H01L 2224/05083* (2013.01); *H01L 2224/05139* (2013.01); *H01L 2224/05186* (2013.01); *H01L 2224/05617* (2013.01); *H01L 2224/05624* (2013.01); *H01L 2224/05639* (2013.01); *H01L 2224/05647* (2013.01); *H01L 2224/05655* (2013.01); *H01L 2224/05686* (2013.01); *H01L 2224/24051* (2013.01); *H01L 2224/24101* (2013.01); *H01L 2224/24105* (2013.01); *H01L 2224/24137* (2013.01); *H01L 2224/24147* (2013.01); *H01L 2224/245* (2013.01); *H01L 2224/2512* (2013.01); *H01L 2224/95102* (2013.01); *H01L 2924/01057* (2013.01); *H01L 2924/0549* (2013.01); *H01L 2924/12041* (2013.01)

(58) Field of Classification Search
    CPC .... H10H 20/84; H10H 20/821; H10H 29/142; H10H 20/018; H10H 20/857; H10H 20/831; H01L 2224/05083; H01L 2924/12041; H01L 25/167; H01L 25/0753
    See application file for complete search history.

(56)         References Cited

U.S. PATENT DOCUMENTS

| | | |
|---|---|---|
| 10,026,777 B2 | 7/2018 | Kang et al. |
| 10,269,865 B2 | 4/2019 | Kang et al. |
| 10,388,693 B2 | 8/2019 | Cha et al. |
| 10,644,062 B2 | 5/2020 | Cha et al. |
| 10,665,633 B2 | 5/2020 | Kang et al. |
| 11,088,197 B2 | 8/2021 | Kang et al. |
| 11,251,225 B2 | 2/2022 | Cha et al. |
| 11,610,934 B2 | 3/2023 | Kang et al. |
| 12,283,604 B2 | 4/2025 | Kang et al. |
| 2003/0206332 A1 | 11/2003 | Yamazaki et al. |
| 2004/0263425 A1* | 12/2004 | Anzai ....................... G06F 1/32 345/1.1 |
| 2007/0181877 A1* | 8/2007 | Lim ....................... H10D 86/60 257/E27.111 |
| 2007/0278511 A1* | 12/2007 | Ohno ....................... H01L 24/33 257/E33.059 |
| 2010/0061093 A1 | 3/2010 | Janssen et al. |
| 2012/0223345 A1* | 9/2012 | Tomoda ............... H10H 20/841 257/89 |
| 2013/0126898 A1* | 5/2013 | Kato .................... H10H 20/812 438/46 |
| 2013/0240846 A1* | 9/2013 | Im .......................... H10K 50/30 257/43 |
| 2014/0312332 A1* | 10/2014 | Lowenthal ............. H10K 50/84 257/40 |
| 2016/0020358 A1 | 1/2016 | Lee et al. |
| 2016/0155913 A1 | 6/2016 | Maki |
| 2017/0133341 A1* | 5/2017 | Seddon ................... H01L 24/30 |
| 2017/0133550 A1 | 5/2017 | Schuele et al. |
| 2017/0331008 A1* | 11/2017 | Wang ................... H10H 20/812 |
| 2019/0051724 A1 | 2/2019 | Do et al. |
| 2019/0115328 A1* | 4/2019 | Lee ....................... H10H 20/855 |
| 2019/0312063 A1* | 10/2019 | Yamazaki ........... H10D 86/481 |
| 2022/0375915 A1* | 11/2022 | Kim ........................ H01L 24/83 |

FOREIGN PATENT DOCUMENTS

| | | |
|---|---|---|
| KR | 2017-0104829 A | 9/2017 |
| KR | 2017-0105996 A | 9/2017 |
| KR | 2018-0071465 A | 6/2018 |
| KR | 2019-0105537 A | 9/2019 |
| KR | 2019-0106885 A | 9/2019 |
| KR | 2019-0113695 A | 10/2019 |
| KR | 2019-0126260 A | 11/2019 |
| WO | WO 2014/025195 A1 | 2/2014 |
| WO | WO 2018/217006 A2 | 11/2018 |

OTHER PUBLICATIONS

Chinese Office Action dated Sep. 24, 2024 regarding Chinese Patent Application No. 202080086143.2 corresponding to U.S. Appl. No. 17/757,218 (11 pages).

Korean Notice of Allowance for KR Application No. 10-2019-0163904, dated Jun. 10, 2025, 3 pages.

\* cited by examiner

LIGHT-EMITTING DIODE INCLUDING AN ACTIVE LAYER DISPOSED BETWEEN A FIRST SEMICONDUCTOR LAYER AND A SECOND SEMICONDUCTOR LAYER AND DISPLAY DEVICE COMPRISING SAME

CROSS-REFERENCE TO RELATED APPLICATION

This application is a U.S. National Phase Patent Application of International Patent Application Number PCT/KR2020/017737, filed on Dec. 7, 2020, which claims priority to Korean Patent Application Number 10-2019-0163904, filed on Dec. 10, 2019, the entire contents of all of which are incorporated by reference herein.

BACKGROUND

1. Field

The present disclosure relates to a light-emitting element and a display device including the same.

2. Description of Related Arts

The importance of display devices has steadily increased with the development of multimedia technology. In response thereto, various types of display devices such as an organic light emitting display (OLED), a liquid crystal display (LCD) and the like have been used.

A display device is a device for displaying an image, and includes a display panel, such as an organic light-emitting display panel or a liquid crystal display panel. The light-emitting display panel may include light-emitting elements, e.g., light-emitting diodes (LED), and examples of the light-emitting diode include an organic light-emitting diode (OLED) using an organic material as a fluorescent material and an inorganic light-emitting diode using an inorganic material as a fluorescent material.

SUMMARY

Aspects of embodiments of the present disclosure provide a light-emitting element having a width greater than a height and a display device including the same.

Aspects of embodiments of the present disclosure also provide a display device including a light-emitting element located between electrodes vertically facing (e.g., opposing) each other.

It should be noted that aspects of the present disclosure are not limited thereto and other aspects, which are not mentioned herein, will be apparent to those of ordinary skill in the art from the following description.

According to one or more embodiments of the present disclosure, a light-emitting element includes a first semiconductor layer doped with a first type of dopant, a second semiconductor layer doped with a second type of dopant that is different from the first type of dopant, and an active layer between the first semiconductor layer and the second semiconductor layer, wherein a length of the light-emitting element measured in a first direction, which is a direction in which the first semiconductor layer, the active layer, and the second semiconductor layer are arranged, is less than a width thereof measured in a second direction that is perpendicular to the first direction.

The light-emitting element may have an aspect ratio greater than about 0.1.

The light-emitting element may further include an insulating film that partially surrounds at least an outer surface of the active layer in a plan view.

The light-emitting element may further comprise an electrode layer on one surface of at least one of the first semiconductor layer and the second semiconductor layer.

The insulating film may surround an outer surface of the electrode layer in a plan view while exposing at least a portion of the outer surface of the electrode layer.

The first semiconductor layer may include a body portion and an extension portion having a greater width in the second direction than a width of the body portion in the second direction, and the active layer may be on the body portion.

The insulating film may surround an outer surface of the body portion while exposing an upper surface of the extension portion.

The light-emitting element may have a shape in which a side surface thereof is inclined so that a width of the first semiconductor layer measured in the second direction is greater than a width of the second semiconductor layer measured in the second direction.

The light-emitting element may further include a third semiconductor layer between the first semiconductor layer and the active layer, a fourth semiconductor layer between the active layer and the second semiconductor layer, and a fifth semiconductor layer between the fourth semiconductor layer and the second semiconductor layer.

According to one or more embodiments of the present disclosure, a display device includes a first substrate, a first electrode on the first substrate, a second electrode on the first electrode, a light-emitting element between the first electrode and the second electrode, and including one end electrically connected to the first electrode and the other end electrically connected to the second electrode, and a first insulating layer located between the first electrode and the second electrode to partially surround an outer surface of the light-emitting element, wherein the light-emitting element includes: a first semiconductor layer doped with a first type of dopant, a second semiconductor layer doped with a second type of dopant that is different from the first type of dopant, and an active layer between the first semiconductor layer and the second semiconductor layer, wherein a length of the light-emitting element in a first direction, which is a direction in which the first semiconductor layer, the active layer, and the second semiconductor layer are arranged, is less than a width thereof in a second direction that is perpendicular to the first direction.

The one end of the light-emitting element may be in direct contact with the first electrode, and the other end thereof may be in direct contact with the second electrode.

At least a partial area of the other end of the light-emitting element may protrude from an upper surface of the first insulating layer, and the second electrode may cover the protruding other end.

A width of the second electrode measured in the second direction may be greater than a width of the first electrode measured in the second direction.

A width of the second electrode measured in the second direction may be less than the width of the light-emitting element measured in the second direction.

The display device may further comprise a first contact electrode on the first electrode, and a second contact electrode between the first insulating layer and the second electrode, wherein the one end of the light-emitting element may be in direct contact with the first contact electrode, and the other end thereof may be in direct contact with the second contact electrode.

The first electrode may include a first electrode base layer for reflecting light emitted from the light-emitting element and a first electrode upper layer on the first electrode base layer.

The light-emitting element may include a first type light-emitting element in which the first semiconductor layer is electrically connected to the first electrode and a second type light-emitting element in which the first semiconductor layer is electrically connected to the second electrode.

The display device may further include a second insulating layer covering the first insulating layer and the second electrode.

At least one of the first insulating layer and the second insulating layer may further include a scatterer.

The first electrode may define a groove portion that is level with an upper surface thereof, and the light-emitting element may be in the groove portion.

The first semiconductor layer of the light-emitting element may include a body portion in which the active layer is located and an extension portion having a width in the second direction that is greater than a width of the body portion, and that is less than a width of the groove portion.

The display device may further include a third contact electrode in contact with one side of the extension portion of the light-emitting element and the first electrode, and a fourth contact electrode in contact with the other side of the extension portion and the first electrode.

The display device may further comprise a third insulating layer on the first electrode, and defining an opening exposing a portion of an upper surface of the first electrode and having the light-emitting element therein.

According to one or more embodiments of the disclosure, a display device includes a first substrate having a plurality of pixels, a first electrode on the first substrate and in the pixels, a second electrode partially overlapping the first electrode, and a light-emitting element having a width that is greater than a separation distance between the first electrode and the second electrode, and including one end electrically connected to the first electrode, another end electrically connected to the second electrode, a first semiconductor layer doped with a first type of dopant, a second semiconductor layer doped with a second type of dopant that is different from the first type of dopant, and an active layer between the first semiconductor layer and the second semiconductor layer.

The first electrode may be in a first pixel of the pixels, and the light-emitting element may include a first light-emitting element between the first electrode and the second electrode.

The second electrode may be in the first pixel, and has a width that is greater than a width of the first electrode measured in one direction.

The display device may further comprise a third electrode on the first substrate of a second pixel of the pixels, wherein the second electrode partially overlaps the third electrode in the second pixel, and the light-emitting element further may include a second light-emitting element between the second electrode and the third electrode.

The display device may further include a bank layer on the first substrate to at least partially surround the pixels.

The first electrode may define a groove portion extending in one direction and defined by a recessed portion of an upper surface of the first electrode, and the light-emitting element may be in the groove portion and arranged along the one direction.

The second electrode may extend in the one direction and overlaps the groove portion of the first electrode.

The details of other embodiments are included in the detailed description and the accompanying drawings.

A light-emitting element according to one or more embodiments can have a width greater than a height that is a direction in which a plurality of semiconductor layers are stacked. The light-emitting element can include an active layer with a great area and light-emitting efficiency can be improved.

Further, a display device according to one or more embodiments can include the light-emitting element and electrodes spaced apart from each other in a height direction of the light-emitting element. The light-emitting element having a great width can be in contact with each of the electrodes in a wide area. In addition, the light-emitting element can be located such that both ends thereof, through which light emits, face in an upward direction with respect to a substrate on which the electrodes and the light-emitting element are located, and light generated in an active layer of the light-emitting element can be directly emitted toward the upward direction with respect to the substrate.

The effects according to the embodiments are not limited by the contents exemplified above, and more various effects are included in this disclosure.

DETAILED DESCRIPTION

The present disclosure will now be described more fully hereinafter with reference to the accompanying drawings, in which embodiments of the present disclosure are shown. This present disclosure may, however, be embodied in different forms and should not be construed as limited to the embodiments set forth herein. Rather, these embodiments are provided so that the present disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Hereinafter, embodiments will be described with reference to the accompanying drawings.

Figure 1:
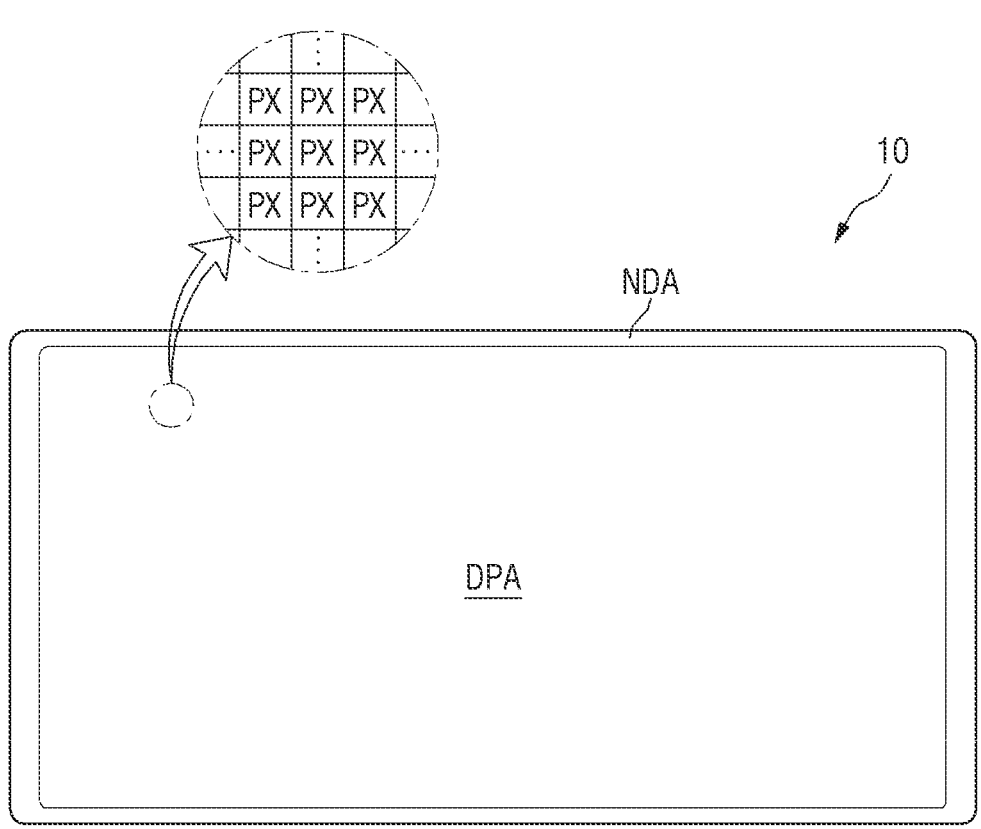
FIG. 1 is a plan view of a display device according to one or more embodiments.
Figure 1:
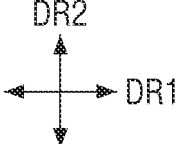

FIG. 1 is a schematic plan view of a display device according to one or more embodiments.

Referring to FIG. 1, a display device 10 displays a video or a still image. The display device 10 may refer to all electronic devices that provide a display screen. For example, the display device 10 may include a television, a notebook, a monitor, an advertising board, an Internet of Things (IoT) device, a mobile phone, a smart phone, a tablet personal computer (PC), an electronic watch, a smart watch, a watch phone, a head mounted display, a mobile communication terminal, an electronic organizer, an electronic book reader, a portable multimedia player (PMP), a navigation device, a game machine, a digital camera, a camcorder, and the like, which provide display screens.

The display device 10 includes a display panel that provides a display screen. Examples of the display panel may include a light-emitting diode (LED) display panel, an organic light-emitting display panel, a quantum dot light-emitting display panel, a plasma display panel, a field emission display panel, and the like. Hereinafter, although an example in which the LED display panel as an example of the display panel is applied is described, the present disclosure is not limited thereto, and when the same technical spirit is applicable, it may be applied to other display panels.

A shape of the display device 10 may be variously modified. For example, the display device 10 may have shapes such as a rectangular shape of which lateral sides are long, a rectangular shape of which longitudinal sides are long, a square shape, a quadrangular shape of which corner portions (vertexes) are round, other polygonal shapes, a circular shape, and the like. A shape of a display area DPA of the display device 10 may also be similar to the overall shape of the display device 10. In FIG. 1, the display device 10 and the display area DPA, which have a rectangular shape of which lateral sides are long, are illustrated.

The display device 10 may include the display area DPA, and a non-display area NDA around the edge or periphery of the display area DPA. The display area DPA is an area in which an image may be displayed, and the non-display area NDA is an area in which no image is displayed. The display area DPA may refer to an active area and the non-display area NDA may refer to an inactive area. The display area DPA may generally occupy a center of the display device 10.

The display area DPA may include a plurality of pixels PX. The plurality of pixels PX may be located in a matrix shape. For example, the plurality of pixels may be arranged along the rows and columns of a matrix. A shape of each of the pixels PX may be a rectangular shape or a square shape in a plan view, but the present disclosure is not limited thereto, and the shape may be a rhombus shape of which each side is inclined with respect to one direction. The pixels PX may be alternately located in a stripe or a PENTILE® arrangement structure, but the present disclosure is not limited thereto. This PENTILE® arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea. In addition, each of the pixels PX may include one or more light-emitting elements 300 that emit light in a corresponding wavelength range, thereby displaying a corresponding color.

The non-display area NDA may be located around the display area DPA. The non-display area NDA may completely or partially surround the display area DPA. The display area DPA has a rectangular shape, and the non-display area NDA may be located adjacent to four sides of the display area DPA. The non-display area NDA may form a bezel of the display device 10.

Figure 2:
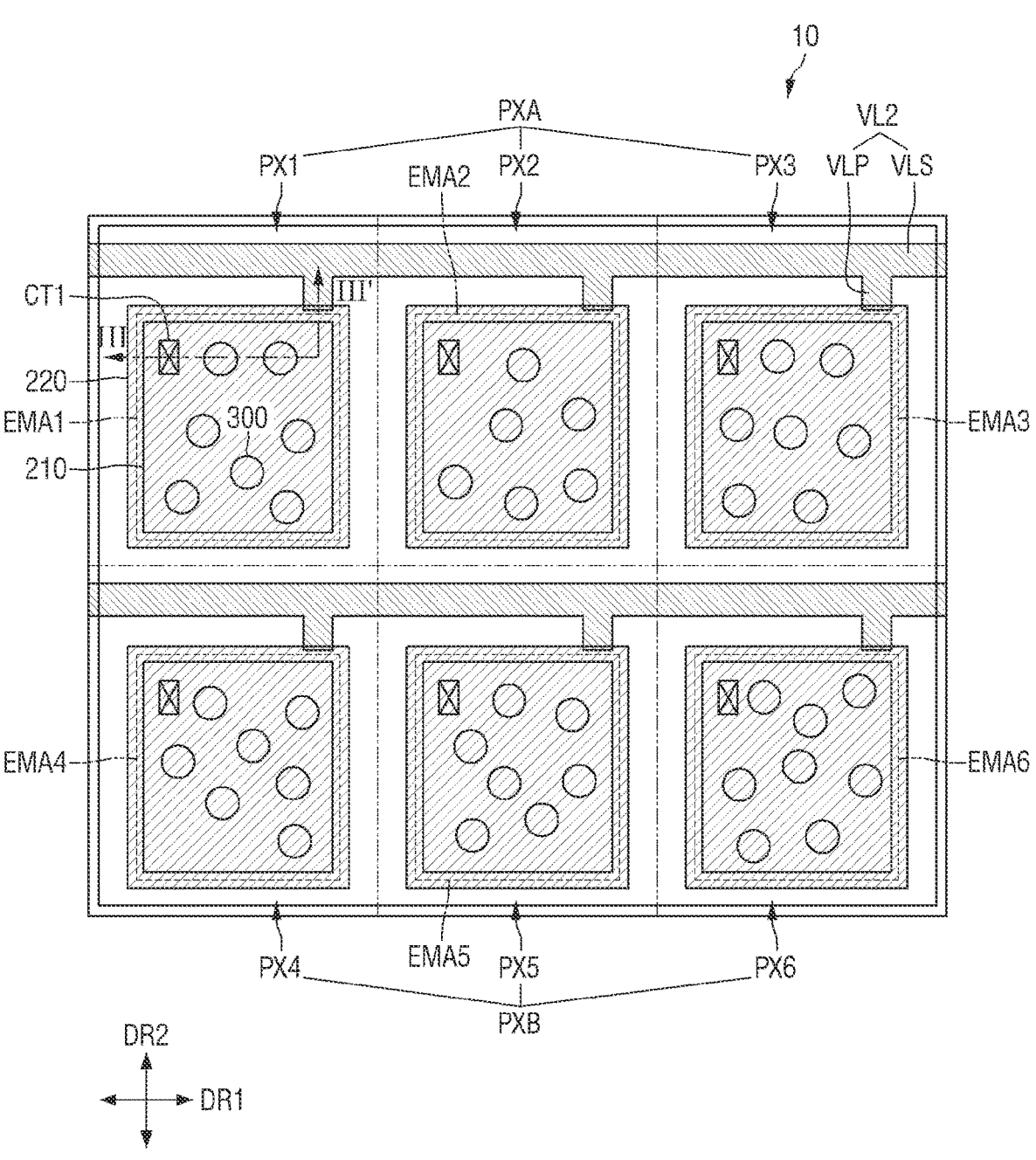
FIG. 2 is a plan view illustrating a first pixel and a second pixel of the display device according to one or more embodiments.
Figure 3:
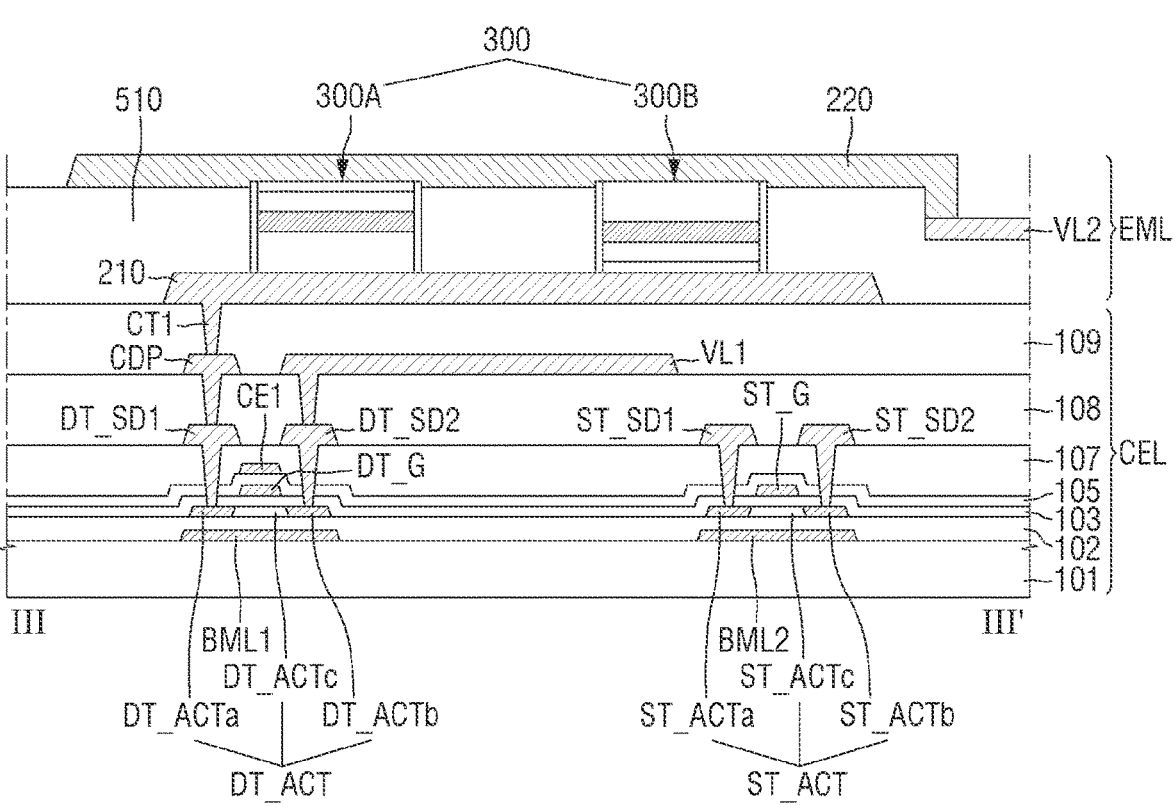
FIG. 3 is a cross-sectional view taken along the line III-III' of FIG. 2.

FIG. 2 is a plan view illustrating a first pixel and a second pixel of the display device according to one or more embodiments. FIG. 3 is a cross-sectional view taken along the line III-III' of FIG. 2.

Referring to FIG. 2, the display device 10 includes a plurality of pixels PXA and PXB, and each of the plurality of pixels PXA and PXB may include a plurality of sub-pixels PXn. For example, a first pixel PXA may include a first sub-pixel PX1, a second sub-pixel PX2, and a third sub-pixel PX3, and the second pixel PXB may include a fourth sub-pixel PX4, a fifth sub-pixel PX5, and a sixth sub-pixel PX6. As an example, the first sub-pixel PX1 and the fourth sub-pixel PX4 may emit light of a first color, the second sub-pixel PX2 and the fifth sub-pixel PX5 may emit light of a second color, and the third sub-pixel PX3 and the sixth sub-pixel PX6 may emit light of a third color. The first color may be blue, the second color may be green, and the third color may be red. However, the present disclosure is not limited thereto, and the sub-pixels PXn may emit light having the same color. In addition, in FIG. 2, although each of the pixels PXA and PXB is illustrated as including three sub-pixels, the present disclosure is not limited thereto, and each of the pixels PXA and PXB may include a larger number of sub-pixels PXn.

Each of the sub-pixels PXn of the display device 10 may include an area defined as a light-emitting area EMA. The first sub-pixel PX1 may include a first light-emitting area EMA1, the second sub-pixel PX2 may include a second light-emitting area EMA2, and the third sub-pixel PX3 may include a third light-emitting area EMA3. In addition, the fourth sub-pixel PX4 may include a fourth light-emitting area EMA4, the fifth sub-pixel PX5 may include a fifth light-emitting area EMA5, and the sixth sub-pixel PX6 may include a sixth light-emitting area EMA6. The light-emitting area EMA may be defined as an area in which the light-emitting element 300 included in the display device 10 is located to emit light in a corresponding wavelength range. The light-emitting element 300 includes an active layer 360 (see FIG. 4), and the active layer 360 may emit light in a corresponding wavelength range without directivity. The light emitted from the active layer 360 of the light-emitting element 300 may also be emitted in directions toward side surfaces of the light-emitting element 300 including both ends thereof. The light-emitting area EMA may include an area in which the light-emitting element 300 is located, and may include an area which is adjacent to the light-emitting element 300 and through which the light emitted from the light-emitting element 300 is emitted.

However, the present disclosure is not limited thereto, and the light-emitting area EMA may also include an area in which light emitted from the light-emitting element 300 is reflected or refracted due to another member to be emitted. A plurality of light-emitting elements 300 may be located in each sub-pixel PXn, and the area in which the light-emitting elements 300 are located and an area adjacent to the area form the light-emitting area EMA.

In one or more embodiments, each of the sub-pixels PXn of the display device 10 may include a non-light-emitting area which is defined as an area except for the light-emitting area EMA. The non-light-emitting area may be an area in which the light-emitting elements 300 are not located and in which light emitted from the light-emitting elements 300 does not reach so that light is not emitted.

The display device 10 according to one or more embodiments may include a circuit element layer CEL and a display element layer EML, and the display element layer EML may include a first electrode 210, a second electrode 220, and the light-emitting element 300, which are located in each sub-pixel PXn. Both ends of the light-emitting element 300 may be electrically connected to the first electrode 210 and the second electrode 220, and may receive an electrical signal from the first electrode 210 and the second electrode 220 to emit light of a corresponding wavelength range.

Referring to FIGS. 2 and 3, the display device 10 may include a first substrate 101 and the circuit element layer CEL and the display element layer EML located on the first substrate 101. A semiconductor layer, a plurality of conductive layers, and a plurality of insulating layers may be located on the first substrate 101, each of which may constitute the circuit element layer CEL and the display element layer EML. The plurality of conductive layers may include a first gate conductive layer, a second gate conductive layer, a first data conductive layer, a second data conductive layer located below a first planarization layer 109 to form the circuit element layer CEL, and electrodes 210 and 220 located on the first planarization layer 109 to form the display element layer EML. The plurality of insulating layers may include a buffer layer 102, a first gate insulating layer 103, a first protective layer 105, a first interlayer insulating layer 107, a second interlayer insulating layer 108, the first planarization layer 109, and a first insulating layer 510 and the like.

In addition, the circuit element layer CEL may include circuit elements and a plurality of lines for driving the light-emitting element 300, such as, a driving transistor DT, a switching transistor ST, a first conductive pattern CDP, and a plurality of voltage lines VL1 and VL2, the semiconductor layer, the plurality of conductive layers, and the plurality of insulating layers, and the display element layer EML may include a plurality of electrodes 210 and 220 and the plurality of light-emitting elements 300.

For example, the first substrate 101 may be an insulating substrate. The first substrate 101 may be made of an insulating material such as glass, quartz, a polymer resin, or the like. In addition, the first substrate 101 may be a rigid substrate but may also be a flexible substrate that is bendable, foldable, rollable, or the like.

Lower metal layers BML1 and BML2 may be located on the first substrate 101. The lower metal layers BML1 and BML2 may include a first lower metal layer BML1 and a second lower metal layer BML2. The first lower metal layer BML1 and the second lower metal layer BML2 are located to at least respectively overlap a first active material layer DT_ACT of the driving transistor DT and a second active material layer ST_ACT of the switching transistor ST in a thickness direction of the first substrate 101. The lower metal layers BML1 and BML2 may include light-blocking materials to reduce or prevent light being incident on the first and second active material layers DT_ACT and ST_ACT. As an example, the first and second lower metal layers BML1 and BML2 may be formed of an opaque metal material. However, the present disclosure is not limited thereto, and in some cases, the lower metal layers BML1 and BML2 may be omitted. In one or more embodiments, the first lower metal layer BML1 may be electrically connected to a first source/drain electrode DT_SD1 of the driving transistor DT, which will be described below, and the second lower metal layer BML2 may be electrically connected to a first source/drain electrode ST_SD1 of the switching transistor ST.

The buffer layer 102 may be entirely located on the lower metal layers BML1 and BML2 and the first substrate 101. The buffer layer 102 may be formed on the first substrate 101 to protect the transistors DT and ST of the pixel PX from moisture permeating through the first substrate 101 that is vulnerable to moisture permeation, and may perform a surface planarization function. The buffer layer 102 may be formed as a plurality of alternately stacked inorganic layers, or a single layer. For example, the buffer layer 102 may include a multi-layer formed by alternately stacking inorganic layers that include at least one of silicon oxide ($SiO_x$), silicon nitride ($SiN_x$), and silicon oxynitride ($SiO_xN_y$), or a single layer formed as one inorganic layer.

The semiconductor layer is located on the buffer layer 102. The semiconductor layer may include the first active material layer DT_ACT of the driving transistor DT and the second active material layer ST_ACT of the switching transistor ST. The first active material layer DT_ACT and the second active material layer ST_ACT may be located to partially overlap gate electrodes DT_G and ST_G or the like of the first gate conductive layer to be described below in the thickness direction of the first substrate 101.

In one or more embodiments, the semiconductor layer may include polycrystalline silicon, single-crystalline silicon, an oxide semiconductor, and the like. The polycrystalline silicon may be formed by crystallizing amorphous silicon. Examples of the crystallization method may include a rapid thermal annealing (RTA) method, a solid phase crystallization (SPC) method, an excimer laser annealing (ELA) method, a metal induced lateral crystallization (MILC) method, and a sequential lateral solidification (SLS) method, and the like, but the present disclosure is not limited thereto. When the semiconductor layer includes polycrystalline silicon, the first active material layer DT_ACT may include a first doped area DT_ACTa, a second doped area DT_ACTb, and a first channel area DT_ACTc. The first channel area DT_ACTc may be located between the first doped area DT_ACTa and the second doped area DT_ACTb. The second active material layer ST_ACT may include a third doped area ST_ACTa, a fourth doped area ST_ACTb, and a second channel area ST_ACTc. The second channel area ST_ACTc may be located between the third doped area ST_ACTa and the fourth doped area ST_ACTb. The first doped area DT_ACTa, the second doped area DT_ACTb, the third doped area ST_ACTa, and the fourth doped area ST_ACTb may be areas in which a partial area of each of the first active material layer DT_ACT and the second active material layer ST_ACT is doped with impurities, and may be source/drain areas of the first active material layer DT_ACT and the second active material layer ST_ACT.

In one or more embodiments, the first active material layer DT_ACT and the second active material layer ST_ACT may include an oxide semiconductor. In this case, the doped area of each of the first active material layer DT_ACT and the second active material layer ST_ACT may be an area that has become conductive. The oxide semiconductor may be an oxide semiconductor including indium (In). In one or more embodiments, the oxide semiconductor may be indium-tin oxide (ITO), indium-zinc oxide (IZO), indium-gallium oxide (IGO), indium-zinc-tin oxide (IZTO), indium-gallium-zinc oxide (IGZO), indium-gallium-tin oxide (IGTO), indium-gallium-zinc-tin oxide (IGZTO), or the like. However, the present disclosure is not limited thereto.

The first gate insulating layer 103 is located on the semiconductor layer and the buffer layer 102. The first gate insulating layer 103 may serve as gate insulating films of the driving transistor DT and the switching transistor ST. The first gate insulating layer 103 may be formed as an inorganic layer including an inorganic material such as silicon oxide ($SiO_x$), silicon nitride ($SiN_x$), and silicon oxynitride ($SiO_xN_y$), or may be formed in a structure in which the inorganic layers are alternately stacked or are stacked in multiple layers.

The first gate conductive layer is located on the first gate insulating layer 103. The first gate conductive layer may include a first gate electrode DT_G of the driving transistor DT and a second gate electrode ST_G of the switching transistor ST. The first gate electrode DT_G is located to overlap at least a partial area of the first active material layer DT_ACT, and the second gate electrode ST_G is located to overlap at least a partial area of the second active material layer ST_ACT, in the thickness direction of the first substrate 101. For example, the first gate electrode DT_G may be located to overlap the first channel area DT_ACTc of the first active material layer DT_ACT in a thickness direction, and the second gate electrode ST_G may be located to overlap the second channel area ST_ACTc of the second active material layer ST_ACT in the thickness direction.

The first gate conductive layer may be formed as a single layer or a multi-layer that is made of one of molybdenum (Mo), aluminum (Al), chromium (Cr), gold (Au), titanium (Ti), nickel (Ni), neodymium (Nd), and copper (Cu) or an alloy thereof. However, the present disclosure is not limited thereto.

The first protective layer 105 is located on the first gate conductive layer and the first gate insulating layer 103. The first protective layer 105 may be located to cover the first gate conductive layer to perform a function of protecting the first gate conductive layer. The first protective layer 105 may be formed as an inorganic layer including an inorganic material such as silicon oxide ($SiO_x$), silicon nitride ($SiN_x$), and silicon oxynitride ($SiO_xN_y$), or may be formed in a structure in which the inorganic layers are alternately stacked or are stacked in multiple layers.

The second gate conductive layer is located on the first protective layer 105. The second gate conductive layer may include a first capacitor electrode CE1 of a storage capacitor located so that at least a partial area thereof overlaps the first gate electrode DT_G in the thickness direction. The first capacitor electrode CE1 and the first gate electrode DT_G may overlap each other in the thickness direction with the first protective layer 105 interposed therebetween, and the storage capacitor may be formed therebetween. The second gate conductive layer may be formed as a single layer or a multi-layer that is made of one of molybdenum (Mo), aluminum (Al), chromium (Cr), gold (Au), titanium (Ti), nickel (Ni), neodymium (Nd), and copper (Cu) or an alloy thereof. However, the present disclosure is not limited thereto.

The first interlayer insulating layer 107 is located on the second gate conductive layer and the first protective layer 105. The first interlayer insulating layer 107 may serve as an insulating film between the second gate conductive layer and other layers located thereon. The first interlayer insulating layer 107 may be formed as an inorganic layer including an inorganic material such as silicon oxide ($SiO_x$), silicon nitride ($SiN_x$), and silicon oxynitride ($SiO_xN_y$), or may be formed in a structure in which the inorganic layers are alternately stacked or are stacked in multiple layers.

The first data conductive layer is located on the first interlayer insulating layer 107. The first gate conductive layer may include the first source/drain electrode DT_SD1 and a second source/drain electrode DT_SD2 of the driving transistor DT, and the first source/drain electrode ST_SD1 and a second source/drain electrode ST_SD2 of the switching transistor ST.

The first source/drain electrode DT_SD1 and the second source/drain electrode DT_SD2 of the driving transistor DT may be respectively in contact with the first doped area DT_ACTa and the second doped area DT_ACTb of the first active material layer DT_ACT through contact holes passing through the first interlayer insulating layer 107, the first protective layer 105, and the first gate insulating layer 103. The first source/drain electrode ST_SD1 and the second source/drain electrode ST_SD2 of the switching transistor ST may be respectively in contact with the third doped area ST_ACTa and the fourth doped area ST_ACTb of the second active material layer ST_ACT through contact holes passing through the first interlayer insulating layer 107, the first protective layer 105, and the first gate insulating layer 103. In addition, the first source/drain electrode DT_SD1 of the driving transistor DT and the first source/drain electrode ST_SD1 of the switching transistor ST may be electrically connected to the first lower metal layer BML1 and the second lower metal layer BML2, respectively, through other contact holes passing through the first interlayer insulating layer 107, the first protective layer 105, the first gate insulating layer 103, and the buffer layer 102. In one or more embodiments, in the first source/drain electrodes DT_SD1 and ST_SD1 and the second source/drain electrodes DT_SD2 and ST_SD2 of the driving transistor DT and the switching transistor ST, when one electrode is a source electrode, the other electrode may be a drain electrode. However, the present disclosure is not limited thereto, and in the first source/drain electrodes DT_SD1 and ST_SD1 and the second source/drain electrodes DT_SD2 and ST_SD2, when one electrode is a drain electrode, the other electrode may be a source electrode.

The first data conductive layer may be formed as a single layer or a multi-layer that is made of one of molybdenum (Mo), aluminum (Al), chromium (Cr), gold (Au), titanium (Ti), nickel (Ni), neodymium (Nd), and copper (Cu) or an alloy thereof. However, the present disclosure is not limited thereto.

The second interlayer insulating layer 108 may be located on the first data conductive layer and the first interlayer insulating layer 107. The second interlayer insulating layer 108 may be entirely located on (e.g., above) the first interlayer insulating layer 107 while covering the first data conductive layer and may sever to protect the first data conductive layer. The second interlayer insulating layer 108 may be formed as an inorganic layer including an inorganic material such as silicon oxide ($SiO_x$), silicon nitride ($SiN_x$), and silicon oxynitride ($SiO_xN_y$), or may be formed in a structure in which the inorganic layers are alternately stacked or are stacked in multiple layers.

The second data conductive layer is located on the second interlayer insulating layer 108. The second data conductive layer may include a first voltage line VL1 and the first conductive pattern CDP. A high potential voltage (a first power voltage VDD) supplied to the driving transistor DT may be applied to the first voltage line VL1.

The first conductive pattern CDP may be electrically connected to the first source/drain electrode DT_SD1 of the driving transistor DT through a contact hole formed in the second interlayer insulating layer 108. The first conductive pattern CDP may also be in contact with the first electrode 210, which will be described below, and the driving transistor DT may transmit the first power voltage VDD applied from the first voltage line VL1 to the first electrode 210 through the first conductive pattern CDP. In the drawing, the second data conductive layer is illustrated as including one first voltage line VL1 and the first conductive pattern CDP, but the present disclosure is not limited thereto. The second data conductive layer may include a larger number of first voltage lines VL1, the first conductive pattern CDP, and/or a larger number of second voltage lines VL2.

In FIG. 3, the second voltage line VL2 is illustrated as being located on the first insulating layer 510 located on the display element layer EML to be described below. However, the present disclosure is not limited thereto, and the second voltage line VL2 may be included in the second data conductive layer and may be located on the second interlayer insulating layer 108.

The second data conductive layer may be formed as a single layer or a multi-layer that is made of one of molybdenum (Mo), aluminum (Al), chromium (Cr), gold (Au), titanium (Ti), nickel (Ni), neodymium (Nd), and copper (Cu) or an alloy thereof. However, the present disclosure is not limited thereto.

The first planarization layer 109 is located on the second data conductive layer. The first planarization layer 109 may include an organic insulating material, for example, an organic material such as polyimide (PI), and may perform a surface planarization function.

On the first planarization layer 109, as the display element layer EML, the first electrode 210, the light-emitting element 300, the first insulating layer 510, the second voltage line VL2, and the second electrode 220 are located. However, the present disclosure is not limited thereto, and the display element layer EML may further include other members, and thus other members may be further located on the first planarization layer 109.

The first electrode 210 may be located to correspond to the sub-pixels PXn of each of the pixels PXA and PXB. For example, each first electrode 210 may be located in each sub-pixel PXn, and thus one first electrode 210 may be located to be spaced from the first electrode 210 located in another sub-pixel PXn without being connected thereto. Accordingly, the first electrode 210 may be located in an island pattern on the entire surface of the display device 10.

As shown in FIG. 2, the first electrode 210 may have an angular shape, of which one side extends in one direction and the other side extends in the other direction, in a plan view. However, the present disclosure is not limited thereto, and the first electrode 210 may have a shape inclined in one direction or a circular shape with a curved outer surface. In addition, the size of the first electrode 210 is not particularly limited, but may vary depending on the area of each sub-pixel PXn of the display device 10. As shown in the drawing, the first electrode 210 may be formed to be smaller than each sub-pixel PXn, and may be located in a state of being spaced from a boundary with another adjacent sub-pixel PXn.

The first electrode 210 may be located on the first planarization layer 109. For example, the first electrode 210 may be located directly on the first planarization layer 109. The light-emitting elements 300 may be located on the first electrode 210, and the first electrode 210 may be electrically connected to at least one end of the light-emitting element 300. In addition, the first electrode 210 may be electrically connected to the driving transistor DT of the circuit element layer CEL. For example, the first electrode 210 may be in contact with the first conductive pattern CDP through the first contact hole CT1 exposing a portion of an upper surface of the first conductive pattern CDP through the first planarization layer 109. The first electrode 210 may be electrically connected to the first source/drain electrode DT_SD1 of the driving transistor DT through the first conductive pattern CDP, and may receive the first power voltage VDD applied through the first voltage line VL1. The first electrode 210 may be electrically connected to different driving transistors DT located at the sub-pixels PXn, and may receive the first power voltage VDD independently from each of the driving transistors DT.

The second electrode 220 is located on the first electrode 210. In one or more embodiments, the second electrode 220 may be located such that at least a partial area thereof overlaps the first electrode 210 in the thickness direction, and the light-emitting element 300 and the first insulating layer 510 may be located therebetween. As shown in FIG. 2, the second electrode 220 may also be located to correspond to the sub-pixels PXn of each of the pixels PXA and PXB. For example, one second electrode 220 may be located to be spaced from the second electrode 220 located in another sub-pixel PXn without being connected thereto. Accordingly, the second electrode 220 may be located in an island pattern on the entire surface of the display device 10. However, the present disclosure is not limited thereto. In one or more embodiments, one second electrode 220 is located in two or more sub-pixels PXn, and the light-emitting elements 300 located in the plurality of sub-pixels PXn may be electrically connected to the same second electrode 220.

The second electrode 220 may have an angular shape, of which one side extends in one direction and the other side extends in the other direction, in a plan view. However, the present disclosure is not limited thereto, and the second electrode 220 may have a shape inclined in one direction or a circular shape with a curved outer surface.

In one or more embodiments, the second electrode 220 and the first electrode 210 may have different widths or areas. For example, the second electrode 220 may be formed to have a larger area than the first electrode 210. That is, the width of the second electrode 220 measured in one direction, for example, a first direction DR1 or a second direction DR2, may be greater than the width of the first electrode 210 measured in the first direction DR1 or the second direction DR2. As will be described below, the plurality of light-emitting elements 300 may be located in a random arrangement on the first electrode 210. The second electrode 220 may be formed to have a greater width or area than each of the first electrode 210 and the light-emitting elements 300 to cover all of the light-emitting elements 300 located on the first electrode 210 regardless of locations the light-emitting elements 300. However, the present disclosure is not limited thereto, and in one or more embodiments, when the light-emitting elements 300 are located with a constant arrangement, the second electrode 220 may have a smaller width than the first electrode 210 and may have a shape extending in one direction. This will be described in detail below with reference to other embodiments.

The second electrode 220 may be located to be spaced from the first electrode 210 in a direction perpendicular to an upper surface of the first substrate 101. For example, the second electrode 220 may be located to be spaced from the first electrode 210 in the thickness direction, and may be located directly on the first insulating layer 510 located therebetween. The plurality of light-emitting elements 300 may be located between the first electrode 210 and the second electrode 220, and a space in which the first electrode 210 and the second electrode 220 are spaced from each other may be filled with the first insulating layer 510. The second electrode 220 may be electrically connected to at least one end of the light-emitting element 300. As an example, the second electrode 220 may be located to surround one end of the light-emitting element 300 protruding from an upper surface of the first insulating layer 510. However, the present disclosure is not limited thereto.

Further, the second electrode 220 may be electrically connected to the second voltage line VL2. For example, the second electrode 220 may be directly in contact with the second voltage line VL2 located on the first insulating layer 510 to be connected thereto. The second electrode 220 may receive the second power voltage VSS applied through the second voltage line VL2. The second electrode 220 may be electrically connected to the same second voltage line VL2 located in the plurality of sub-pixels PXn, and may receive the same second power voltage VSS from the second voltage line VL2. In addition, in one or more embodiments, when one second electrode 220 is located over the plurality of sub-pixels PXn, the plurality of sub-pixels PXn may receive the same electrical signal, which is applied to the second voltage line VL2, through one integrated second electrode 220.

In one or more embodiments, the first electrode 210 may be a pixel electrode separated for each sub-pixel PXn, and the second electrode 220 may be a common electrode connected in common along each sub-pixel PXn. One of the first electrode 210 and the second electrode 220 may be (e.g., may be connected to) an anode of the light-emitting element 300, and the other one thereof may be (e.g., may be connected to) a cathode of the light-emitting element 300. However, the present disclosure is not limited thereto, and the reverse of the above description may be possible.

Each of the electrodes 210 and 220 may include a transparent conductive material. As an example, each of the electrodes 210 and 220 may include materials such as indium tin oxide (ITO), indium zinc oxide (IZO), indium tin-zinc oxide (ITZO), and the like, but the present disclosure is not limited thereto. The light-emitting element 300 may emit light in directions toward both ends thereof, and may emit light in a third direction DR3 (e.g., the thickness direction) directed to an upper surface of the first electrode 210. In one or more embodiments, the first electrode 210 may include a conductive material having a high reflectance, and thus may reflect light emitted from the light-emitting element 300 and traveling toward the upper surface of the first electrode 210. A portion of the light emitted from the light-emitting element 300 is transmitted through the second electrode 220 including a transparent material to be emitted from each of the sub-pixels PXn, and another portion of the light emitted from the light-emitting element 300 may be reflected by the first electrode 210 including a material having a high reflectance to be emitted from each of the sub-pixels PXn. In one or more embodiments, the first electrode 210 may include a metal such as silver (Ag), copper (Cu), aluminum (Al), or the like as the material having a high reflectance.

However, the present disclosure is not limited thereto, and the first electrode 210 may be formed in a structure, in which one or more layers of each of a transparent conductive material and a metal layer having a high reflectance are stacked, or formed as a single layer including the transparent conductive material and the metal layer. In one or more embodiments, the first electrode 210 may have a stacked structure of ITO/Ag/ITO/IZO or may be an alloy including Al, Ni, lanthanum (La), and the like.

The plurality of light-emitting elements 300 may be located in each sub-pixel PXn, and may be located between the first electrode 210 and the second electrode 220. One end of the light-emitting element 300 may be electrically connected to the first electrode 210, and the other end thereof may be electrically connected to the second electrode 220. In one or more embodiments, one end of the light-emitting element 300 may be in direct contact with the first electrode 210, and the other end thereof may be in direct contact with the second electrode 220.

The light-emitting elements 300 according to one or more embodiments may include active layers 360 having different materials to emit light in different wavelength ranges to the outside. The display device 10 may include light-emitting elements 300 emitting light in different respective wavelength ranges. The light-emitting elements 300 of the first sub-pixel PX1 and the fourth sub-pixel PX4 may include an active layer 360 that emits light of a first color having a first wavelength at a central wavelength range, and the light-emitting elements 300 of the second sub-pixel PX2 and the fifth sub-pixel PX5 may include an active layer 360 that emits light of a second color having a second wavelength at a central wavelength range, and the light-emitting elements 300 of the third sub-pixel PX3 and the sixth sub-pixel PX6 may include an active layer 360 that emits light of a third color having a third wavelength at a central wavelength range.

Accordingly, the light of the first color may be emitted from the first sub-pixel PX1 and the fourth sub-pixel PX4, the light of the second color may be emitted from the second sub-pixel PX2 and the fifth sub-pixel PX5, and the light of the third color may be emitted from the third sub-pixel PX3 and the sixth sub-pixel PX6. In one or more embodiments, the light of the first color may be blue light having a central wavelength range ranging from about 450 nm to about 495 nm, the light of the second color may be green light having a central wavelength range ranging from about 495 nm to about 570 nm, and the light of the third color may be red light having a central wavelength range ranging from about 620 nm to about 752 nm. However, the present disclosure is not limited thereto. In some cases, each of the first to sixth sub-pixels PX1 to PX6 may include the same type of light-emitting elements 300 to emit substantially the same color light.

The plurality of light-emitting elements 300 may be located to be spaced from each other on the first electrode 210. A separation distance between the light-emitting elements 300 is not particularly limited. In some cases, the plurality of light-emitting elements 300 may be located adjacent to each other to form a group, and a plurality of other light-emitting elements 300 may be grouped in a state of being spaced at a suitable interval (e.g., a set or predetermined interval) and may be randomly arranged with a non-uniform density, as shown in FIG. 2. In addition, in one or more embodiments, at least some of the plurality of light-emitting elements 300 located in one sub-pixel PXn may be arranged in one direction.

In one or more embodiments, the light-emitting element 300 may be located directly on the first electrode 210 and may be in direct contact with the second electrode 220 located above the first electrode 210. As described above, because both ends of the light-emitting element 300 are in direct contact with the first electrode 210 and the second electrode 220, the light-emitting element 300 may be electrically connected to the first electrode 210 and the second electrode 220. However, the present disclosure is not limited thereto, and in some cases, other layers may be further located between the light-emitting element 300 and the first electrode 210 or the second electrode 220.

In one or more embodiments, as will be described below, the light-emitting element 300 may include a plurality of semiconductor layers and the active layer 360 (see FIG. 4) and may have a structure in which the plurality of semiconductor layers and the active layer 360 are sequentially stacked. According to one or more embodiments, the light-emitting element 300 of the display device 10 may be located such that a direction in which the plurality of semiconductor layers are stacked is directed in a direction perpendicular to the upper surface of the first substrate 101. That is, the light-emitting element 300 may be parallel to the direction in which the semiconductor layers are stacked and a direction in which the first electrode 210 and the second electrode 220 are spaced from each other. Light generated by the active layer 360 of the light-emitting element 300 may be emitted from both ends of the light-emitting element 300 facing one direction in which the semiconductor layers of the light-emitting element 300 are stacked. The light-emitting element 300 of the display device 10 may be located such that the upper surface of the first substrate 101 is perpendicular to the direction in which the semiconductor layers are stacked and at least one end thereof faces an upward direction with respect to the first substrate 101. Accordingly, the light emitted from the active layer 360 of the light-emitting element 300 may be emitted from both ends to travel toward the upward direction with respect to the first substrate 101.

Here, the second electrode 220 may be located on one end of the light-emitting element 300. As described above, the second electrode 220 may be made of a transparent material, and light emitted from the light-emitting element 300 to the second electrode 220 may pass through the second electrode 220 to travel in the upward direction with respect to the first substrate 101. In addition, the other end of the light-emitting element 300 may face or may be in direct contact with the first electrode 210, and as described above, the first electrode 210 may include a material having a high reflectance. Accordingly, the light emitted from the light-emitting element 300 to the first electrode 210 may be reflected by the first electrode 210 and travel toward the second electrode 220. However, the present disclosure is not limited thereto.

In one or more embodiments, the light-emitting element 300 may include other types of light-emitting elements 300A and 300B of which one ends face different directions. For example, when one end of the light-emitting element 300 in which a corresponding semiconductor layer is located is defined, the display device 10 may include a first type light-emitting element 300A located such that one end thereof faces the first electrode 210, and a second type light-emitting element 300B located such that one end thereof (e.g., one end that is similar to the one end of the first type light-emitting element 300A) faces the second electrode 220. Both ends of each of the first type light-emitting element 300A and the second type light-emitting element 300B may be electrically connected to the first electrode 210 and the second electrode 220, respectively, and one ends thereof, on which the corresponding semiconductor layer is located, may be connected to the first electrode 210 and the second electrode 220, respectively. Accordingly, in at least some of the light-emitting elements 300 located in each sub-pixel PXn, different semiconductor layers may be located to face the first electrode 210. The first type light-emitting element 300A and the second type light-emitting element 300B may have different semiconductor layers electrically connected to the first electrode 210. This will be described in more detail below together with a description of a structure of the light-emitting element 300.

The first insulating layer 510 may be located between the first electrode 210 and the second electrode 220 to be around (e.g., to surround, such as in a plan view) an outer surface (e.g., an outer peripheral or circumferential surface) of each of the light-emitting elements 300. For example, the first insulating layer 510 may be located to cover the first electrode 210 on the first planarization layer 109, and may be located to be in direct contact with the first planarization layer 109 and the first electrode 210. The first insulating layer 510 may be located to cover at least the first electrode 210 to reduce or prevent the likelihood of the first electrode 210 being in direct contact with the second electrode 220, thereby serving to insulate the first electrode 210 and the second electrode 220 from each other.

In FIGS. 2 and 3, the first insulating layer 510 is illustrated as being entirely located on the first planarization layer 109. That is, the first insulating layer 510 may be located on the first planarization layer 109 as one layer without dividing the sub-pixels PXn. However, the present disclosure is not limited thereto, and in one or more embodiments, the first insulating layer 510 may be located in each sub-pixel PXn or may be patterned to be located over several sub-pixels PXn. For example, the first insulating layer 510 may be located to have an island shape or a linear shape on the entire surface of the display device 10.

The first insulating layer 510 may be located to be around (e.g., to surround) the outer surface (e.g., the outer peripheral or circumferential surface) of the light-emitting element 300 located on the first electrode 210. As an example, the display device 10 may have a structure in which the light-emitting element 300 is located to correspond to a hole formed in the first insulating layer 510. At least a portion of the outer surface (e.g., the outer peripheral or circumferential surface) of the light-emitting element 300 may be in direct contact with the first insulating layer 510, and at least one end of the light-emitting element 300 may protrude from the upper surface of the first insulating layer 510 so that the outer surface thereof may not be in direct contact with the first insulating layer 510. The outer surface of the protruding portion of the light-emitting element 300 may be in contact with the second electrode 220 located on the first insulating layer 510. That is, according to one or more embodiments, a thickness of the first insulating layer 510 may be less than the sum of a thickness of the first electrode 210 and a height of the light-emitting element 300 in the thickness direction. In addition, a separation distance between the first electrode 210 and the second electrode 220 measured in the thickness direction may be substantially the same as the height of the light-emitting element 300, and may be less than a width of the light-emitting element 300. However, the present disclosure is not limited thereto, and the thickness of the first insulating layer 510 may be formed to be greater than the sum of the thickness of the first electrode 210 and the height of the light-emitting element 300 in the thickness direction so that the entire outer surface (e.g., the outer peripheral or circumferential surface) of the light-emitting element 300 may be surrounded by the first insulating layer 510.

The light-emitting element 300 may include the plurality of semiconductor layers and an insulating film 380 (see FIG. 4) surrounding the semiconductor layers. According to one or more embodiments, the first insulating layer 510 may be in direct contact with a portion of the insulating film 380 of the light-emitting element 300. However, the present disclosure is not limited thereto, and in some cases, in the light-emitting element 300, the insulating film 380 may be omitted, and the first insulating layer 510 may be in direct contact with the semiconductor layers of the light-emitting element 300.

The first insulating layer 510 may include an inorganic insulating material or an organic insulating material. In one or more embodiments, the first insulating layer 510 may include an inorganic insulating material such as silicon oxide ($SiO_x$), silicon nitride ($SiN_x$), silicon oxynitride ($SiO_xN_y$), aluminum oxide ($Al_xO_y$), aluminum nitride ($Al_xN_y$), or the like. Alternatively, the first insulating layer 510 may include an organic insulating material such as an acrylic resin, an epoxy resin, a phenol resin, a polyamide resin, a PI resin, an unsaturated polyester resin, a polyphenylene resin, a polyphenylene sulfide resin, benzocyclobutene, a cardo resin, a siloxane resin, a silsesquioxane resin, polymethyl methacrylate, polycarbonate, or a polymethyl methacrylate-polycarbonate synthetic resin. However, the present disclosure is not limited thereto.

Further, at least some of the light emitted from the light-emitting element 300 may be emitted from the side surface of the light-emitting element 300. The first insulating layer 510 may include a transparent insulating material so that light emitted from the light-emitting element 300 may be transmitted therethrough. However, the present disclosure is not limited thereto.

The second voltage line VL2 may be located in the non-light-emitting area of the pixels PXA and PXB or sub-pixels PXn. The second voltage line VL2 may include a line stem portion VLS located in the non-light-emitting area of each of the sub-pixels PXn and extending in the first direction DR1, and line branch portions VLP branched from the line stem portion VLS in the second direction DR2.

The line stem portion VLS of the second voltage line VL2 may extend in the first direction DR1 and may be located over another adjacent sub-pixel PXn. One line stem portion VLS may be located over the plurality of sub-pixels PXn, and may also be located in other pixels and sub-pixels PXn adjacent in the first direction DR1. Another line stem portion VLS may be located in another pixel or sub-pixel PXn adjacent in the second direction DR2 and extend in the first direction DR1.

The line branch portion VLP of the second voltage line VL2 may be branched from the line stem portion VLS in the second direction DR2, and may overlap the second electrode 220 located in each sub-pixel PXn in the thickness direction. The second electrode 220 may be electrically connected to the second voltage line VL2 through the line branch portion VLP of the second voltage line VL2.

The second voltage line VL2 may be located on the first insulating layer 510. As shown in FIG. 3, the second voltage line VL2 may be located on a portion of the first insulating layer 510 located in the non-light-emitting area and having a relatively small thickness. However, the present disclosure is not limited thereto, and the first insulating layer 510 may be formed to have a uniform thickness, and the second electrode 220 and the second voltage line VL2 may be located at substantially the same height.

Further, in one or more embodiments, when one second electrode 220 is located over a larger number of sub-pixels PXn, the second voltage line VL2 may be located only in some pixels PXA and PXB or sub-pixels PXn. A description thereof will be provided below.

The display device 10 according to one or more embodiments may include the first electrode 210, the second electrode 220, and the light-emitting element 300 including the semiconductor layers stacked in one direction and located between the first electrode 210 and the second electrode 220. The first electrode 210 and the second electrode 220 may be spaced from each other in a direction perpendicular to the upper surface of the first substrate 101, and the light-emitting element 300 may be located such that a direction in which the semiconductor layers are stacked is perpendicular to the upper surface of the first substrate 101. That is, the light-emitting element 300 of the display device 10 may be located such that the direction in which the plurality of semiconductor layers are stacked are parallel to the direction in which the first electrode 210 and the second electrode 220 are spaced from each other, and light emitted from the active layer 360 of the light-emitting element 300 may travel toward the upward direction with respect to the first substrate 101.

In one or more embodiments, the light-emitting element 300 may be a light-emitting diode, and in one or more embodiments, may be an inorganic light-emitting diode having a size of a micrometer unit or a nanometer unit and made of an inorganic material. The inorganic light-emitting diode may be electrically connected to two electrodes facing (e.g., opposing) each other and may emit light of a corresponding wavelength range when an electrical signal is applied thereto.

The light-emitting element 300 may include a semiconductor layer doped with an arbitrary conductive-type (for example, p-type or n-type) impurity. The semiconductor layer may receive an electrical signal applied from an external power source and emit light in a corresponding wavelength range.

Figure 4:
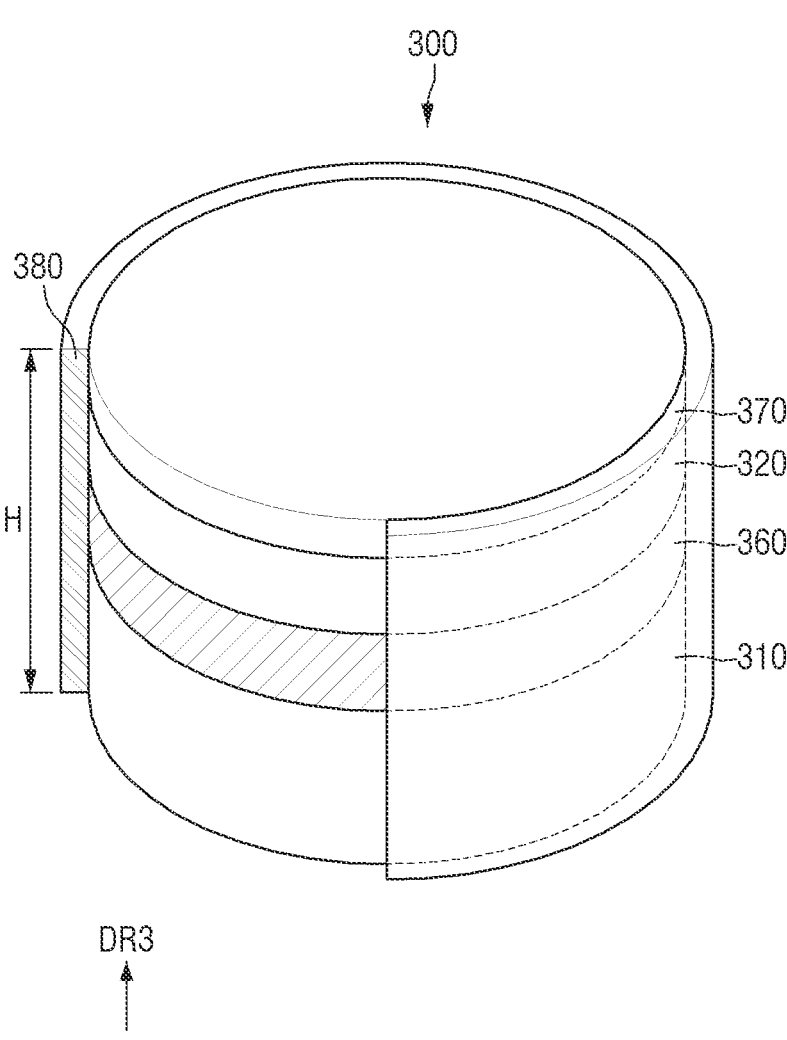
FIG. 4 is a schematic cutaway view illustrating a light-emitting element according to one or more embodiments.
Figure 5:
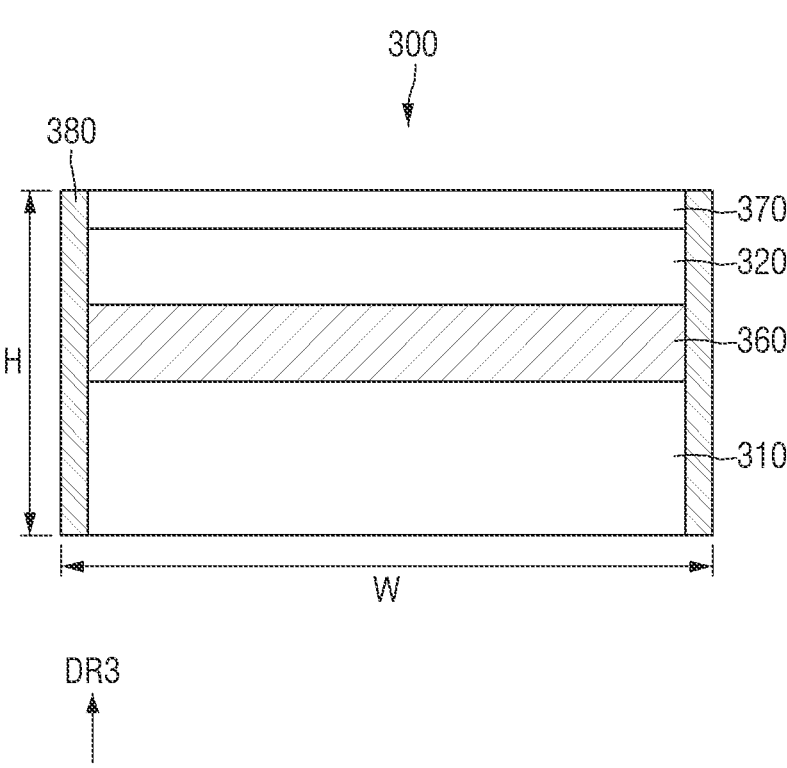
FIG. 5 is a cross-sectional view of the light-emitting element according to one or more embodiments.

FIG. 4 is a schematic view illustrating the light-emitting element according to one or more embodiments. FIG. 5 is a cross-sectional view of the light-emitting element according to one or more embodiments.

Referring to FIGS. 4 and 5, the light-emitting element 300 may include a first semiconductor layer 310, a second semiconductor layer 320, an active layer 360, an electrode layer 370, and an insulating film 380.

The first semiconductor layer 310 may be an n-type semiconductor layer. As an example, when the light-emitting element 300 emits light in a blue wavelength range, the first semiconductor layer 310 may include a semiconductor material having a chemical formula of $AlxGayIn1-x-yN$ ($0<=x<=1$, $0<=y<=1$, and $0<=x+y<=1$). For example, the semiconductor material may be one or more from among AlGaInN, GaN, AlGaN, InGaN, AlN, and InN that are doped with an n-type impurity. The first semiconductor layer 310 may be doped with an n-type dopant. As an example, the n-type dopant may be Si, Ge, Sn, or the like. In one or more embodiments, the first semiconductor layer 310 may be n-GaN doped with n-type Si. A thickness of the first semiconductor layer 310 may range from about 0.1 μm to about 0.5 μm, but the present disclosure is not limited thereto.

The second semiconductor layer 320 may be located on the active layer 360 to be described below. The second semiconductor layer 320 may be a p-type semiconductor. As an example, when the light-emitting element 300 emits light in a blue or green wavelength range, the second semiconductor layer 320 may include a semiconductor material having a chemical formula of $AlxGayIn1-x-yN$ ($0<=x<=1$, $0<=y<=1$, and $0<=x+y<=1$). For example, the semiconductor material may be one or more from among AlGaInN, GaN, AlGaN, InGaN, AlN, and InN that are doped with a p-type impurity. The second semiconductor layer 320 may be doped with a p-type dopant. As an example, the p-type dopant may be Mg, Zn, Ca, Se, Ba, or the like. In one or more embodiments, the second semiconductor layer 320 may be p-GaN doped with p-type Mg. A thickness of the second semiconductor layer 320 may range from about 0.05 μm to about 0.10 μm, but the present disclosure is not limited thereto.

In one or more embodiments, each of the first semiconductor layer 310 and the second semiconductor layer 320 is illustrated in the drawing as being formed as one layer, but the present disclosure is not limited thereto. According to one or more embodiments, each of the first semiconductor layer 310 and the second semiconductor layer 320 may further include a larger number of layers, e.g., a clad layer or a tensile strain barrier reducing (TSBR) layer according to a material of the active layer 360. A description thereof will be provided below with reference to other drawings.

The active layer 360 may be located between the first semiconductor layer 310 and the second semiconductor layer 320. The active layer 360 may include a material having a single or multiple quantum well structure. When the active layer 360 includes a material having a multiple quantum well structure, the active layer 360 may have a structure in which quantum layers and well layers may be alternately stacked. The active layer 360 may emit light due to a combination of electron-hole pairs in response to electrical signals applied through the first semiconductor layer 310 and the second semiconductor layer 320. As an example, when the active layer 360 emits light in a blue wavelength range, the active layer 360 may include a material such as AlGaN, AlGaInN, or the like. For example, when the active layer 360 has a multiple quantum well structure in which quantum layers and well layers may be alternately stacked, the quantum layer may include a material such as AlGaN or AlGaInN, and the well layer may include a material such as GaN or AlInN. In one or more embodiments, the active layer 360 includes AlGaInN as a quantum layer and AlInN as a well layer. As described above, the active layer 360 may emit blue light having a central wavelength range ranging from about 450 nm to about 495 nm.

However, the present disclosure is not limited thereto, and the active layer 360 may have a structure in which a semiconductor material having large bandgap energy and a semiconductor material having small bandgap energy may be alternately stacked or include other Group III to Group V semiconductor materials according to the wavelength range of emitted light. The light emitted by the active layer 360 is not limited to light in a blue wavelength range, and the active layer 360 may also emit light in a red or green wavelength range in some cases. A thickness of the active layer 360 may range from about 0.05 μm to about 0.10 μm, but the present disclosure is not limited thereto.

In one or more embodiments, the light emitted from the active layer 360 may be emitted to not only an outer surface of the light-emitting element 300 in a length direction (e.g., a top surface and/or bottom surface) but also the both side surfaces of the light-emitting element 300 (e.g., an outer peripheral or circumferential surface). Directivity of the light emitted from the active layer 360 is not limited to one direction.

The electrode layer 370 may be an ohmic contact electrode. In one or more embodiments, the electrode layer 370 may be located on the second semiconductor layer 320. However, the present disclosure is not limited thereto, and the electrode layer 370 may also be a Schottky contact electrode. The light-emitting element 300 may include at least one electrode layer 370. Although the light-emitting element 300 is illustrated in FIG. 4 as including a single electrode layer 370, the present disclosure is not limited thereto. In some cases, the light-emitting element 300 may include a larger number of electrode layers 370, or the electrode layer 370 may be omitted. The description of the light-emitting element 300 may be identically applied even when the number of the electrode layers 370 is varied or another structure is further included.

When the light-emitting element 300 is electrically connected to the electrodes 210 and 220, the electrode layer 370 may reduce resistance between the light-emitting element 300 and the electrode or contact electrode. The electrode layer 370 may include a conductive metal. For example, the electrode layer 370 may include at least one from among aluminum (Al), titanium (Ti), indium (In), gold (Au), silver (Ag), indium tin oxide (ITO), indium zinc oxide (IZO), and indium tin-zinc oxide (ITZO). Further, the electrode layer 370 may include a semiconductor material doped with an n-type or p-type impurity. However, the present disclosure is not limited thereto.

The insulating film 380 may be located to be around (e.g., surround) outer surfaces (e.g., outer peripheral or circumferential surfaces) of the plurality of semiconductor layers and the electrode layers described above. In one or more embodiments, the insulating film 380 may be located to be around (e.g., surround) at least an outer surface (e.g., an outer peripheral or circumferential surface) of the active layer 360 and may extend in one direction in which the light-emitting element 300 extends. The insulating film 380 may serve to protect the members. As an example, the insulating film 380 may be formed to be around (e.g., surround) side surface portions of the members and expose both ends of the light-emitting element 300 in the length direction.

In the drawing, the insulating film 380 is illustrated as being formed to extend in the length direction of the light-emitting element 300 to cover from the first semiconductor layer 310 to a side surface of the electrode layer 370, but the present disclosure is not limited thereto. Because the insulating film 380 covers only the outer surfaces (e.g., the outer peripheral or circumferential surfaces) of some semiconductor layers including the active layer 360 or covers only a portion of the outer surface (e.g., the outer peripheral or circumferential surface) of the electrode layer 370, the outer surface of the electrode layer 370 may be partially exposed. In addition, an upper surface of the insulating film 380 may be formed to be rounded in cross section in an area adjacent to at least one end of the light-emitting element 300.

A thickness of the insulating film 380 may range from about 10 nm to about 1.0 μm, but the present disclosure is not limited thereto. In one or more embodiments, the thickness of the insulating film 380 may be about 40 nm.

The insulating film 380 may include materials having insulating properties, for example, silicon oxide (SiO$_x$), silicon nitride (SiN$_x$), silicon oxynitride (SiO$_x$N$_y$), aluminum nitride (Al$_x$N$_y$), aluminum oxide (Al$_x$O$_y$), and the like.

Accordingly, it is possible to reduce or prevent the likelihood of an electrical short circuit that may occur when the active layer 360 is in direct contact with the electrode through which an electrical signal is transmitted to the light-emitting element 300. Further, because the insulating film 380 protects the outer surface (e.g., the outer peripheral or circumferential surface) of the light-emitting element 300, including the active layer 360, it is possible to reduce or prevent degradation in light-emitting efficiency.

Further, in one or more embodiments, an outer surface (e.g., an outer peripheral or circumferential surface) of the insulating film 380 may be surface treated. When the display device 10 is manufactured, the light-emitting element 300 may be aligned by being sprayed on the electrodes in a state of being dispersed in ink (e.g., a predetermined ink). Here, to maintain a state in which the light-emitting element 300 is dispersed in the ink without aggregating with another adjacent light-emitting element 300, the surface of the insulating film 380 may be treated to be hydrophobic or hydrophilic.

The light-emitting element 300 may have a structure in which the first semiconductor layer 310, the active layer 360, and the second semiconductor layer 320 are sequentially stacked in one direction. For example, the light-emitting element 300 may include the first semiconductor layer 310, the active layer 360, and the second semiconductor layer 320 stacked in the third direction DR3, may have a height H measured in the third direction DR3 and a width W measured in a direction perpendicular to the third direction DR3. According to one or more embodiments, in the light-emitting element 300, the height H measured in the third direction DR3 may be less than the width W measured in the direction perpendicular to the third direction DR3.

As shown in FIGS. 4-5, the light-emitting element 300 may have a cylindrical shape, a disk shape, or a rod shape having the width W greater than the height H. However, the present disclosure is not limited thereto and the light-emitting element 300 may have various shapes, such as a shape of a rod, a wire, a tube, or the like, a shape of a cube, a rectangular parallelepiped, a polygonal pillar such as a hexagonal pillar or the like, or a shape that extends in one direction and has a partially inclined outer surface.

The light-emitting element 300 according to one or more embodiments may have a shape in which a width W measured in a direction perpendicular to the third direction DR3 is greater than a height H measured in the third direction DR3 in which the semiconductor layer and the active layer 360 are stacked. That is, an aspect ratio of the light-emitting element 300 may range from 0.1 to 1.0. The light-emitting element 300 may have a height H ranging from about 0.2 μm to about 5 μm or from about 0.5 μm to about 4 μm, and in one or more embodiments, may have a length of about 1 μm to about 3 μm. In addition, the light-emitting element 300 may have a width W ranging from about 1 μm to about 10 μm or from about 2 μm to about 6 μm, and in one or more embodiments, may have a length of about 3 μm to about 5 μm. However, the present disclosure is not limited thereto, and the plurality of light-emitting elements 300 included in the display device 10 may have different diameters according to a composition difference of the active layer 360. Because the light-emitting element 300 has a structure in which a cross-sectional area is large, the area of the active layer 360 generating light may be relatively increased, and thus light-emitting efficiency may be further improved than a light-emitting element 300 having a different structure.

Further, as described above, the first electrode 210 and the second electrode 220 of the display device 10 may be located to be spaced from each other in the direction perpendicular to the upper surface of the first substrate 101, and the light-emitting element 300 may be located therebetween. As an example, the third direction DR3 in which the semiconductor layers of the light-emitting element 300 are stacked may be parallel to the direction in which the first electrode 210 and the second electrode 220 are spaced from each other. The light emitted from the active layer 360 of the light-emitting element 300 may be emitted to both ends of the light-emitting element 300, which are exposed without being surrounded or covered by the insulating film 380, and the light-emitting elements 300 located in each sub-pixel PXn may be located such that a direction in which both ends thereof face is directed upwardly with respect to the first substrate 101. In other words, the light-emitting element 300 may have a structure in which the plurality of semiconductor layers are stacked in one direction, and the one direction may be located to face the upward direction with respect to the first substrate 101 of the display device 10.

Furthermore, the light-emitting element 300 may have the width W that is greater than the height H thereof. In one or more embodiments, a separation distance between the first electrode 210 and the second electrode 220 measured in the thickness direction may be substantially the same as the height H of the light-emitting element 300, and may be less than the width W of the light-emitting element 300. In the light-emitting element 300, one direction in which the plurality of semiconductor layers are stacked may be parallel to the direction in which the first electrode 210 and the second electrode 220 are spaced from each other, and both end surfaces of the light-emitting element 300 may be smoothly in contact with the first electrode 210 and the second electrode 220. As shown in FIG. 3, both ends of the light-emitting element 300 may be in direct contact with the first electrode 210 and the second electrode 220, and because the light-emitting element 300 is formed to have the relatively large width W, the areas in which the light-emitting element 300 is in contact with the first electrode 210 and the second electrode 220 may be increased. Accordingly, contact surfaces between the light-emitting element 300 and the electrodes 210 and 220 may be widened, thereby reducing contact resistance.

In one or more embodiments, as described above, the display device 10 may include the first type light-emitting element 300A and the second type light-emitting element 300B facing difference directions. For example, the first type light-emitting element 300A may be located such that the first semiconductor layer 310 faces the first electrode 210, and the second type light-emitting element 300B may be located such that the first semiconductor layer 310 faces the second electrode 220. Both ends of each of the first type light-emitting element 300A and the second type light-emitting element 300B may be electrically connected to the first electrode 210 and the second electrode 220, respectively, and different ends thereof may be connected to the first electrode 210 and the second electrode 220, respectively. As shown in FIG. 3, in the first type light-emitting element 300A, the first semiconductor layer 310 may be electrically connected to the first electrode 210, and the electrode layer 370 may be electrically connected to the second electrode 220. In the second type light-emitting element 300B, the electrode layer 370 may be electrically connected to the first electrode 210, and the first semiconductor layer 310 may be electrically connected to the second electrode 220. For example, in the first type light-emitting element 300A, the first semiconductor layer 310 may be in direct contact with the first electrode 210, and the electrode layer 370 may be in direct contact with the second electrode 220. In the second type light-emitting element 300B, the first semiconductor layer 310 may be in direct contact with the second electrode 220, and the electrode layer 370 may be in direct contact with the first electrode 210. However, the present disclosure is not limited thereto, and other layers may be further located between the light-emitting element 300 and each of the electrodes 210 and 220, or the electrode layer 370 of the light-emitting element 300 may be omitted so that, in some of the light-emitting elements 300, the second semiconductor layer 320 may be in direct contact with one of the electrodes 210 and 220.

During a manufacturing process of the display device 10, the light-emitting element 300 may be sprayed onto the first electrode 210 in a state of being dispersed in an ink "Ink" (FIG. 11), and may be precipitated in the ink Ink to be located on the first electrode 210. As described above, the light-emitting element 300 may have a structure in which the plurality of semiconductor layers are stacked in the third direction DR3, but the light-emitting element 300 may not be located in a manner such that the first semiconductor layer 310 faces the first electrode 210. In some cases, the light-emitting element 300 may be located such that the electrode layer 370 or the second semiconductor layer 320 faces the first electrode 210.

In this case, in the first type light-emitting element 300A and the second type light-emitting element 300B, ends electrically connected to the first electrode 210 may have opposite polarities. However, in the display device 10, a driving signal transmitted to the light-emitting elements 300 may be alternating current (AC) power, and even when the light-emitting elements 300 are connected between the first electrode 210 and the second electrode 220 in opposite directions, the light-emitting elements 300 may each receive the driving signal to emit light.

The light-emitting element 300 according to one or more embodiments may be manufactured through an epitaxial growth method of performing crystal growth of semiconductor layers on a base substrate. Here, when the semiconductor layers grown on the base substrate are etched in a direction perpendicular to an upper surface of the base substrate, the semiconductor layers may be etched such that a width of the light-emitting element 300 is greater than a height thereof. Accordingly, the light-emitting element 300 having an aspect ratio of about 1.0 or less may be manufactured. Hereinafter, a method of manufacturing the light-emitting element 300 will be described with reference to other drawings.

FIGS. 6 to 9 are cross-sectional views illustrating a manufacturing process of the light-emitting element according to one or more embodiments.

Figure 6:
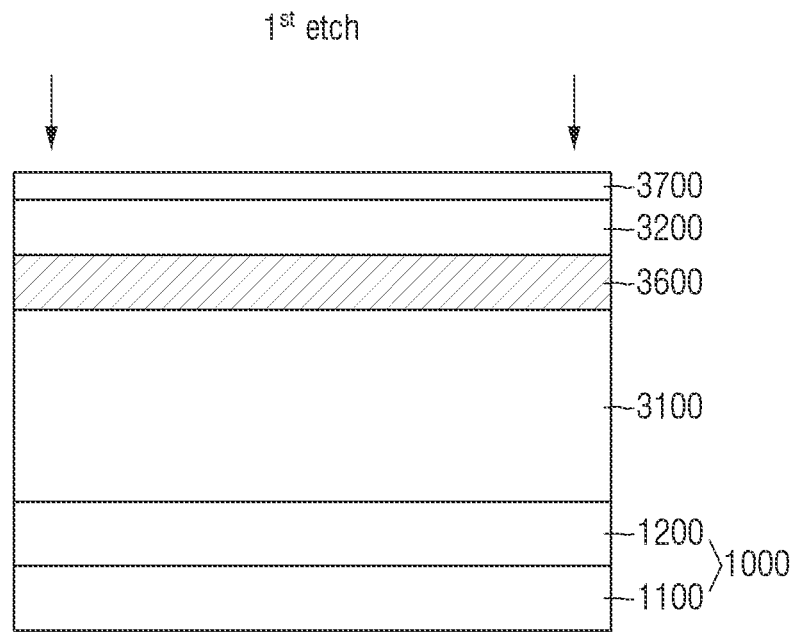
FIGS. 6 to 9 are cross-sectional views illustrating a manufacturing process of the light-emitting element according to one or more embodiments.

First, referring to FIG. 6, a lower substrate 1000 including a base substrate 1100 and a buffer material layer 1200 formed on the base substrate 1100 is prepared, and a plurality of semiconductor layers 3100, 3200, 3600, and 3700 are formed on the buffer material layer 1200. The base substrate 1100 may include a transparent substrate such as glass and a sapphire (Al₂O₃) substrate. However, the present disclosure is not limited thereto, and the base substrate 1100 may be formed as a conductive substrate such as a GaN, SiC, ZnO, Si, GaP, or GaAs substrate. Hereinafter, a case in which the base substrate 1100 is a sapphire (Al₂O₃) substrate will be described as an example. A thickness of the base substrate 1100 is not particularly limited, but as an example, the base substrate 1100 may have a thickness ranging from about 400 μm to about 1500 μm.

The plurality of semiconductor layers 3100, 3200, 3600, and 3700 may be formed on the base substrate 1100. The plurality of semiconductor layers grown by an epitaxial method may be formed by growing a seed crystal. Here, a method of forming the semiconductor layers may include an electron beam deposition method, a physical vapor deposition (PVD) method, a chemical vapor deposition (CVD) method, a plasma laser deposition (PLD) method, a dual-type thermal evaporation method, a sputtering method, a metal-organic chemical vapor deposition method (MOCVD), or the like, and in one or more embodiments, the MOCVD method. However, the present disclosure is not limited thereto.

A precursor material for forming the plurality of semiconductor layers is not particularly limited within a range that can be normally selected to form a target material. As an example, the precursor material may be a metal precursor including an alkyl group such as a methyl group or an ethyl group. For example, the precursor material may be a compound such as trimethyl gallium ($Ga(CH_3)_3$), trimethyl aluminum ($Al(CH_3)_3$), or triethyl phosphate ($(C_2H_5)_3PO_4$), but the present disclosure is not limited thereto. Hereinafter, the method of forming the plurality of semiconductor layers, process conditions, and the like will be omitted in the description, and a sequence of the manufacturing method and a stacked structure of the light-emitting element 300 will be described in detail.

The buffer material layer 1200 may be formed on the base substrate 1100. In the drawing, one buffer material layer 1200 is illustrated as being stacked, but the present disclosure is not limited thereto, and a plurality of buffer layers may be formed. The buffer material layer 1200 may be located to reduce a lattice constant difference between a first semiconductor layer 3100 and the base substrate 1100.

As an example, the buffer material layer 1200 may include an undoped semiconductor, may include substantially the same material as the first semiconductor layer 3100, and may contain a material that is not doped with an n-type or p-type dopant. In one or more embodiments, the buffer material layer 1200 may include at least one selected from among undoped InAlGaN, GaN, AlGaN, InGaN, AlN, and InN, but the present disclosure is not limited thereto. In addition, the buffer material layer 1200 may be omitted depending on the base substrate 1100. Hereinafter, a case in which the buffer material layer 1200 including an undoped semiconductor is formed on the base substrate 1100 will be described as an example.

The plurality of semiconductor layers 3100, 3200, 3600, and 3700 may be formed on the buffer material layer 1200. The plurality of semiconductor layers 3100, 3200, 3600, and 3700 may include the first semiconductor layer 3100, an active layer 3600, a second semiconductor layer 3200, and an electrode material layer 3700. The plurality of semiconductor layers may correspond to the first semiconductor layer 310, the active layer 360, the second semiconductor layer 320, and the electrode layer 370 of the light-emitting element 300, respectively. That is, the plurality of semiconductor layers may include the same materials as the first semiconductor layer 310, the active layer 360, the second semiconductor layer 320, and the electrode layer 370 of the light-emitting element 300, respectively.

Subsequently, some of the plurality of semiconductor layers may be etched ($1^{st}$ etch in FIG. 6) to form a semiconductor core 30 of the light-emitting element 300.

Figure 7:
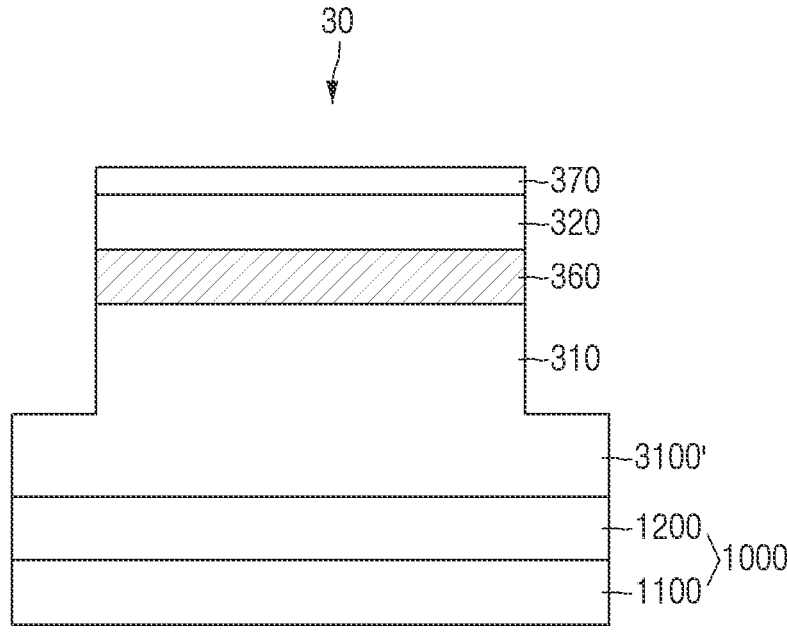

Referring to FIG. 7, on the lower substrate 1000, some of the plurality of semiconductor layers may be etched and removed, and the semiconductor core 30 and a first sub-semiconductor layer 3100', which is an unetched portion of the first semiconductor layer 3100, may be formed. The semiconductor layers may be etched by a one or more methods. For example, the semiconductor layers may be etched by a method of forming an etch mask layer thereon, and etching the semiconductor layers along the etch mask layer in a direction perpendicular to the lower substrate 1000.

For example, the process of etching the semiconductor layers may be performed through a dry etching method, a wet etching method, a reactive ion etching (RIE) method, an inductively coupled plasma reactive ion etching (ICP-RIE) method, or the like. Anisotropic etching may be performed through the dry etching method, and thus, the dry etching method may be suitable for vertical etching. When using the etching method of the above-described method, an etchant may include $Cl_2$, $O_2$, or the like. However, the present disclosure is not limited thereto.

In one or more embodiments, the semiconductor layers may be etched by mixing a dry etching method and a wet etching method. For example, first, etching in a depth direction may be performed by the dry etching method, and then a sidewall etched through the wet etching method, which is an isotropic etching method, may be located on a plane perpendicular to the surface.

In the process ($1^{st}$ etch) of etching the semiconductor layers, the semiconductor core 30 remaining after being etched may have a width greater than a height thereof. As described above, the light-emitting element 300 according to one or more embodiments may have the width W greater than the height H, which may vary depending on the structure of the mask used in the process of etching the semiconductor layers. A repeated detailed description thereof will be omitted.

Figure 8:
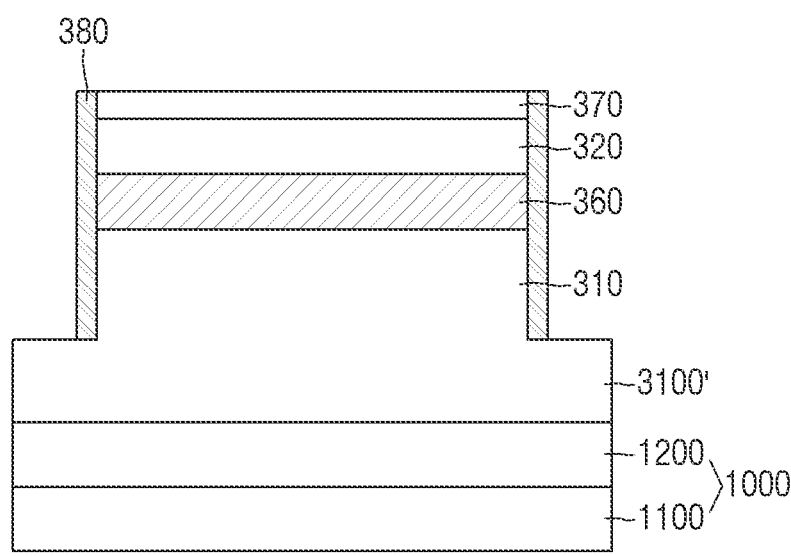
Figure 9:
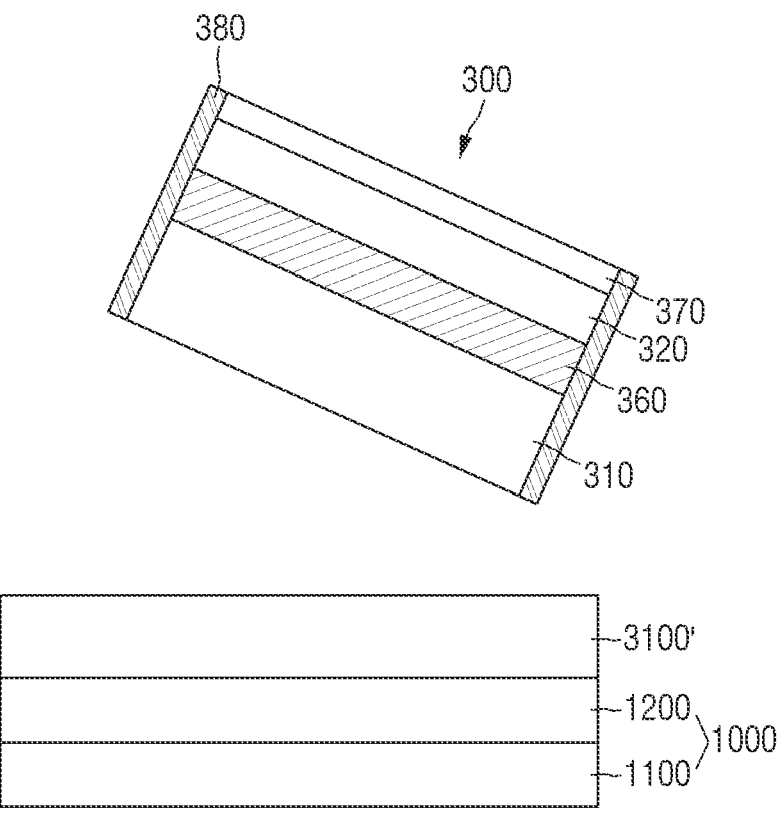

Subsequently, referring to FIGS. 8 and 9, an insulating film 380 around (e.g., surrounding) a side surface of the semiconductor core 30 is formed, and the semiconductor core 30 on which the insulating film 380 is formed may be separated from the first sub-semiconductor layer 3100' to manufacture the light-emitting element 300. The insulating film 380 may be formed by forming an insulating film around (e.g., surrounding) an outer surface (e.g., an outer peripheral or circumferential surface) of the semiconductor core 30 and partially removing the insulating film to expose one end of the semiconductor core 30, for example, an upper surface of the electrode layer 370. The process of forming the insulating film may be performed by applying an insulating material onto the outer surface (e.g., the outer peripheral or circumferential surface) of the semiconductor core 30, or a precipitating method. As an example, the insulating film may be formed by an atomic layer deposition (ALD) method.

The process of separating the semiconductor core 30 on which the insulating film 380 is formed is not particularly limited. In one or more embodiments, the process of separating the semiconductor core 30 from the first sub-semiconductor layer 3100' may be performed by a physical separation method, a chemical separation method, or the like.

Because the light-emitting element 300 has a relatively small height H, in the first semiconductor layer 3100, the first sub-semiconductor layer 3100' may remain after the first etch process ($1^{st}$ etch). In the drawing, it is illustrated that only the semiconductor core 30 formed on the first sub-semiconductor layer 3100' is separated to form the light-emitting element 300, but the present disclosure is not limited thereto. In one or more embodiments, during the manufacturing process of the light-emitting element 300, a portion of the first sub-semiconductor layer 3100' may be separated together with the semiconductor core 30, and in the light-emitting element 300, the first semiconductor layer 310 may include an extension portion having a greater width. Accordingly, in the light-emitting element 300, a width of the first semiconductor layer 310 may be greater than a width of the second semiconductor layer 320, and during a manufacturing process of the display device 10, most of the light-emitting elements 300 may be located such that the first semiconductor layer 310 faces the first electrode 210. A detailed description thereof will be provided below.

Figure 11:
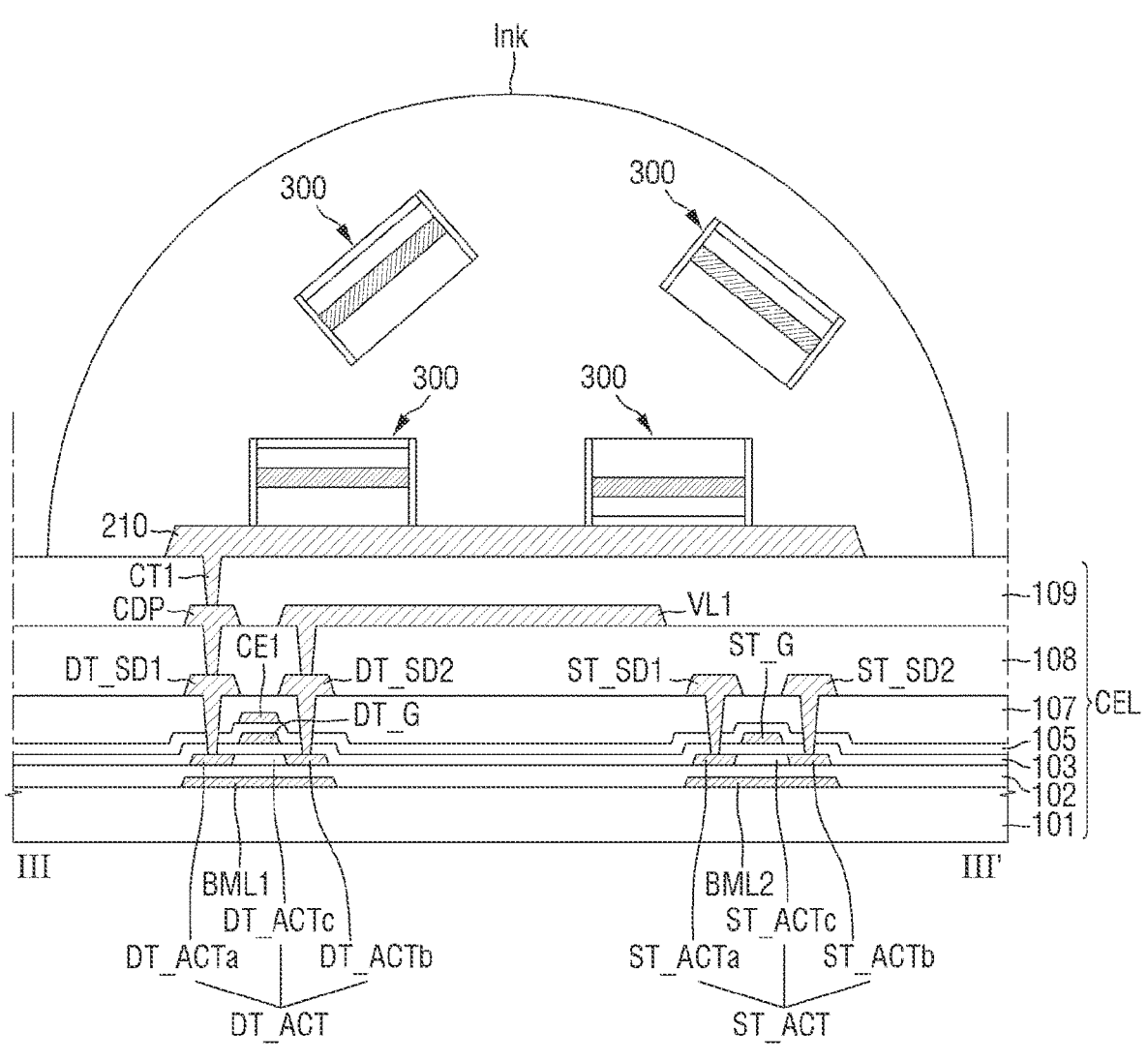

The light-emitting elements 300 manufactured as described above may be prepared in a state of being dispersed in the ink Ink (FIG. 11). During the manufacturing process of the display device 10, the light-emitting elements 300 may be sprayed onto the first electrode 210 in a state of being dispersed in the ink Ink, and may be precipitated in the ink Ink in a gravity direction to be located on the first electrode 210.

Figure 10:
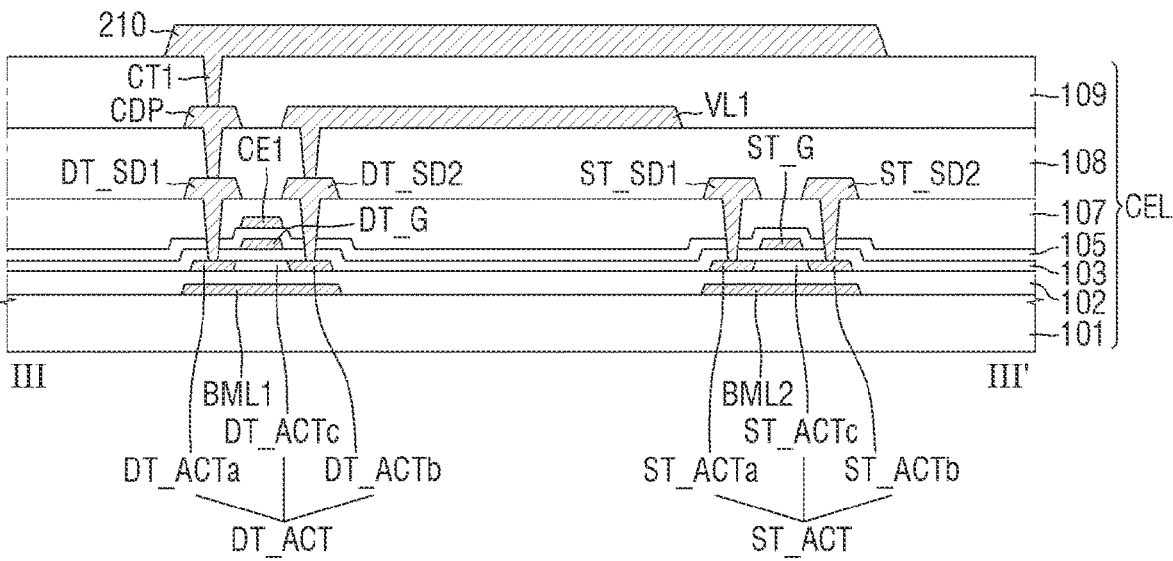
FIGS. 10 to 12 are cross-sectional views illustrating a manufacturing process of the display device according to one or more embodiments.
Figure 12:
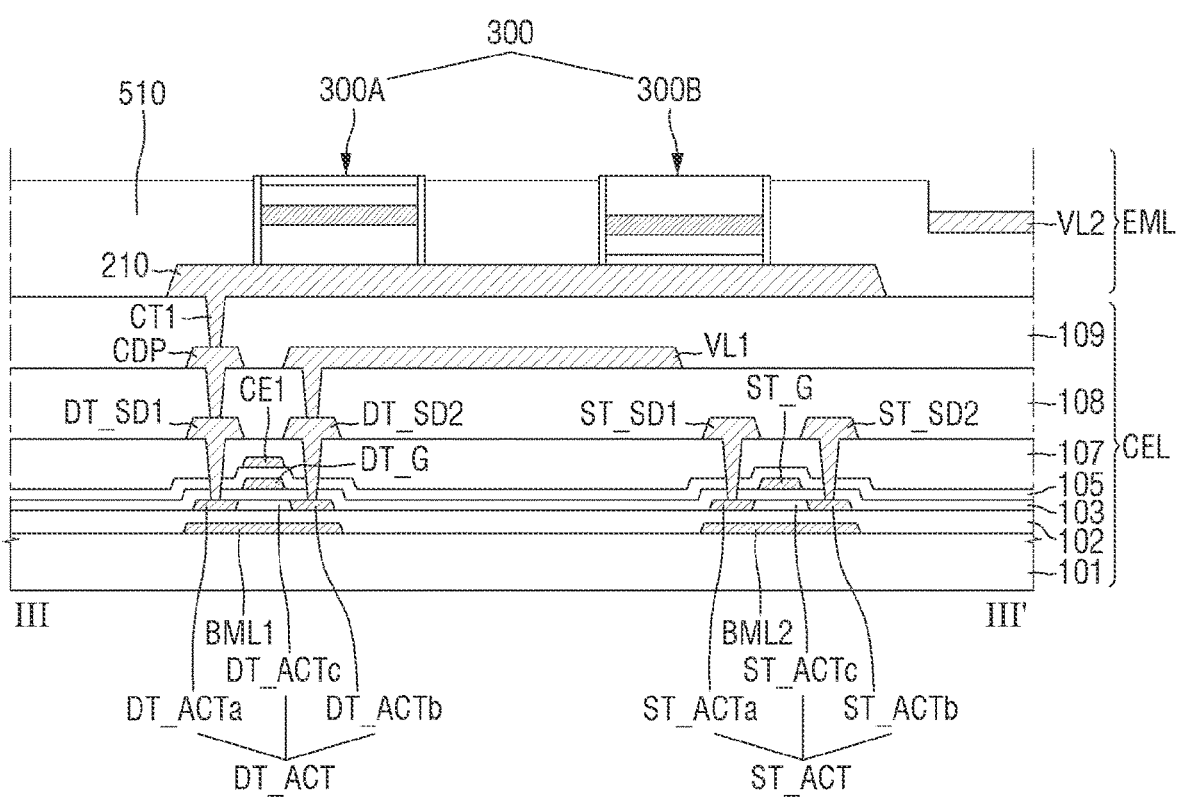

FIGS. 10 to 12 are cross-sectional views illustrating a manufacturing process of the display device according to one or more embodiments.

Referring to FIG. 10, a circuit element layer CEL including a first substrate 101 and a plurality of insulating layers and a conductive layer located on the first substrate 101 are prepared, and a first electrode 210 formed on the circuit element layer CEL is prepared. Descriptions of shapes of the circuit element layer CEL and the first electrode 210 are the same as described above, and thus detailed descriptions thereof will be omitted.

Subsequently, referring to FIG. 11, ink Ink in which light-emitting elements 300 are dispersed is sprayed onto the first electrode 210. The light-emitting elements 300 may be dispersed in the ink Ink, and precipitated in a gravity direction to be located on the first electrode 210. Here, the light-emitting element 300 may be located such that one end thereof, for example, one end in a direction in which the first semiconductor layer 310 is located faces the first electrode 210 or an opposite direction. As described above, the display device 10 may include a first type light-emitting element 300A and a second type light-emitting element 300B. This may be due to the fact that the light-emitting elements 300 in a state of being dispersed in the ink Ink are precipitated and located without directionality during the manufacturing process of the display device 10. In addition, the plurality of light-emitting elements 300 located on the first electrode 210 may not be arranged in a corresponding direction, and may be located in a random arrangement by being spaced from each other at a non-uniform interval.

However, the present disclosure is not limited thereto, and as described above, when the first semiconductor layer 310 of the light-emitting element 300 further includes an extension portion, the light-emitting elements 300 may be located such that one ends thereof face a desired direction (e.g., a set or predetermined direction).

Subsequently, referring to FIG. 12, a first insulating layer 510 surrounding (e.g., in a plan view) an outer surface (e.g., an outer peripheral or circumferential surface) of each of the light-emitting elements 300 is formed on the first electrode 210, and a second voltage line VL2 located on a partial area of the first insulating layer 510 is formed. The first insulating layer 510 may be formed by being entirely located on the first electrode 210 and a first planarization layer 109, including the light-emitting elements 300 and then being etched to expose one end of each of the light-emitting elements 300.

However, the present disclosure is not limited thereto. A description of a structure thereof is the same as described above.

Next, in one or more embodiments, a second electrode 220 is formed on the first insulating layer 510. A description of a structure of the second electrode 220 is the same as described above.

Subsequently, various embodiments of the display device 10 and the light-emitting element 300 according to one or more embodiments will be described.

Figure 13:
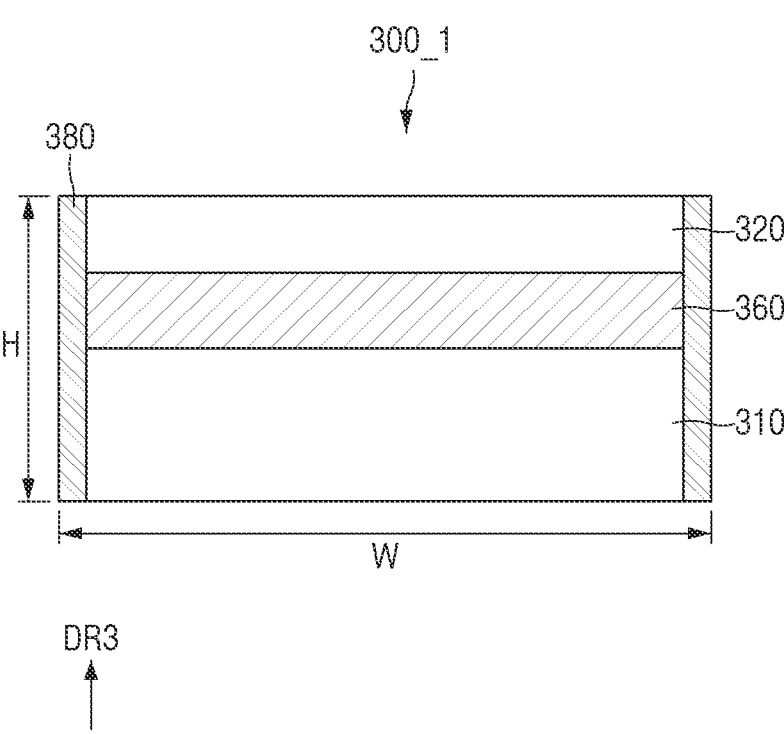
FIG. 13 is a cross-sectional view of a light-emitting element according to one or more embodiments.
Figure 14:
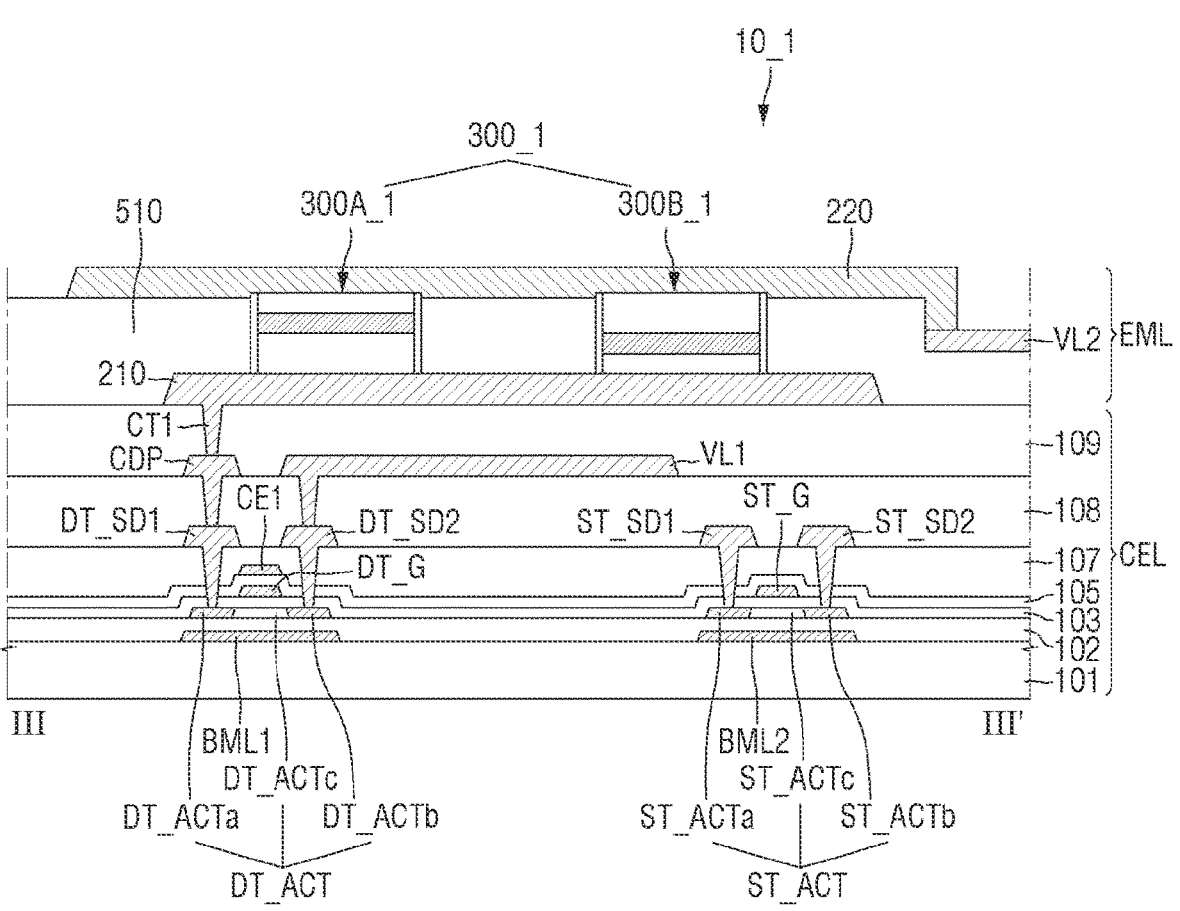
FIG. 14 is a cross-sectional view illustrating a portion of a display device including the light-emitting element of FIG. 13.

FIG. 13 is a cross-sectional view of a light-emitting element according to one or more embodiments. FIG. 14 is a cross-sectional view illustrating a portion of a display device including the light-emitting element of FIG. 13.

Referring to FIGS. 13 and 14, in a light-emitting element 300_1 according to one or more embodiments, an electrode layer 370 may be omitted. Accordingly, in each of a first type light-emitting element 300A_1 and a second type light-emitting element 300B_1 of a display device 10_1 according to one or more embodiments, the electrode layer 370 may be omitted, and a second semiconductor layer 320 may be in direct contact with a first electrode 210 or a second electrode 220. The light-emitting element 300_1 and the display device 10_1 of FIGS. 13 and 14 are different from those of the embodiments corresponding to FIGS. 3 and 4 in that the electrode layer 370 is omitted. Hereinafter, repeated descriptions will be omitted, and descriptions will be provided in detail based on differences from the above-described contents.

As described above, the light-emitting element 300_1 may have a shape in which a height H is smaller than a width W, and respective end surfaces of the light-emitting element 300_1 may be in contact with the first electrode 210 and the second electrode 220 in a wide area. As in the light-emitting element 300_1 of FIG. 13, even though the electrode layer 370 is omitted, contact resistance between the light-emitting element 300_1 and the electrodes 210 and 220 may be small because the width W of the second semiconductor layer 320 is increased. As shown in FIG. 14, in the first type light-emitting element 300A_1, the second semiconductor layer 320 may be in direct contact with the second electrode 220, and in the second type light-emitting element 300B_1, the second semiconductor layer 320 may be in direct contact with the first electrode 210.

In the drawing, a side surface of the second semiconductor layer 320 is illustrated as being surrounded by the insulating film 380, but the present disclosure is not limited thereto. The insulating film 380 may be located to surround only a portion of the side surface of the second semiconductor layer 320, and the side surface of the second semiconductor layer 320 may be partially exposed. In this case, the side surface of the second semiconductor layer 320 may be in direct contact with the second electrode 220 or the first insulating layer 510.

In one or more embodiments, when the electrode layer 370 of the light-emitting element 300_1 is omitted, the display device 10 may further include a contact electrode located between the light-emitting element 300_1 and each of the electrodes 210 and 220 for a smooth contact between the light-emitting element 300_1 and each of the electrodes 210 and 220.

Figure 15:
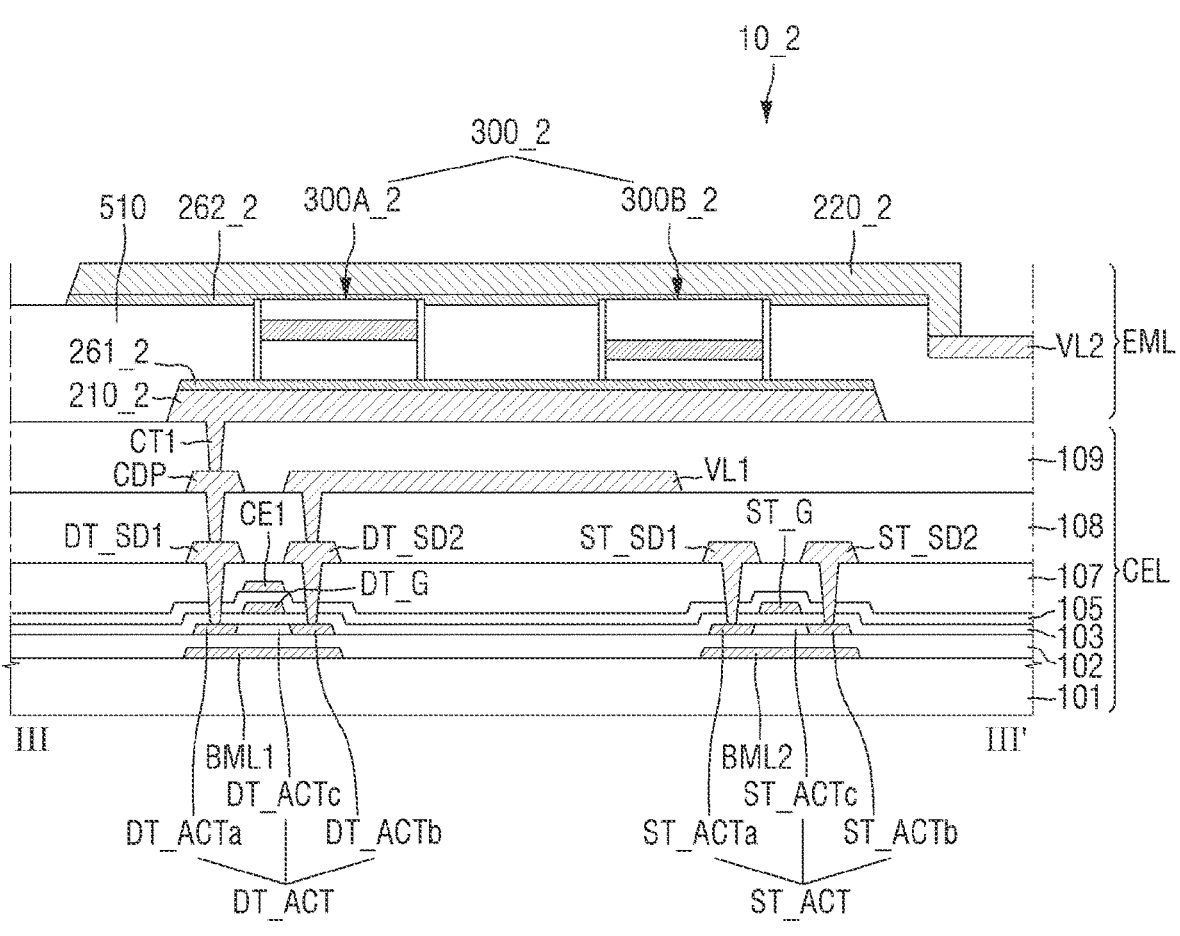
FIG. 15 is a cross-sectional view illustrating a portion of a display device according to one or more embodiments.

FIG. 15 is a cross-sectional view illustrating a portion of a display device according to one or more embodiments.

Referring to FIG. 15, a display device 10_2 according to one or more embodiments may further include a first contact electrode 261_2 located on a first electrode 210_2 and a second contact electrode 262_2 located between a second electrode 2202, and a first insulating layer 510 and light-emitting elements 300_2. The display device 10_2 of FIG. 15 is different from that of the embodiments corresponding to FIG. 14 in that the contact electrodes 261_2 and 262_2 are further located, respectively, between the electrodes 210_2 and 220_2 and the light-emitting element 300_2. Hereinafter, repeated descriptions will be omitted, and descriptions will be provided based on differences from the above-described contents.

The display device 10_2 of FIG. 15 may further include the first contact electrode 261_2 located on the first electrode 2102, and the second contact electrode 262_2 located on the first insulating layer 510 and the light-emitting elements 300_2. The second electrode 220_2 may be located directly on the second contact electrode 262_2.

The first contact electrode 261_2 may have substantially the same shape as the first electrode 210_2. That is, like the first electrode 210_2, the first contact electrode 261_2 may have an angular shape, of which one side extends in one direction and the other side extends in the other direction, in a plan view. However, the present disclosure is not limited thereto. In some cases, the first contact electrode 261_2 may be formed to be greater than the first electrode 210_2, and may cover the first electrode 210_2 and a portion thereof may be located directly on the first planarization layer 109. In addition, like the first electrode 210_2, the first contact electrode 261_2 may be located to correspond to each sub-pixel PXn, and may not be connected to a first contact electrode 261_2 of another adjacent sub-pixel PXn. For example, the first contact electrode 2612 may form an island pattern over the entire surface of a display area DPA.

The second contact electrode 262_2 may have substantially the same shape as the second electrode 220_2. That is, the second contact electrode 262_2 may also have an angular shape in a plan view like the second electrode 220_2, and may be formed to have a larger area than the first contact electrode 261_2. However, the second contact electrode 262_2 may be located not to overlap a second voltage line VL2. The second electrode 220_2 may be in direct contact with the second voltage line VL2 in an area in which the second contact electrode 262_2 is not located.

The contact electrodes 261_2 and 262_2 may include a conductive material. For example, the contact electrodes 261_2 and 262_2 may include ITO, IZO, ITZO, aluminum (AI), or the like. As an example, the contact electrodes 261_2 and 262_2 may include a transparent conductive material, and light emitted from the light-emitting element 300_2 may pass through the contact electrodes 261_2 and 262_2 to travel toward the electrodes 210_2 and 220_2. Because the first electrode 210_2 includes a material having a high reflectance, and the second electrode 220_2 includes a transparent material, light traveling toward the first electrode 210_2 through the first contact electrode 261_2 may be reflected in an upward direction with respect to a first substrate 101, and light traveling toward the second electrode 220_2 through the second contact electrode 262_2 may pass through the second electrode 220_2 to be emitted in the upward direction with respect to the first substrate 101.

The contact electrodes 261_2 and 262_2 may be located at least in an area in which each of the electrodes 210_2 and 220_2 and the light-emitting element 300_2 are in contact with each other. Like the light-emitting element 300_1 of FIG. 13, contact resistance between the electrodes 210_2 and 220_2 and the light-emitting element 300_2 may be increased in the case of the light-emitting element 300__2 in which the electrode layer 370 is omitted, and the contact electrodes 261_2 and 262_2 may reduce the contact resistance therebetween. The light-emitting element 300_2 may be in direct contact with the contact electrodes 261_2 and 262_2, and may be electrically connected to the electrodes 210_2 and 220_2 through the contact electrodes 261_2 and 262_2.

As described above, the light-emitting element 300_2 may include a first type light-emitting element 300A_2 located such that a first semiconductor layer 310 faces (e.g., opposes) the first electrode 210_2, and a second type light-emitting element 300B_2 located such that a second semiconductor layer 320 faces (e.g., opposes) the first electrode 210_2. In this case, in the first type light-emitting element 300A_2, the first semiconductor layer 310 may be in direct contact with the first contact electrode 261_2, and the second semiconductor layer 320 may be in direct contact with the second contact electrode 262_2. In the second type light-emitting element 300B_2, the second semiconductor layer 320 may be in contact with the first contact electrode 261_2, and the first semiconductor layer 310 may be in direct contact with the second contact electrode 262_2.

In FIG. 15, it is illustrated that the display device 10_2 includes the light-emitting element 300_2 in which the electrode layer 370 is omitted, and the light-emitting element 300_2 is electrically connected to the electrodes 210 and 220 respectively through the contact electrodes 261_2 and 262_2. However, the present disclosure is not limited thereto, and even when the light-emitting element 300 includes the electrode layer 370 in the display device 10 like the display device 10 of FIG. 3, the contact electrodes 261_2 and 262_2 may be further located respectively between the electrodes 210 and 220 and the light-emitting element 300. In this case, in the first type light-emitting element 300A, the electrode layer 370 may be in direct contact with the second contact electrode 262_2, and in the second type light-emitting element 300B, the electrode layer 370 may be in direct contact with the first contact electrode 261_2. A description thereof will be omitted.

Figure 16:
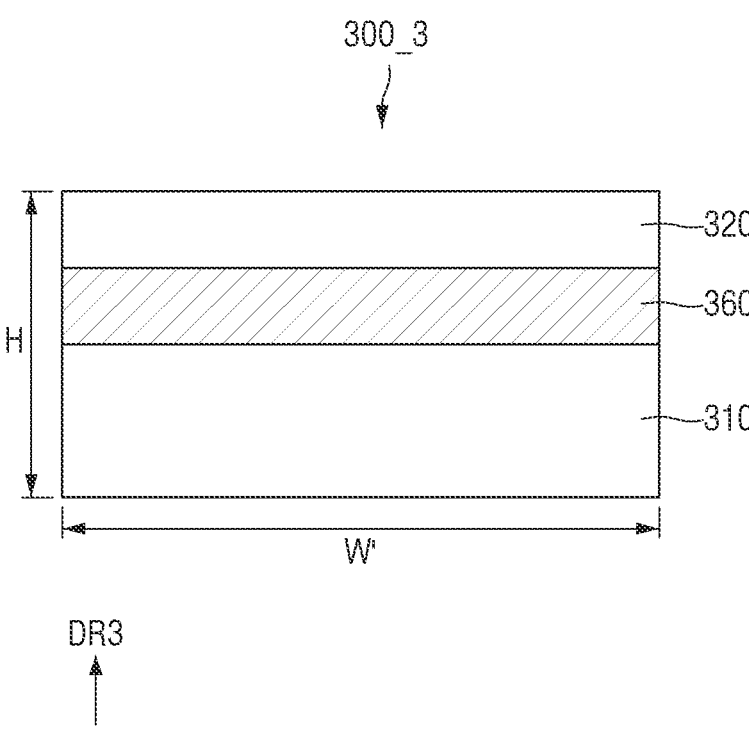
FIG. 16 is a cross-sectional view of a light-emitting element according to one or more embodiments.
Figure 17:
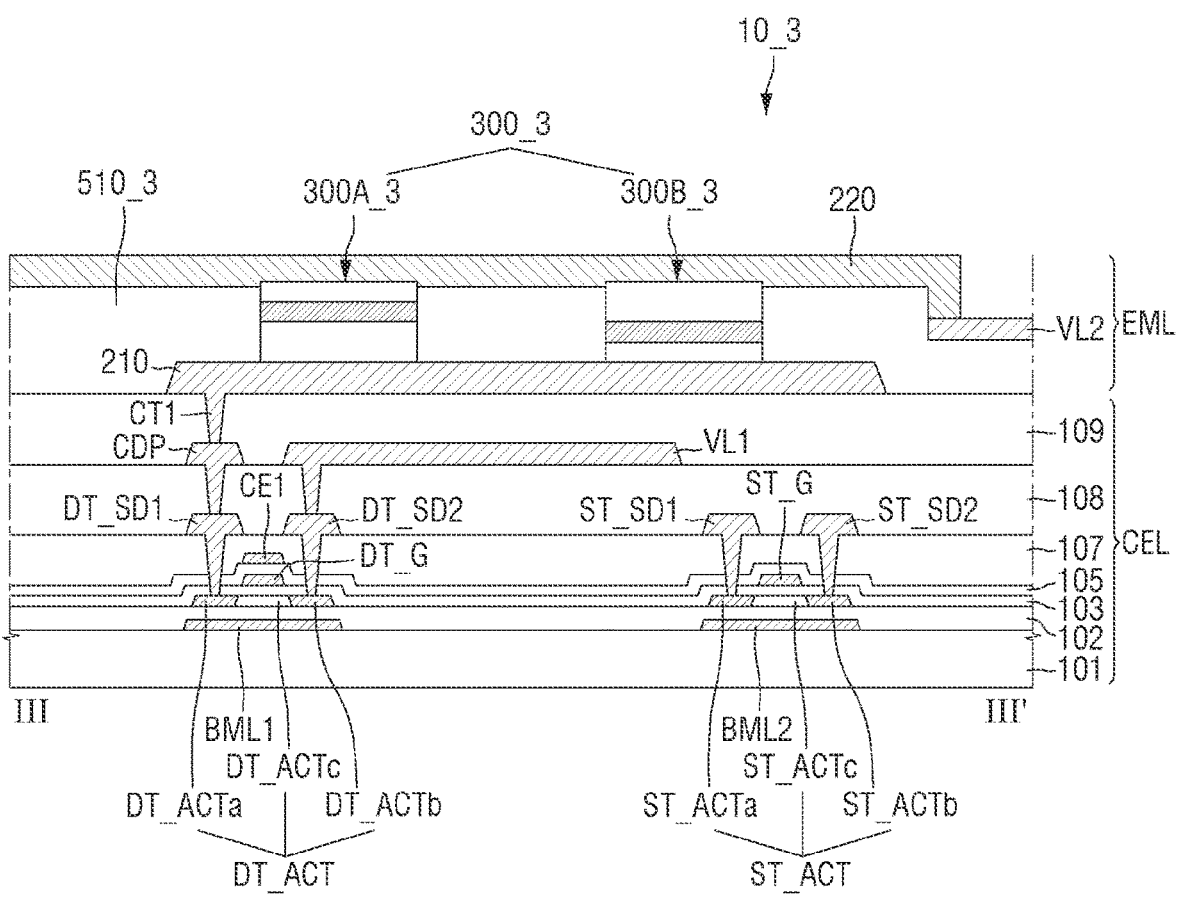
FIG. 17 is a cross-sectional view illustrating a portion of a display device including the light-emitting element of FIG. 16.

FIG. 16 is a cross-sectional view of a light-emitting element according to one or more embodiments. FIG. 17 is a cross-sectional view illustrating a portion of a display device including the light-emitting element of FIG. 16.

Referring to FIGS. 16 and 17, in a light-emitting element 300 according to one or more embodiments, an insulating film 380 may be omitted, and only a first semiconductor layer 310, a second semiconductor layer 320, and an active layer 360 may be included. In a display device 10_3 according to one or more embodiments, an electrode layer 370 and the insulating film 380 may be omitted from each of a first type light-emitting element 300A_3 and a second type light-emitting element 300B_3, and the first semiconductor layer 310, the second semiconductor layer 320, and the active layer 360 may each be in direct contact with a first insulating layer 510_3. The light-emitting element 300 and the display device 10_3 of FIGS. 16 and 17 are different from those of the embodiments corresponding to FIGS. 13 and 14 in that the insulating film 380 is omitted. Hereinafter, repeated descriptions will be omitted, and descriptions will be provided based on differences from the above-described contents.

The insulating film 380 of the light-emitting element 300 is located to be around (e.g., to surround in a plan view) at least an outer surface (e.g., an outer peripheral or circumferential surface) of the active layer 360 to protect the active layer 360. However, the display device 10 according to one or more embodiments may include the first insulating layer 510 surrounding an outer surface (e.g., an outer peripheral or circumferential surface) of the light-emitting element 300, and the first insulating layer 510 may protect other semiconductor layers of the light-emitting element 300 including the active layer 360. A width W of the light-emitting element 300 in which the insulating film 380 is omitted may be less than that of the light-emitting element 300 of FIG. 4. However, the light-emitting element 300 according to one or more embodiments may have a shape in which the width W is greater than a height H, and an area of the active layer 360 may be increased.

In the light-emitting element 300_3 and the display device 10_3 of FIGS. 16 and 17, because the insulating film 380 of the light-emitting element 300_3 is omitted, the first insulating layer 510_3 may perform a function of directly protecting the active layer 360. During a manufacturing process of the display device 10_3, the light-emitting elements 300_3 dispersed in ink Ink may be located on a first electrode 210 by being precipitated. When the light-emitting elements 300_3 may be located on the first electrode 210 by only a process of spraying the ink Ink, the risk of damage to the active layer 360 of the light-emitting element 300_3 may be reduced. That is, even when the insulating film 380 is omitted from the light-emitting element 300_3, the active layer 360 may not be damaged before the first insulating layer 510_3 is formed. In the display device 10_3 according to one or more embodiments, even when the insulating film 380 is omitted from the light-emitting element 300_3, the risk of damage to the active layer 360 may be low, and the first insulating layer 510_3 may be in direct contact with and may protect the outer surface (e.g., the outer peripheral or circumferential surface) of the active layer 360.

In one or more embodiments, a second voltage line VL2 may not necessarily be located on the first insulating layer 510. The second voltage line VL2 may also be located on a second interlayer insulating layer 108, like a first voltage line VL1.

Figure 18:
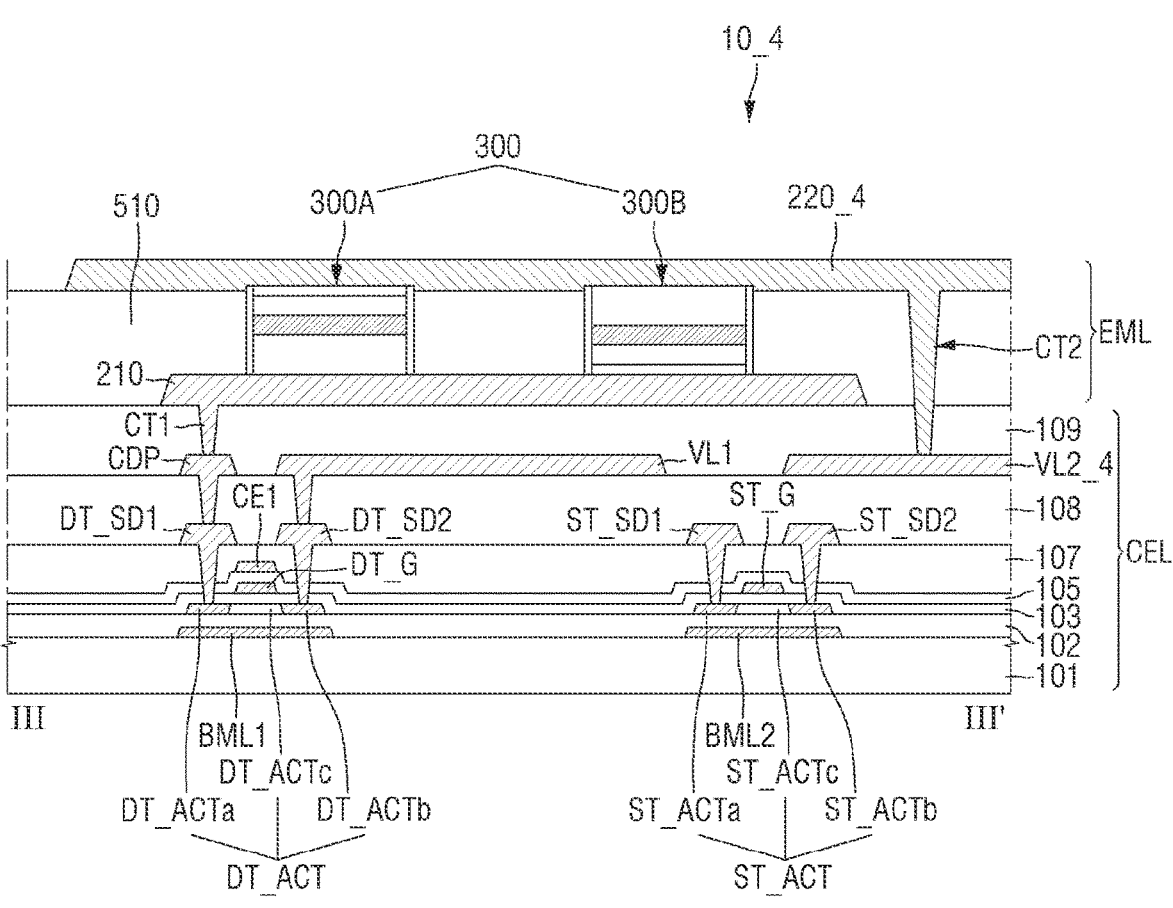
FIG. 18 is a cross-sectional view illustrating a portion of a display device according to one or more embodiments.

FIG. 18 is a cross-sectional view illustrating a portion of a display device according to one or more embodiments.

Referring to FIG. 18, in a display device 10_4 according to one or more embodiments, a second voltage line VL2_4 may be located on a second interlayer insulating layer 108. A second electrode 220_4 may be electrically connected to the second voltage line VL2_4 through a second contact hole CT2 exposing a portion of an upper surface of the second voltage line VL2 through a first insulating layer 510 and a first planarization layer 109.

The second voltage line VL2_4 may be electrically connected to the second electrode 220_4, and a driving voltage, for example, a second power voltage VSS, may be applied thereto, thereby driving a light-emitting element 300 together with a first voltage line VL1. Even though the second electrode 220_4 is located on the first insulating layer 510, when a space for forming a contact hole passing through some insulating layers is provided, the second voltage line VL2_4 may also be located on another layer that is not the first insulating layer 510. During a manufacturing process of the display device 10_4, the second voltage line VL2_4 may be located on the second interlayer insulating layer 108 together with the first voltage line VL1, and the second contact hole CT2 exposing the second voltage line VL2_4 may be formed before forming the second electrode 220_4. The second contact hole CT2 may pass through the first insulating layer 510 and the first planarization layer 109, and the second electrode 220_4 may be in direct contact with the second voltage line VL2_4 exposed through the second contact hole CT2.

As described above, in the display device 10 according to one or more embodiments, members located on the first planarization layer 109, for example, the second electrode 220 and the first insulating layer 510 may be located to have different shapes.

Figure 19:
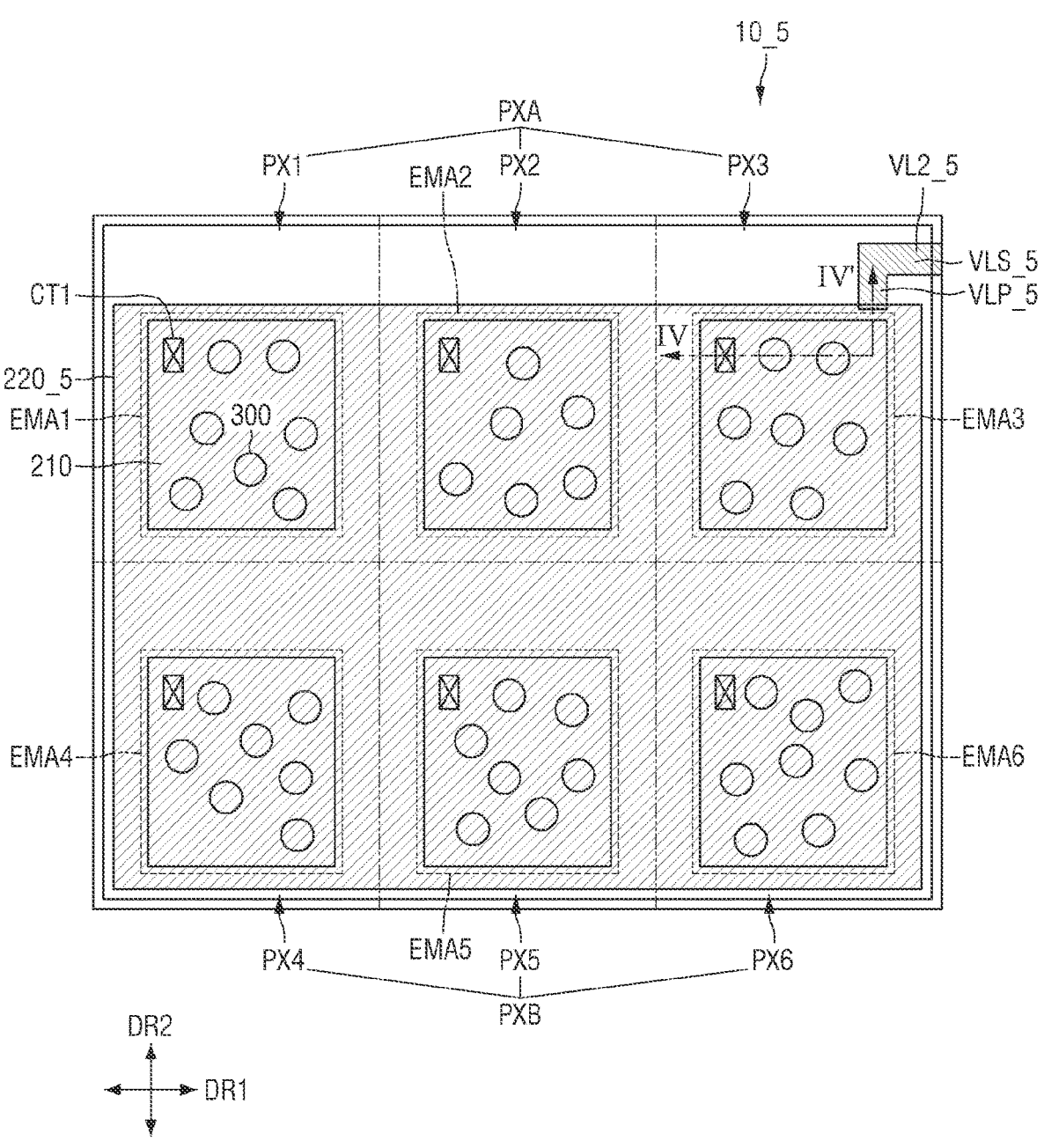
FIG. 19 is a plan view illustrating a first pixel and a second pixel of a display device according to one or more embodiments.
Figure 20:
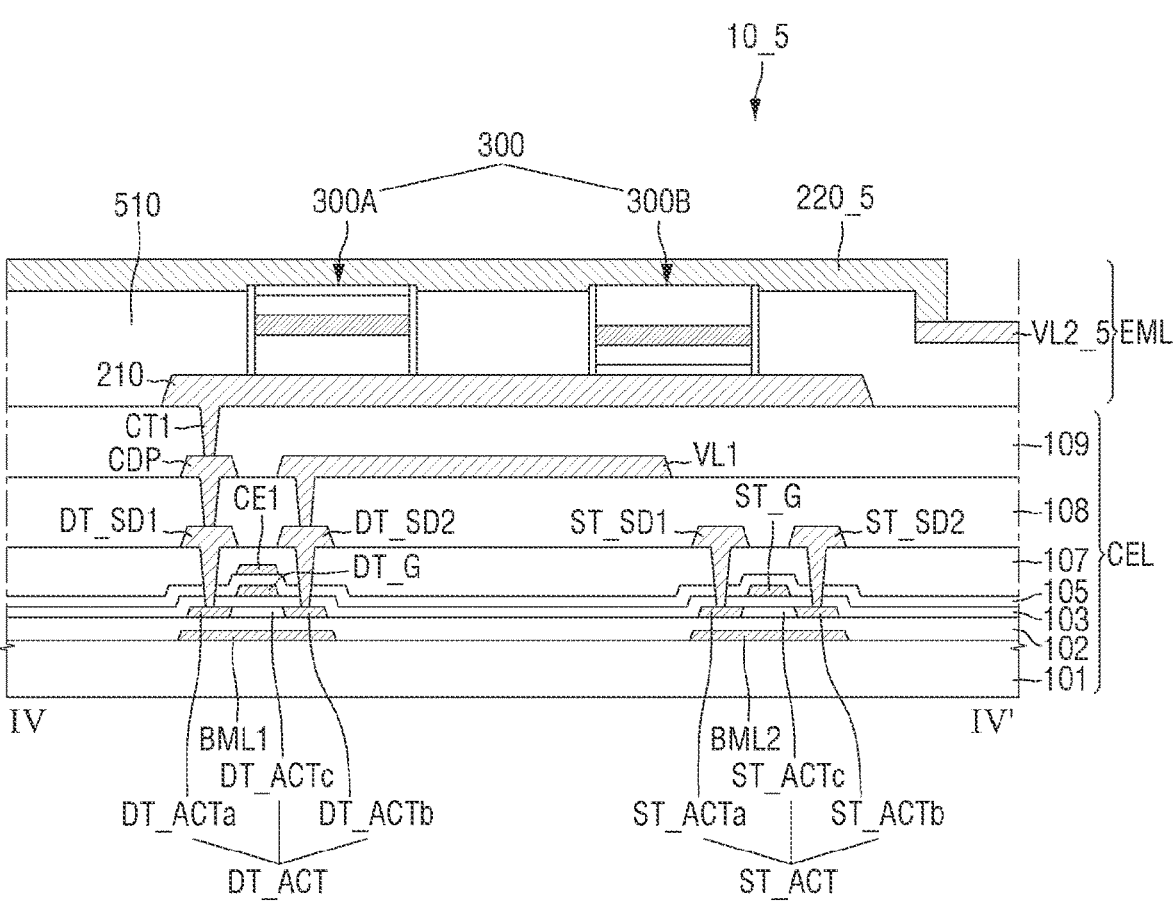
FIG. 20 is a cross-sectional view taken along the line IV-IV' of FIG. 19.

FIG. 19 is a plan view illustrating a first pixel and a second pixel of a display device according to one or more embodiments. FIG. 20 is a cross-sectional view taken along the line IV-IV' of FIG. 19.

First, referring to FIGS. 19 and 20, in a display device 10_5 according to one or more embodiments, one second electrode 220_5 may be located to cover a plurality of sub-pixels PXn or pixels PXA and PXB. That is, the second electrode 220_5 located in each sub-pixel PXn may be integrated into one electrode. The display device 10_5 of FIGS. 19 and 20 differs from that of the embodiments corresponding to FIGS. 2 and 3 in that a shape of the second electrode 220_5 is different. Hereinafter, repeated descriptions will be omitted, and descriptions will be provided based on differences from the above-described embodiments.

In the display device 10_5 of FIGS. 19 and 20, the second electrode 220_5 may extend in the first direction DR1 and the second direction DR2 to be located beyond adjacent sub-pixels PXn. A planar area of the second electrode 2205 may be formed to be greater than that of each sub-pixel PXn, and one second electrode 2205 may also be located on another sub-pixel PXn. The second electrode 220_5 may be located over the entire surface of the display area DPA on the first insulating layer 510.

As described above, the second electrode 220 located in each sub-pixel PXn may be electrically connected to a second voltage line VL2, and the same electrical signal may be applied to the second electrode 220. Even though one second electrode 220_5 is located in the plurality of sub-pixels PXn, the same electrical signal may be applied to the plurality of sub-pixels PXn through the second electrode 220_5 electrically connected to the second voltage line VL2_5.

Further, because the second electrode 220_5 is located to cover the plurality of sub-pixels PXn, the second voltage line VL2_5 may be located only in some pixels or sub-pixels PXn, and may not be located in some sub-pixels PXn. As shown in the drawing, in the second voltage line VL2_5, a line stem portion VLS_5 and a line branch portion VLP_5 may be located only on the third sub-pixel PX3 and may not be located in the other sub-pixels PXn. The second electrode 220_5 may be electrically connected to the second voltage line VL2_5 in the third sub-pixel PX3, but because the second electrode 220_5 may cover the other sub-pixels PXn, the same second power voltage VSS may be applied to each sub-pixel PXn.

However, the present disclosure is not limited thereto. In some cases, as the first insulating layer 510 is separated and located for each sub-pixel PXn, an island pattern may be formed on the entire surface of the display area DPA.

Figure 21:
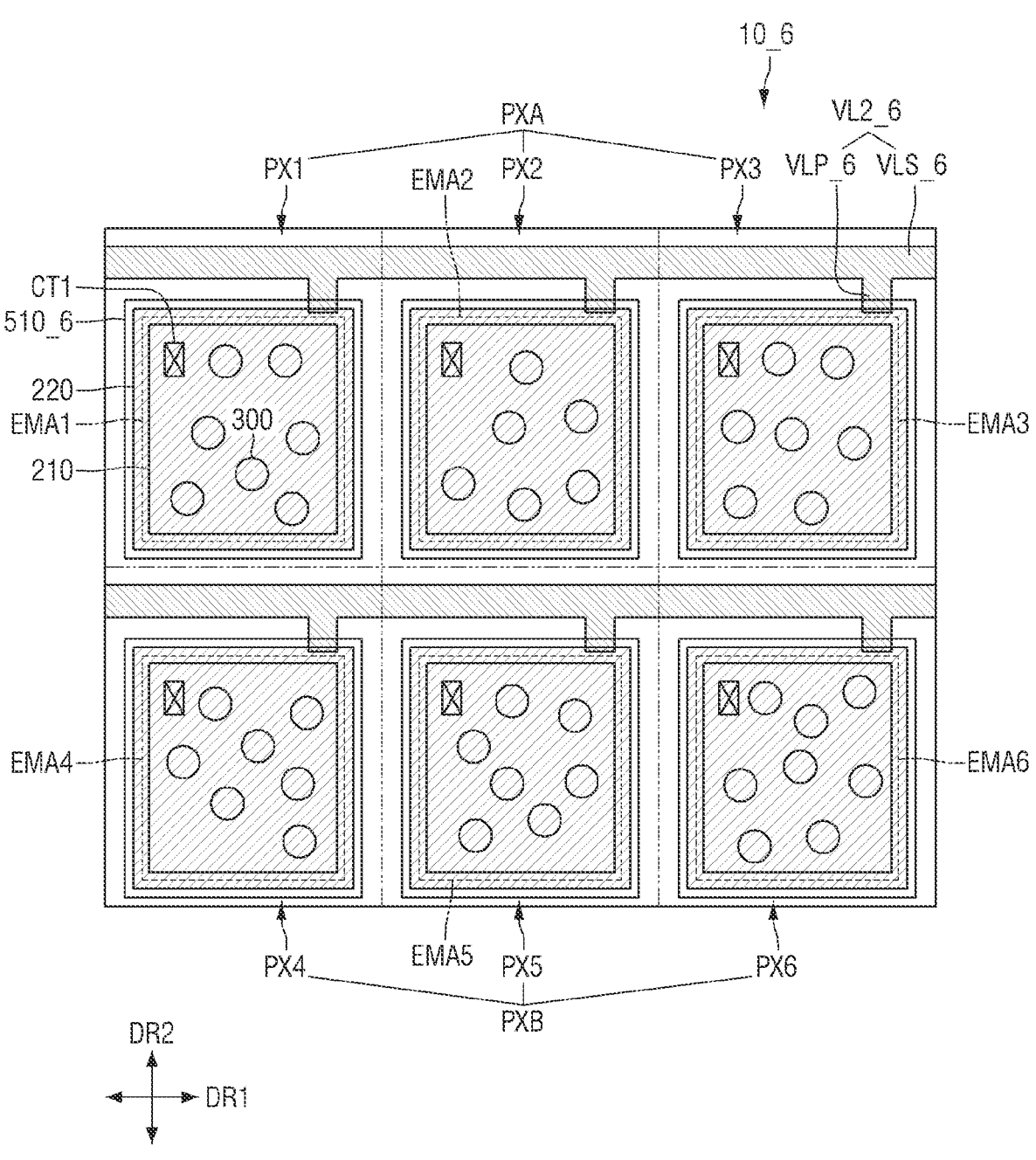
FIG. 21 is a plan view illustrating a first pixel and a second pixel of a display device according to one or more embodiments.
Figure 22:
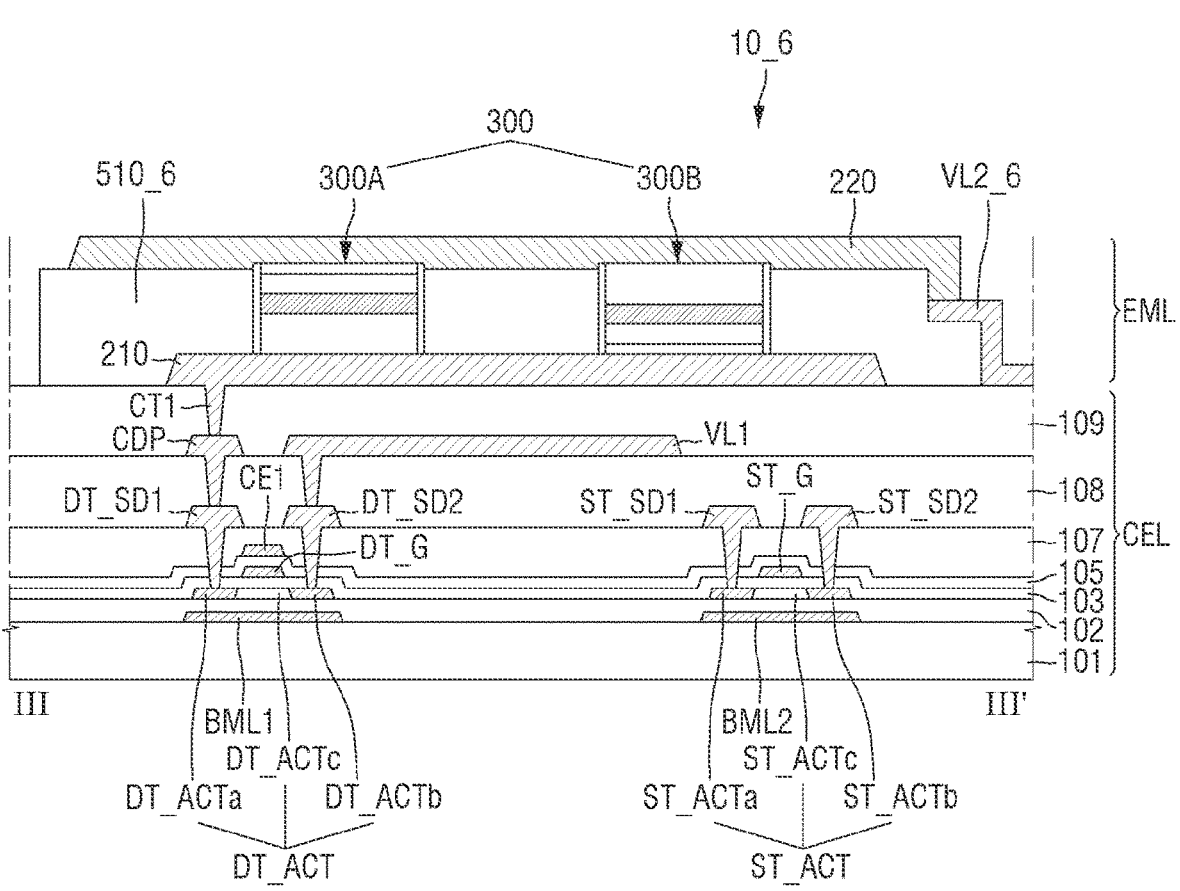
FIG. 22 is a cross-sectional view illustrating a portion of the display device of FIG. 21.

FIG. 21 is a plan view illustrating a first pixel and a second pixel of a display device according to one or more embodiments. FIG. 22 is a cross-sectional view illustrating a portion of the display device of FIG. 21.

Referring to FIGS. 21 and 22, in a display device 10_6 according to one or more embodiments, a plurality of separated first insulating layers 510_6 may be located in each sub-pixel PXn. The first insulating layer 510_6 may have the same planar shape as the first electrode 210. That is, the first insulating layer 510_6 has a shape of which each side extends in the first direction DR1 and the second direction DR2, and may be located to correspond to each sub-pixel PXn. The display device 10_6 of FIGS. 21 and 22 is different from that of the embodiments corresponding to FIGS. 2 and 3 in that the first insulating layer 510_6 forms an island pattern. Hereinafter, repeated descriptions will be omitted, and descriptions will be provided based on differences from the above-described contents.

In the display device 10_6 of FIGS. 21 and 22, the first insulating layer 510_6 may be located in each sub-pixel PXn. The first insulating layer 510_6 may be located to be around (e.g., surround in a plan view) an outer surface (e.g., an outer peripheral or circumferential surface) of a light-emitting element 300 located on a first electrode 210, and may not be located in an area in which the light-emitting element 300 is not located, for example, between the first electrode 210 and a first electrode 210 of another sub-pixel PXn. That is, the first insulating layer 5106 may not be located at a boundary of the adjacent sub-pixels PXn, but may be located to correspond to each sub-pixel PXn.

Further, the first insulating layer 510_6 may be located to cover the first electrode 210. For example, the first insulating layer 510_6 may be formed to be greater than the first electrode 210 in a plan view to cover an upper surface of the first electrode 210, and may be located to expose a portion of a first planarization layer 109. Accordingly, a portion of a second voltage line VL2_6 may be located on the first insulating layer 5106, and another portion thereof may be directly located on the first planarization layer 109. However, the present disclosure is not limited thereto.

In one or more embodiments, the display device 10 may further include an insulating layer located on the second electrode 220.

Figure 23:
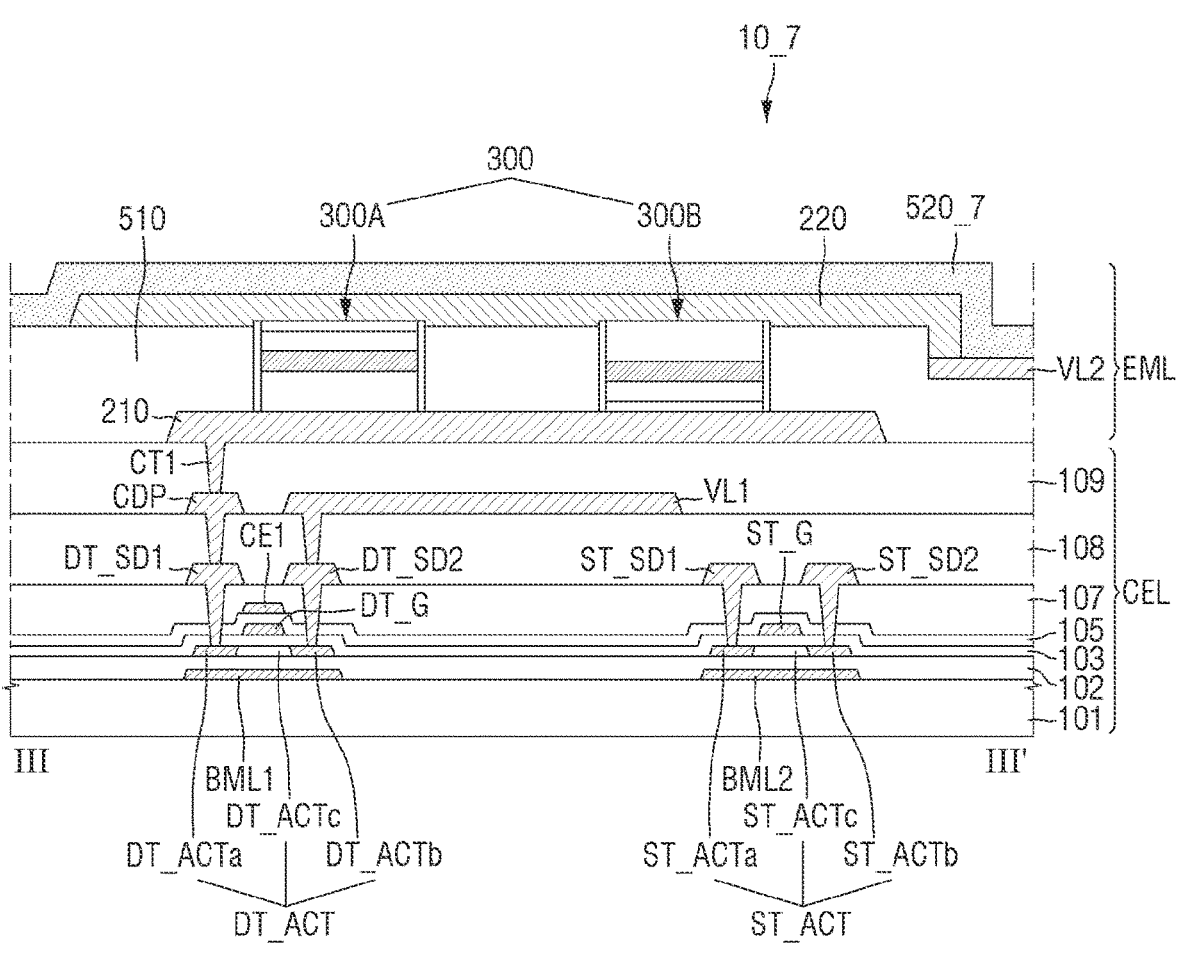
FIG. 23 is a cross-sectional view illustrating a portion of a display device according to one or more embodiments.

FIG. 23 is a cross-sectional view illustrating a portion of a display device according to one or more embodiments.

Referring to FIG. 23, a display device 10_7 according to one or more embodiments may further include a second insulating layer 520_7 located on a second electrode 220. The display device 10_7 of FIG. 23 is different from that of the embodiments corresponding to FIG. 3 in that the second insulating layer 5207 is further located.

The second insulating layer 520_7 may be located to cover members located on a first planarization layer 109. For example, the second insulating layer 520_7 may be located to cover the second electrode 220, a first insulating layer 510, and a second voltage line VL2. The second insulating layer 520_7 may include substantially the same material as the first insulating layer 510, and may serve to protect the members from the outside. That is, the second insulating layer 520_7 may include an inorganic insulating material or an organic insulating material, and may be made of a transparent insulating material so that light emitted from a light-emitting element 300 may be transmitted therethrough. In the drawing, the second insulating layer 520_7 is illustrated as being located directly on the second electrode 220 to cover the first insulating layer 510 and the second voltage line VL2, but the present disclosure is not limited thereto. As described above, when the second electrode 220 is integrated with a second electrode 220 of another sub-pixel PXn and entirely located on the first insulating layer 510 ("220_5" in FIG. 19), the second insulating layer 520_7 may be located to cover only the second electrode 220 and the second voltage line VL2 without being in contact with the first insulating layer 510. Alternatively, when the first insulating layer 510 is located to correspond to each sub-pixel PXn to form an island pattern ("510_6" in FIG. 21), the second insulating layer 520_7 may be located directly on the first planarization layer 109 that is exposed because the first insulating layer 510 is not located there.

The shape of the second insulating layer 520_7 is not particularly limited as along as the second insulating layer 520_7 is located to protect the members located on the first planarization layer 109. For example, the second insulating layer 520_7 may be located over the entire surface of a display area DPA on the first planarization layer 109, and may be located to correspond to each sub-pixel PXn to form an island or linear pattern like the first electrode 210.

Figure 24:
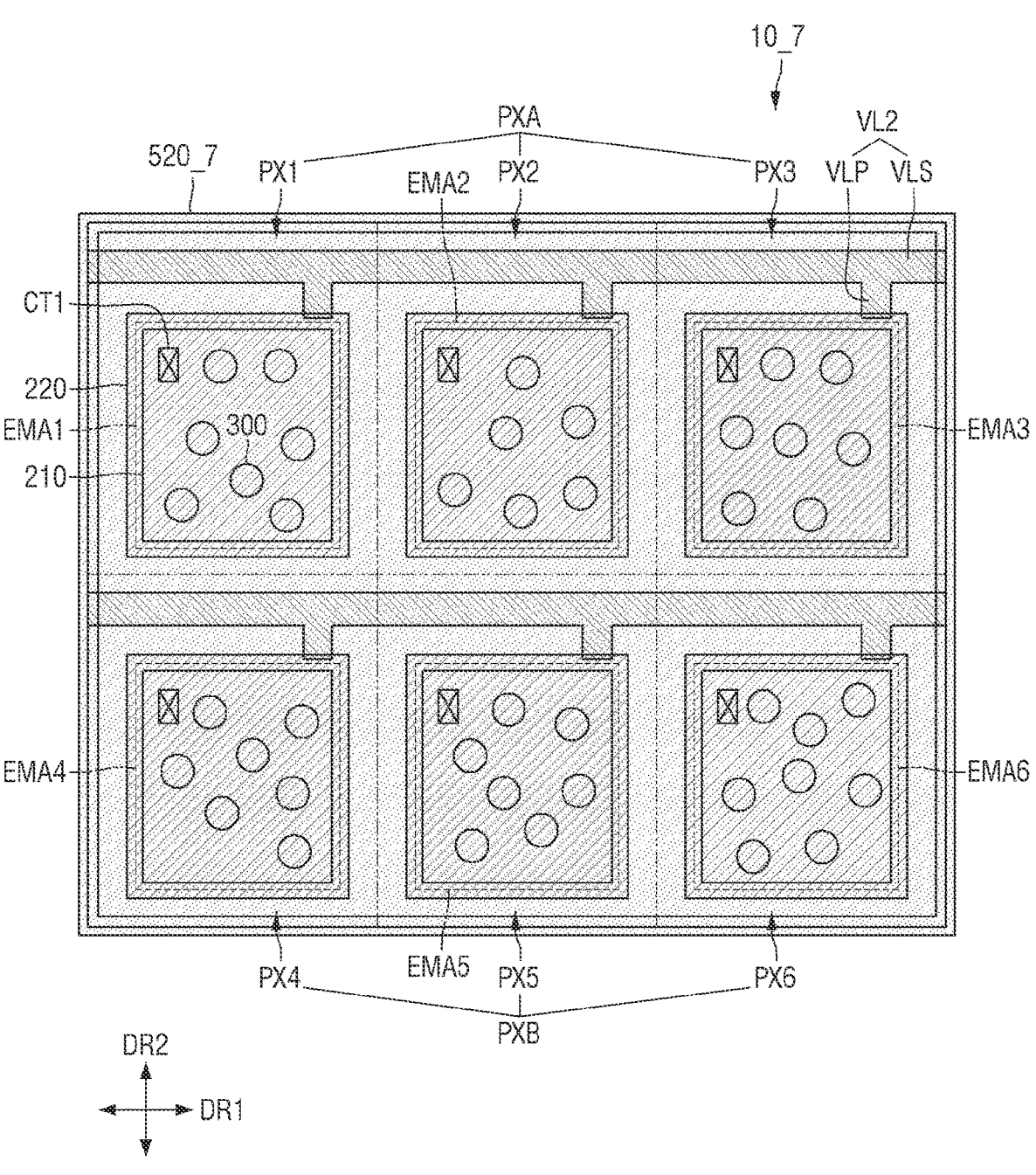
FIGS. 24 and 25 are plan views each illustrating a first pixel and a second pixel of a display device according to one or more embodiments.
Figure 25:
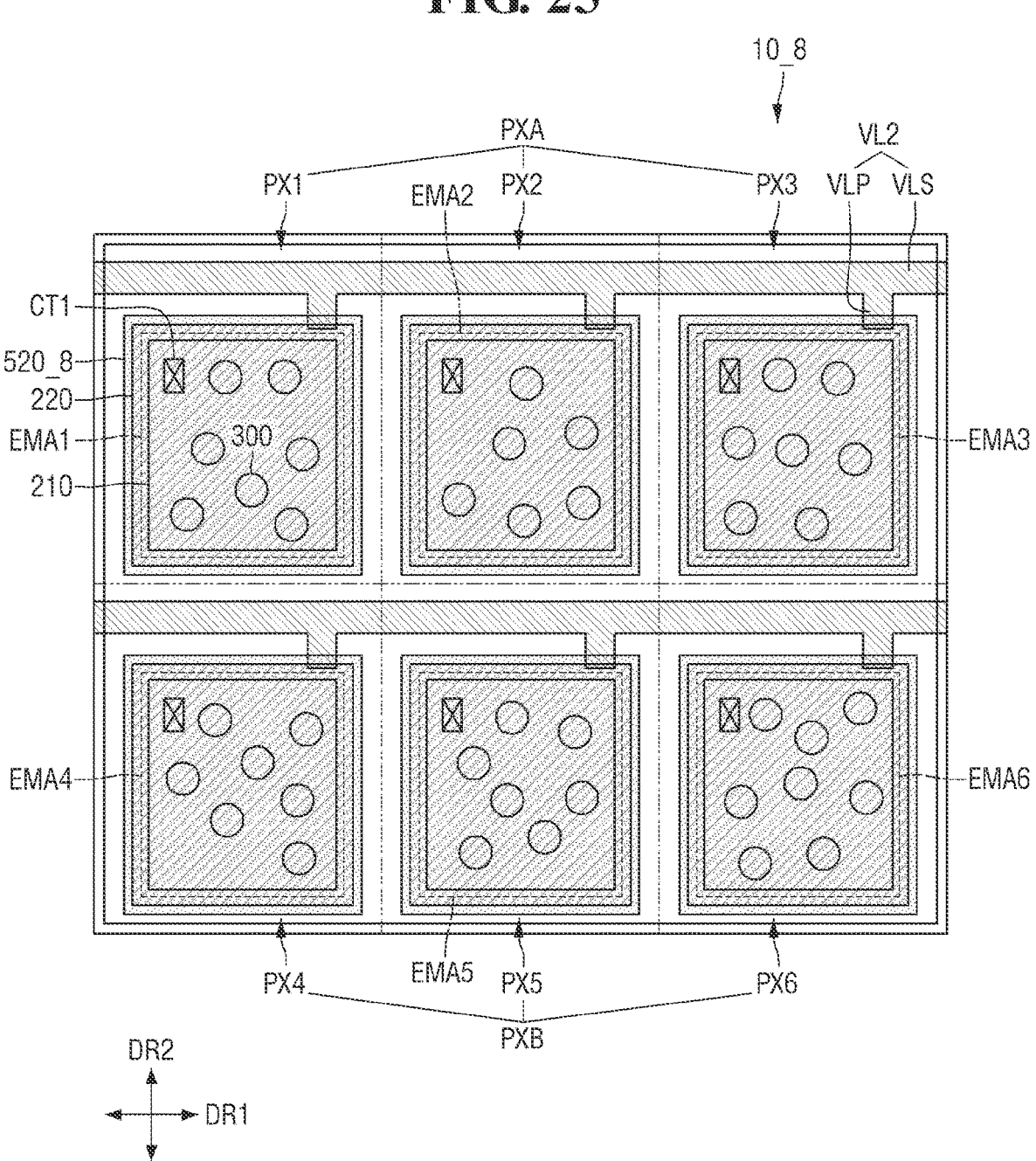

FIGS. 24 and 25 are plan views each illustrating a first pixel and a second pixel of a display device according to one or more embodiments.

Referring to FIG. 24, in the display device 10_7 according to one or more embodiments, the second insulating layer 520_7 may be entirely located over the display area DPA. Alternatively, referring to FIG. 25, in a display device 10_8 according to one or more embodiments, a second insulating layer 520_8 may be located to correspond to each sub-pixel PXn to form an island or linear pattern. The shape of each of the second insulating layers 520_7 and 520_8 of FIGS. 24 and 25 may be substantially the same as the shape of the first insulating layer 510 described above. That is, like in the display device 10_7 of FIG. 24, the second insulating layer 520_7 may be located over a plurality of sub-pixels PXn to cover all of them, or like in the display device 10_8 of FIG. 25, the second insulating layer 520_8 may be located in each sub-pixel PXn to cover only the second electrode 220 located in each sub-pixel PXn. A description thereof is similar to that provided above for the first insulating layer 510, and thus a detailed description thereof will be omitted.

The display device 10 may include the first insulating layer 510 around (e.g., surrounding) the light-emitting element 300 and a second insulating layer 520 located on the second electrode 220. In the light-emitting element 300, a direction in which the plurality of semiconductor layers are sequentially located may be parallel to the direction perpendicular to the upper surface of the first substrate 101, so that light emitted from the light-emitting element 300 may be emitted in the upward direction with respect to the first substrate 101. Here, light generated from the active layer 360 of the light-emitting element 300 may be emitted to both ends and side surfaces of the light-emitting element 300. That is, in some cases, the light emitted from the light-emitting element 300 passes through the first insulating layer 510 or the second insulating layer 520 to be emitted from each sub-pixel PXn. According to one or more embodiments, the display device 10 may further include optical members located on the first insulating layer 510 or the second insulating layer 520, and thus the characteristics or light efficiency of the light emitted from the light-emitting element 300 may be improved.

Figure 26:
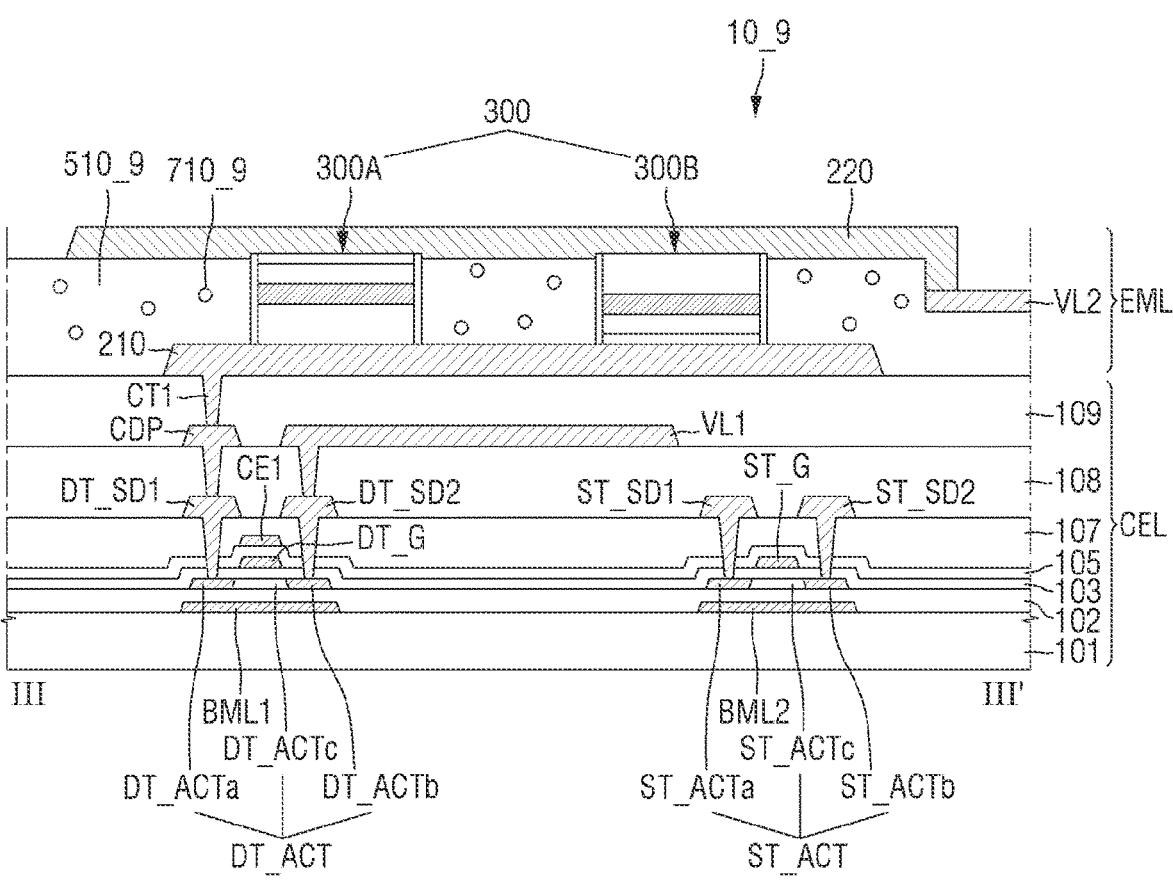
FIGS. 26 and 27 are cross-sectional views each illustrating a portion of a display device according to one or more embodiments.
Figure 27:
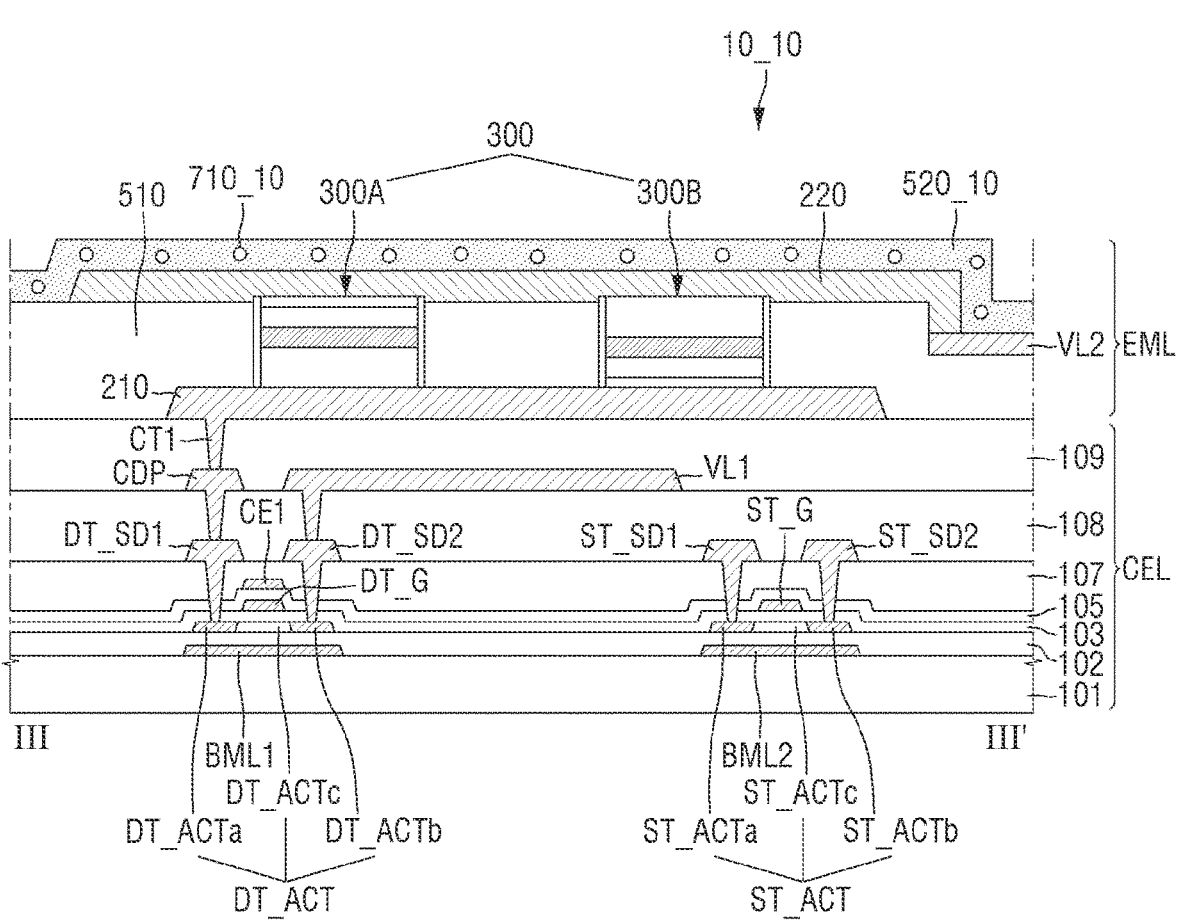

FIGS. 26 and 27 are cross-sectional views each illustrating a portion of a display device according to one or more embodiments.

Referring to FIGS. 26 and 27, display devices 10_9 and 10_10 according to one or more embodiments may further include scatterers 710_9 and 710_10 each located in a first insulating layer 510_9 or a second insulating layer 520_10. In the display device 10_9 of FIG. 26, the scatterer 710_9 is illustrated as being located on the first insulating layer 510_9, and in the display device 10_10 of FIG. 27, the scatterer 710_10 is illustrated as being located on the second insulating layer 520_10. Hereinafter, repeated descriptions will be omitted, the embodiments corresponding to FIG. 26 will be described as a representative.

The display device 10_9 of FIG. 26 may further include the scatterer 710_9 located in the first insulating layer 510_9. The scatterer 710_9 may be included in a dispersed state in the first insulating layer 510_9, and may have a refractive index different from that of the first insulating layer 510_9 and form an optical interface with the first insulating layer 510_9. For example, the scatterer 710_9 may be a light scattering particle. A material of the scatterer 710_9 may not be particularly limited as long as the material may scatter at least a portion of transmitted light, and for example, the scatterer 710_9 may be a metal oxide particle or organic particle. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), and the like. Examples of a material of the organic particle may include an acrylic-based resin, a ure-thane-based resin, and the like. The scatterer 710_9 may scatter light in a random direction irrespective of an incidence direction of incident light without substantially changing a wavelength of light passing through the first insulating layer 510_9.

Accordingly, some of light emitted from a light-emitting element 300 may be incident on the scatterer 710_9 located in the first insulating layer 510_9 to be scattered by the scatterer 710_9. The scatterer 710_9 may scatter the light emitted from the light-emitting element 300 so that the light emitted from the light-emitting element 300 does not travel only in a corresponding direction, and the display device 10_9 may further include the scatterer 710_9 to emit light with uniform density.

In the display device 10_10 of FIG. 27, the scatterer 710_10 may be located in the second insulating layer 520_10. The light emitted from a light-emitting element 300 may be emitted through the second insulating layer 520_10, and the scatterer 71010 may scatter the light incident on the second insulating layer 520_10.

Figure 28:
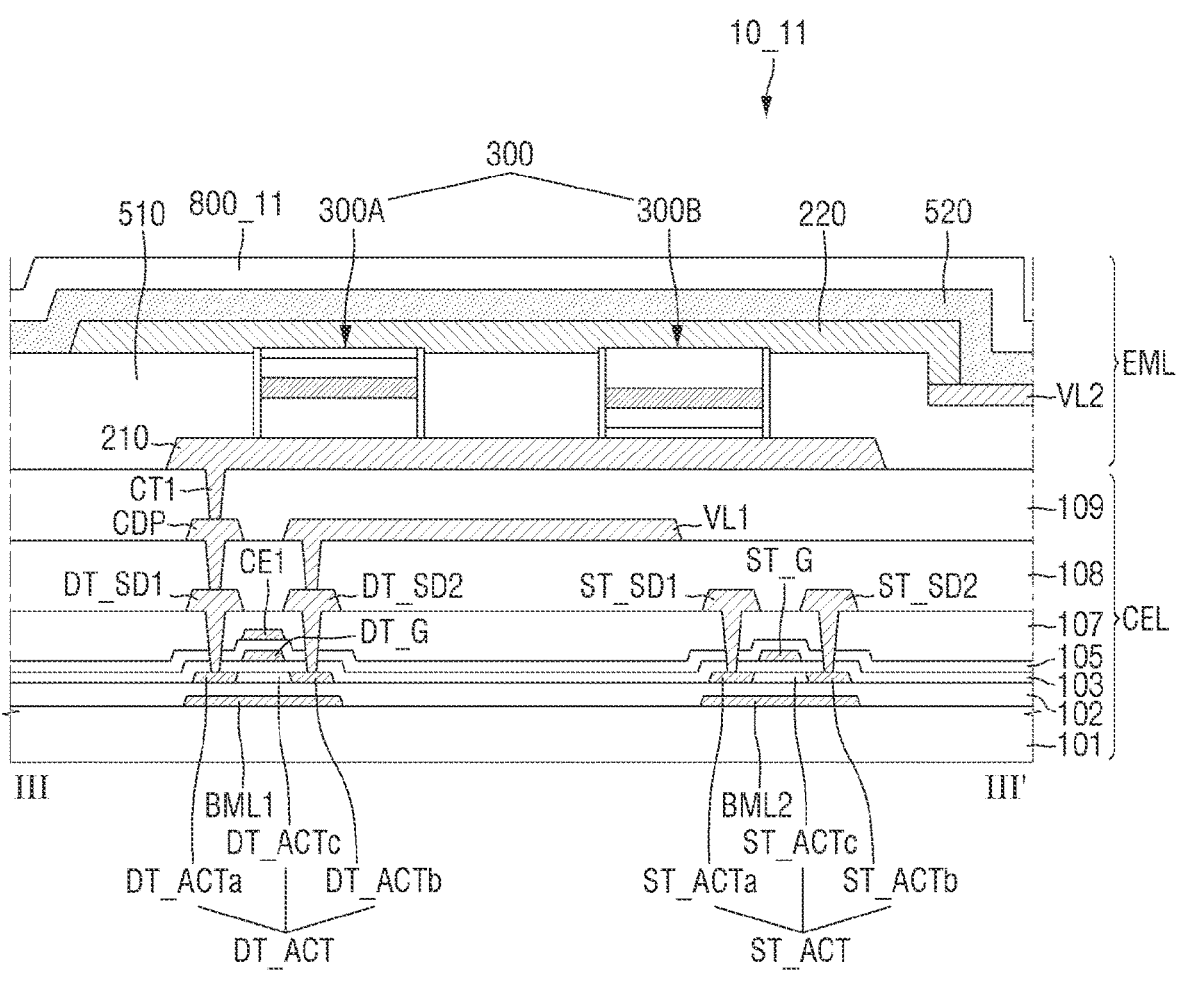
FIG. 28 is a cross-sectional view illustrating a portion of a display device according to one or more embodiments.

FIG. 28 is a cross-sectional view illustrating a portion of a display device according to one or more embodiments.

Referring to FIG. 28, a display device 10_11 according to one or more embodiments may further include a diffusion sheet 800_11 located on a second insulating layer 520. The diffusion sheet 800_11 may serve to diffuse light emitted from a light-emitting element 300. The light generated by an active layer 360 of the light-emitting element 300 may be emitted to both ends of the light-emitting element 300, and may be incident on the diffusion sheet 800_11 through the second insulating layer 520. The diffusion sheet 800_11 may diffuse the incident light in a random direction without directionality, and guide light emitted from the display device 10_11 not to travel only in a corresponding direction.

In one or more embodiments, as described above, the light-emitting element 300 of the display device 10 may emit light of a corresponding wavelength range. Here, the light-emitting elements 300 located in each sub-pixel PXn may emit light having different wavelength ranges, but is not limited thereto, and may emit light having the same wavelength range. The display device 10 according to one or more embodiments includes the light-emitting elements 300, which emit light with the same wavelength range, for each sub-pixel PXn, and may further include a wavelength conversion material configured to convert a wavelength of light emitted from the light-emitting element 300. Accordingly, the display device 10 may display different colors of light for each sub-pixel PXn.

Figure 29:
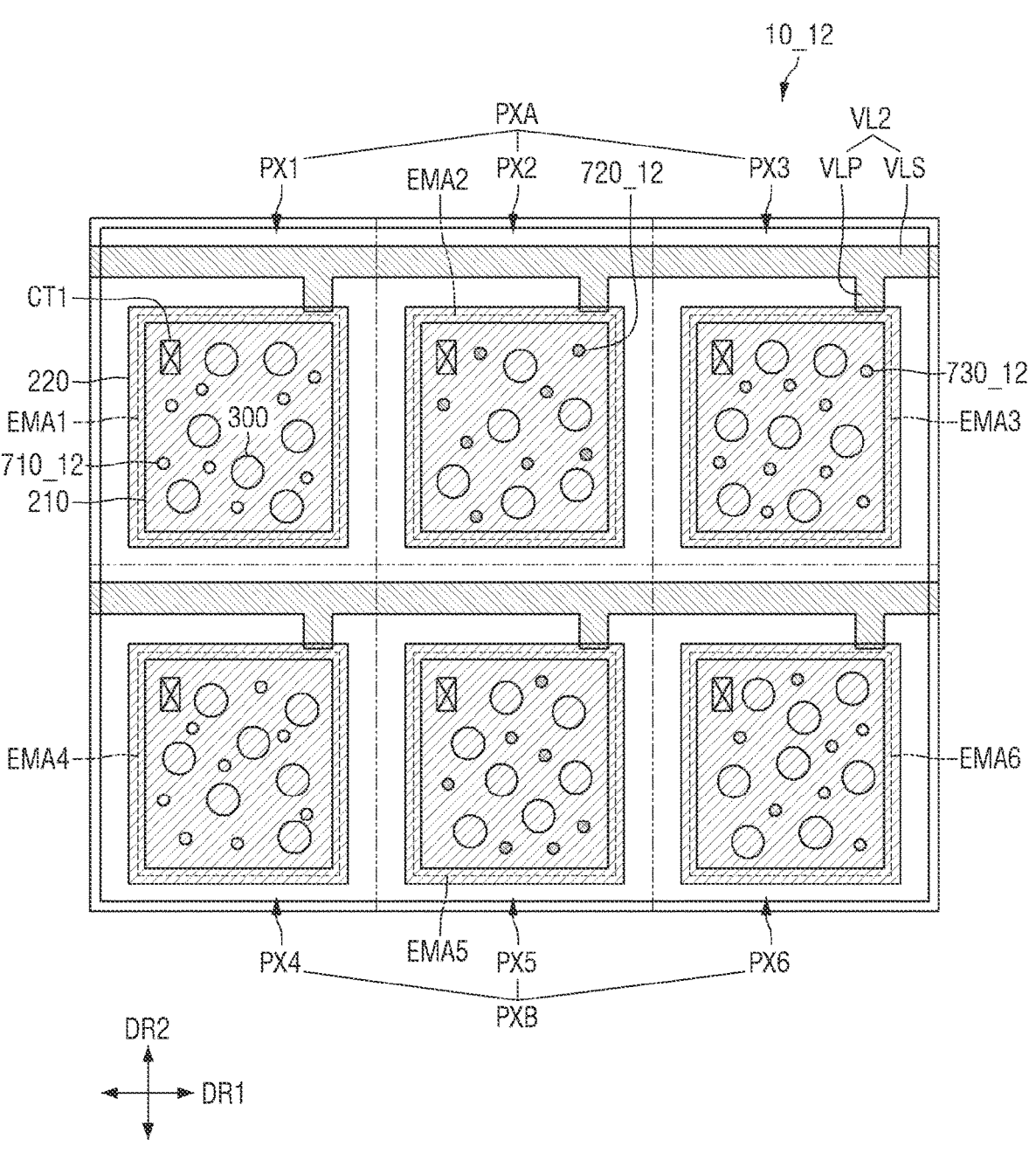
FIG. 29 is a plan view illustrating a first pixel and a second pixel of a display device according to one or more embodiments.

FIG. 29 is a plan view illustrating a first pixel and a second pixel of a display device according to one or more embodiments.

Referring to FIG. 29, a display device 10_12 according to one or more embodiments may further include wavelength conversion materials 720_12 and 730_12 in addition to a scatterer 710_12. The wavelength conversion materials 720_12 and 730_12 may include a first wavelength conversion material 720_12 located in a second sub-pixel PX2 and a fifth sub-pixel PX5, and a second wavelength conversion material 730_12 located in a third sub-pixel PX3 and a sixth sub-pixel PX6.

The scatterer 710_12 may be located in each of a first sub-pixel PX1 and a fourth sub-pixel PX4. As described above, the scatterer 710_12 and the wavelength conversion materials 720_12 and 730_12 may each be located in a first insulating layer 510 or a second insulating layer 520. For example, when the first insulating layer 510 and the second insulating layer 520 are each located to correspond to the sub-pixel PXn to form an island or linear pattern, the scatterer 710_12 or the wavelength conversion materials 720_12 and 730_12 may be selectively located in the corresponding sub-pixel PXn. The descriptions of the layers in which the scatterer 710_12 and the wavelength conversion materials 720_12 and 730_12 are located are the same as those described above, and thus, hereinafter, the wavelength conversion materials 720_12 and 730_12 will be described in detail.

The wavelength conversion materials 720_12 and 730_12 may convert or shift incident light having a corresponding wavelength range into light having a different wavelength range. For example, the first wavelength conversion material 720_12 may convert light of a first color emitted from a light-emitting element 300 into light of a second color, and the second wavelength conversion material 730_12 may convert the light of the first color into light of a third color. Even when each of the sub-pixels PXn of the display device 10_12 includes only the light-emitting element 300 emitting the light of the first color, the display device 10_12 may further include the scatterer 710_12 and the wavelength conversion materials 720_12 and 730_12 so that each sub-pixel PXn may emit the light of the second color and the third color.

In one or more embodiments, the wavelength conversion materials 720_12 and 730_12 may each have a spherical shape or an elliptical shape, but the shape thereof is not particularly limited. The wavelength conversion materials 720_12 and 73012 may be quantum dots, quantum rods, phosphor substances, or the like, and as an example, the wavelength conversion materials 720_12 and 73012 may be quantum dots that emit light with a corresponding wavelength range when electrons transition from a conduction band to a valence band.

The quantum dot may be a semiconductor nanocrystalline material. The quantum dot may have a corresponding band gap according to the composition and size thereof. Thus, the quantum dot may absorb light and then emit light having an intrinsic wavelength. Examples of the semiconductor nanocrystals of the quantum dot may include Group IV nanocrystals, Group II-VI compound nanocrystals, Group III-V compound nanocrystals, Group IV-VI compound nanocrystals, and a combination thereof.

The Group II-VI compounds may be selected from the group consisting of two-element compounds selected from the group consisting of CdSe, CdTe, ZnS, ZnSe, ZnTe, ZnO, HgS, HgSe, HgTe, MgSe, MgS, and mixtures thereof; three-element compounds selected from the group consisting of InZnP, AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof; and four-element compounds selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof.

The Group III-V compounds may be selected from the group consisting of two-element compounds selected from the group consisting of GaN, GaP, GaAs, GaSb, AlN, AlP, AlAs, AlSb, InN, InP, InAs, InSb, and mixtures thereof; three-element compounds selected from the group consisting of GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP, and mixtures thereof; and four-element compounds selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof.

The Group IV-VI compounds may be selected from the group consisting of two-element compounds selected from the group consisting of SnS, SnSe, SnTe, PbS, PbSe, PbTe, and mixtures thereof; three-element compounds selected from the group consisting of SnSeS, SnSeTe, SnSTe, PbSeS, PbSeTe, PbSTe, SnPbS, SnPbSe, SnPbTe, and mixtures thereof; and four-element compounds selected from the group consisting of SnPbSSe, SnPbSeTe, SnPbSTe, and mixtures thereof. The Group IV elements may be selected from the group consisting of Si, Ge, and mixtures thereof. The Group IV compounds may be two-element compounds selected from the group consisting of SiC, SiGe, and mixtures thereof.

Here, the two-element compounds, the three-element compounds, or the four-element compounds may be present at a uniform concentration in a particle or may be present in a partially different concentration distribution in the same particle. In addition, the two-element compounds, the three-element compounds, or the four-element compounds may have a core-shell structure in which one quantum dot surrounds another quantum dot. An interface between the core and the shell may have a concentration gradient in which the concentration of elements present in the shell decreases toward the center.

In one or more embodiments, the quantum dot may have a core-shell structure that includes a core including the nanocrystals described above and a shell surrounding the core. The shell of the quantum dot may serve as a protective layer for maintaining semiconductor characteristics by reducing or preventing chemical modification of the core and serve as a charging layer for giving electrophoretic characteristics to the quantum dot. The shell may be a single layer or multi-layer. An interface between the core and the shell may have a concentration gradient in which the concentration of elements present in the shell decreases toward the center. Examples of the shell of the quantum dot may include metal or non-metal oxides, semiconductor compounds, or combinations thereof.

For example, examples of the metal or non-metal oxides may include binary compounds such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, and $NiO$, or ternary compounds such as $MgAl_2O_4$, $CoFe_2O_4$, $NiFe_2O_4$, and $CoMn_2O_4$, but the present disclosure is not limited thereto.

Further, examples of the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and the like, but the present disclosure is not limited thereto.

When the wavelength conversion materials 720_12 and 730_12 include a quantum dot, a diameter of each of the wavelength conversion materials 720_12 and 730_12 may range from several nanometers (nm) to tens of nanometers (nm). As an example, the diameter of each of the wavelength conversion materials 720_12 and 730_12 may range from about 1% to about 10% of a diameter of the light-emitting element 300. However, the present disclosure is not limited thereto.

The display device 10_12 according to one or more embodiments may include the light-emitting element 300 emitting light of the same color, and the wavelength conversion materials 720_12 and 730_12 configured to convert or shift the color of the light emitted from the light-emitting element 300. The wavelength conversion materials 720_12 and 730_12 may be included in the first insulating layer 510 or the second insulating layer 520, and different types of wavelength conversion materials 720_12 and 730_12, or scatterer 710_12 may be located in different sub-pixels PXn. Each sub-pixel PXn of the display device 10_12 may emit light of different colors even though the same type of the light-emitting element 300 is included.

In one or more embodiments, the light-emitting element 300 may include the active layer 360 having a different composition and a larger number of semiconductor layers to emit light of a different color other than the light of the first color, which is blue. In this case, in the display device 10, different types of light-emitting elements 300 may be located in each sub-pixel PXn, and only the scatterer 710 may be located in the first insulating layer 510 or the second insulating layer 520.

Figure 30:
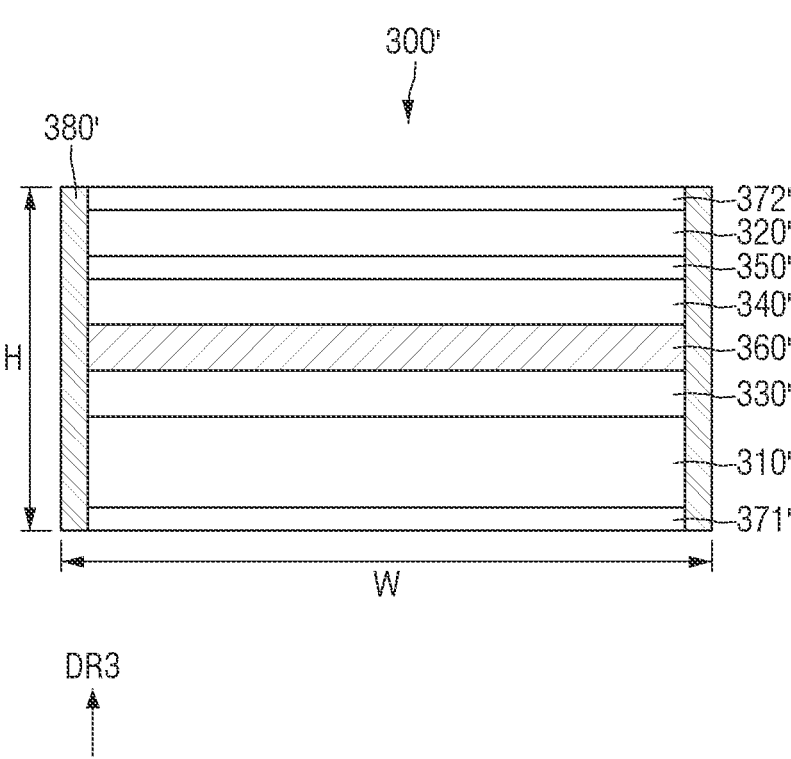
FIG. 30 is a cross-sectional view of a light-emitting element according to one or more embodiments.

FIG. 30 is a cross-sectional view of a light-emitting element according to one or more embodiments.

Referring to FIG. 30, a light-emitting element 300' according to one or more embodiments may further include a third semiconductor layer 330' located between a first semiconductor layer 310' and an active layer 360', and a fourth semiconductor layer 340' and a fifth semiconductor layer 350' that are located between the active layer 360' and a second semiconductor layer 320'. The light-emitting element 300' of FIG. 30 is different from that of the embodiments corresponding to FIG. 4 in that a plurality of semiconductor layers 330', 340', and 350' are further included, and the active layer 360' includes a different element. In addition, the arrangement and structure of a first electrode layer 371', a second electrode layer 372', and an insulating film 380' may be substantially similar to those of FIG. 4. The second electrode layer 372' is disposed on the second semiconductor layer 320', and the first electrode layer 371' is disposed under the first semiconductor layer 310'. Hereinafter, repeated descriptions will be omitted, and descriptions will be provided based on differences from the above-described contents.

In the light-emitting element 300 of FIG. 4 the active layer 360 may include nitrogen (N) to emit blue light or green light. On the other hand, the light-emitting element 300' of FIG. 30 may be a semiconductor in which each of the active layer 360' and other semiconductor layers includes at least phosphorus (P). That is, the light-emitting element 300' according to one or more embodiments may emit red light having a central wavelength range ranging from about 620 nm to about 750 nm. However, the central wavelength range of the red light is not limited to the above-described range, and it should be understood that the central wavelength range includes all wavelength ranges that can be recognized as a red color in the art.

In one or more embodiments, when the first semiconductor layer 310' is an n-type semiconductor layer and the light-emitting element 300' emits red light, the first semiconductor layer 310' may include a semiconductor material having a chemical formula of InxAlyGa1−x−yP (0<=x<=1, 0<=y<=1, and 0<=x+y<=1). For example, the first semiconductor layer 310' may include at least one selected from among InAlGaP, GaP, AlGaP, InGaP, AlP, and InP that are n-type doped. The first semiconductor layer 310' may be doped with a first conductive dopant, and as an example, the first conductive dopant may include Si, Ge, Sn, or the like. In one or more embodiments, the first semiconductor layer 310' may be n-AlGaInP doped with n-type Si. A thickness of the first semiconductor layer 310' may range from about 0.1 μm to about 0.5 μm, but the present disclosure is not limited thereto.

When the second semiconductor layer 320' is a p-type semiconductor layer and the light-emitting element 300' emits red light, the second semiconductor layer 320' may include a semiconductor material having a chemical formula of InxAlyGa1−x−yP (0<=x<=1, 0<=y<=1, and 0<=x+y<=1). For example, the second semiconductor layer 320' may include at least one selected from among InAlGaP, GaP, AlGaNP, InGaP, AlP, and InP that are p-type doped. The second semiconductor layer 320' may be doped with a second conductive dopant, and as an example, the second conductive dopant may include Mg, Zn, Ca, Se, Ba, or the like. In one or more embodiments, the second semiconductor layer 320' may be p-GaN doped with p-type Mg. A thickness of the second semiconductor layer 320' may range from about 0.08 μm to about 0.25 μm, but the present disclosure is not limited thereto.

The active layer 360' may be located between the first semiconductor layer 310' and the second semiconductor layer 320'. Like the active layer 360 of FIG. 4, the active layer 360' of FIG. 30 may also include a material having a single or multiple quantum well structure to emit light in a corresponding wavelength range. As an example, when the active layer 360' emits light in a red wavelength range, the active layer 360' may include a material such as AlGaP or AlInGaP. In particular, when the active layer 360' has a multiple quantum well structure in which quantum layers and well layers are alternately stacked, the quantum layer may contain a material such as AlGaP or AlInGaP, and the well layer may contain a material such as GaP or AlInP. In one or more embodiments, the active layer 360' may include AlGaInP as the quantum layer and AlInP as the well layer so that the active layer 360' emits red light having a central wavelength range of about 620 nm to about 750 nm.

The light-emitting element 300' of FIG. 30 may include a clad layer located adjacent to the active layer 360'. As shown in the drawing, the third semiconductor layer 330' and the fourth semiconductor layer 340' located below and above the active layer 360' and between the first semiconductor layer 310' and the second semiconductor layer 320' may be clad layers.

The third semiconductor layer 330' may be located between the first semiconductor layer 310' and the active layer 360'. The third semiconductor layer 330' may be an n-type semiconductor like the first semiconductor layer 310', and as an example, the third semiconductor layer 330' may include a semiconductor material having a chemical formula of InxAlyGa1−x−yP (0<=x<=1, 0<=y<=1, and 0<=x+y<=1). In one or more embodiments, the first semiconductor layer 310' may be n-AlGaInP, and the third semiconductor layer 330' may be n-AlInP. However, the present disclosure is not limited thereto.

The fourth semiconductor layer 340' may be located between the active layer 360' and the second semiconductor layer 320'. The fourth semiconductor layer 340' may be an n-type semiconductor like the second semiconductor layer 320', and as an example, the fourth semiconductor layer 340' may include a semiconductor material having a chemical formula of InxAlyGa1−x−yP (0<=x<=1, 0<=y<=1, and 0<=x+y<=1). In one or more embodiments, the second semiconductor layer 320' may be p-GaP, and the fourth semiconductor layer 340' may be p-AlInP.

The fifth semiconductor layer 350' may be located between the fourth semiconductor layer 340' and the second semiconductor layer 320'. The fifth semiconductor layer 350' may include a p-type-doped semiconductor like the second semiconductor layer 320' and the fourth semiconductor layer 340'. In one or more embodiments, the fifth semiconductor layer 350' may serve to reduce a difference in a lattice constant between the fourth semiconductor layer 340' and the second semiconductor layer 320'. That is, the fifth semiconductor layer 350' may be a TSBR layer. As an example, the fifth semiconductor layer 350' may include p-GaInP, p-AlInP, p-AlGaInP, or the like, but the present disclosure is not limited thereto.

The first electrode layer 371' and a second electrode layer 372' may be located on one surfaces of the first semiconductor layer 310' and the second semiconductor layer 320', respectively. The first electrode layer 371' may be located on a lower surface of the first semiconductor layer 310', and the second electrode layer 372' may be located on an upper surface of the second semiconductor layer 320'. The light-emitting element 300' of FIG. 30 may also be manufactured in substantially the same manner as the light-emitting element 300 of FIG. 4.

Figure 31:
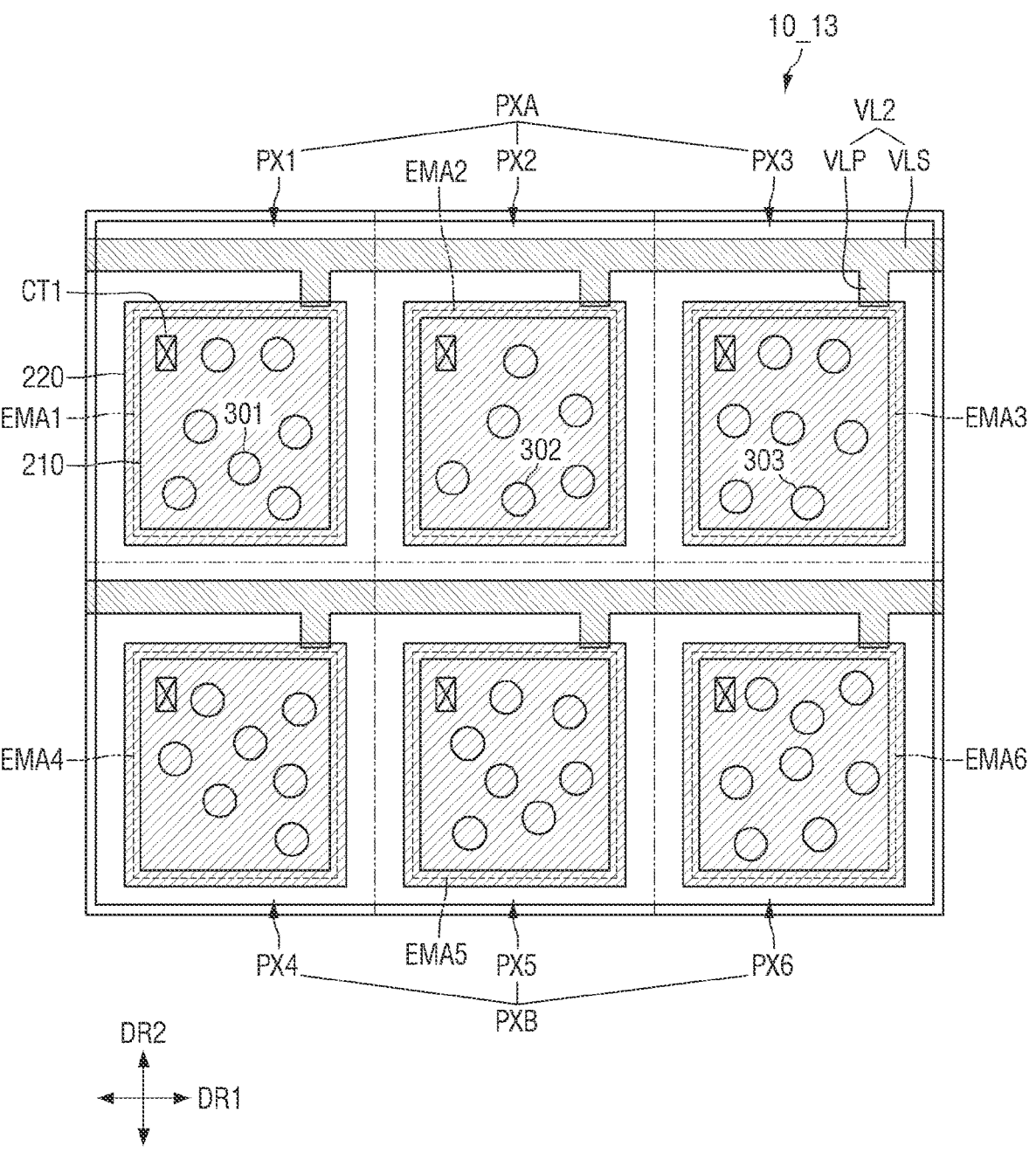
FIG. 31 is a plan view illustrating a first pixel and a second pixel of a display device according to one or more embodiments.

FIG. 31 is a plan view illustrating a first pixel and a second pixel of a display device according to one or more embodiments.

Referring to FIG. 31, a display device 10_13 according to one or more embodiments may include different types of light-emitting elements 300, for example, a first light-emitting element 301, a second light-emitting element 302, and a third light-emitting element 303. The first light-emitting element 301 may be located on a first sub-pixel PX1 and a fourth sub-pixel PX4, the second light-emitting element 302 may be located on a second sub-pixel PX2 and a fifth sub-pixel PX5, and the third light-emitting element 303 may be located on a third sub-pixel PX3 and a sixth sub-pixel PX6. The first light-emitting element 301 and the second light-emitting element 302 may have the same structure as the light-emitting element 300 of FIG. 4, and emit light of a first color and a second color, respectively. The third light-emitting element 303 may have the same structure as the light-emitting element 300' of FIG. 30 and emit light of a third color. As an example, the display device 10_13 may include the first light-emitting element 301 that emits the light of the first color that is blue, the second light-emitting element 302 that emits the light of the second color that is green, and the third light-emitting element 303 that emits the light of the third color that is red.

As described above, the light-emitting element 300 may generate light of different colors according to the composition of the active layer 360, and in some cases, may include a larger number of semiconductor layers. In the display device 10_13, different types of light-emitting elements 301, 302, and 303 may be located in each sub-pixel PXn, and each of the light-emitting elements 301, 302, and 303 may emit light of different colors. In one or more embodiments, even when a wavelength conversion material is not located, the light-emitting elements 301, 302, and 303 may each emit light of different colors, and the display device 10_13 may further include a scatterer to emit light with uniform density for each sub-pixel PXn.

Figure 32:
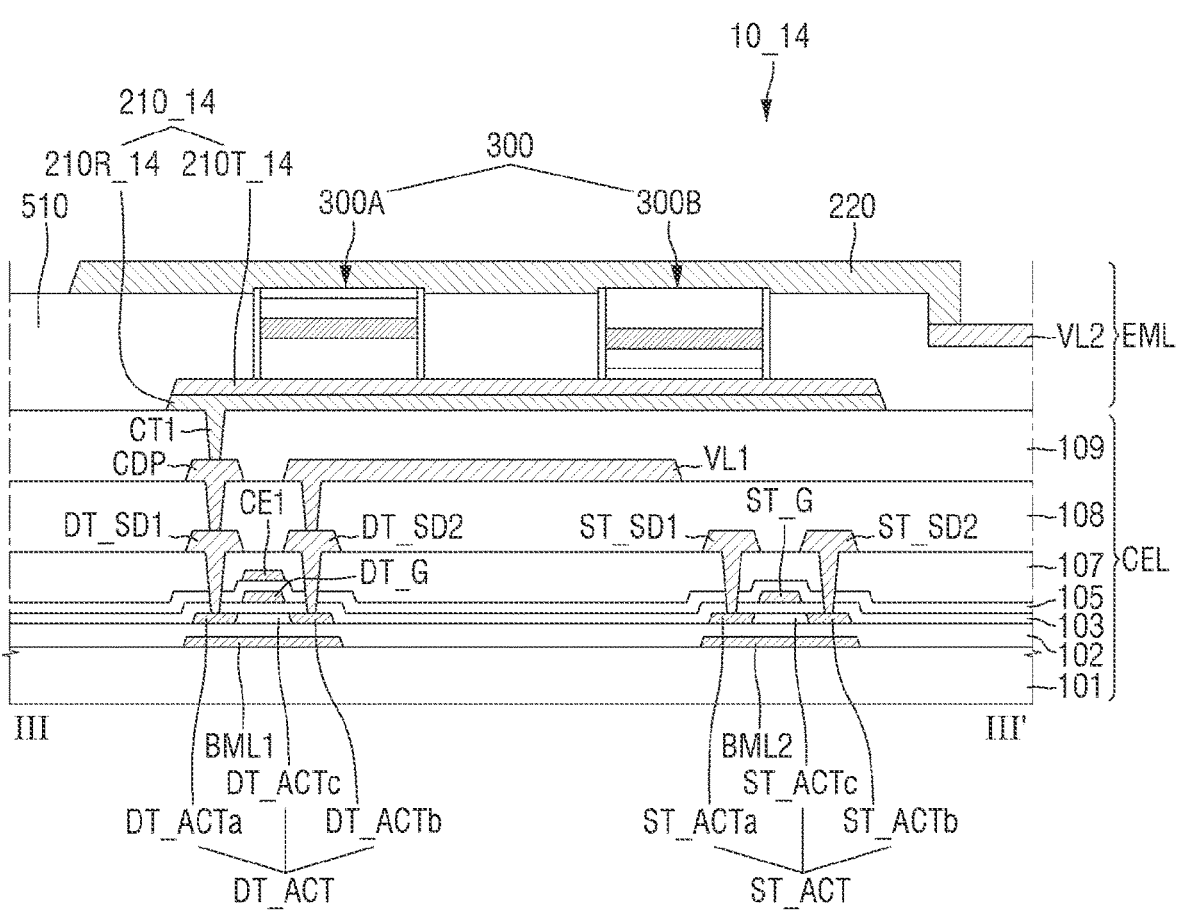
FIG. 32 is a cross-sectional view illustrating a portion of a display device according to one or more embodiments.

FIG. 32 is a cross-sectional view illustrating a portion of a display device according to one or more embodiments.

Referring to FIG. 32, in a display device 10_14 according to one or more embodiments, a first electrode 210_14 may include a plurality of layers. The first electrode 210_14 may include a layer including a transparent material and a layer including a material having a high reflectance, so that light emitted from a light-emitting element 300 may be reflected in an upward direction with respect to a first substrate 101. The display device 10_14 of FIG. 32 is different from that of the embodiments corresponding to FIG. 3 in that the first electrode 210_14 includes a plurality of layers. Hereinafter, repeated descriptions will be omitted, and descriptions will be provided based on differences from the above-described contents.

In the display device 10_14 of FIG. 32, the first electrode 210_14 may include a first electrode base layer 210R_14 and a first electrode upper layer 210T_14. The first electrode base layer 210R_14 and the first electrode upper layer 210T_14 may each include a conductive material to constitute one first electrode 210_14. However, the first electrode base layer 210R_14 may include a conductive material having a high reflectance, and the first electrode upper layer 210T_14 may include a transparent conductive material. Of the light emitted from the light-emitting element 300, the light traveling toward the first electrode 210_14 may pass through the transparent first electrode upper layer 210T_14 to travel to the first electrode base layer 210R_14. The first electrode base layer 210R_14 may reflect the incident light in the upward direction with respect to the first substrate 101.

As described above, the first electrode 210 may include a conductive material having a high reflectance, and in the display device 10_14 according to one or more embodiments, the first electrode 210_14 may include a plurality of layers, and at least one of the layers may include a conductive material having a high reflectance. In the display device 10, the light-emitting element 300 may be located such that a direction in which the plurality of semiconductor layers are stacked is perpendicular to an upper surface of the first substrate 101, and light emitted from the light-emitting element 300 may be emitted to both ends of the light-emitting element 300. Of the light, the light traveling in the upward direction with respect to the first substrate 101 may be emitted to the outside through the second electrode 220. On the other hand, the light traveling toward the first electrode 210_14 may be reflected by the first electrode base layer 210R_14 to travel in the upward direction with respect to the first substrate 101. Accordingly, the display device 10_14 includes the first electrode 210_14 composed of the first electrode base layer 210R_14 and the first electrode upper layer 210T_14, so that light efficiency of each sub-pixel PXn may be improved.

In one or more embodiments, in the display devices 10 described above, the light-emitting elements 300 may be located in a random arrangement on the first electrode 210. However, the present disclosure is not limited thereto, and in one or more embodiments, in the display device 10, the light-emitting elements 300 on the first electrode 210 may be located by being arranged or aligned along a corresponding direction.

Figure 33:
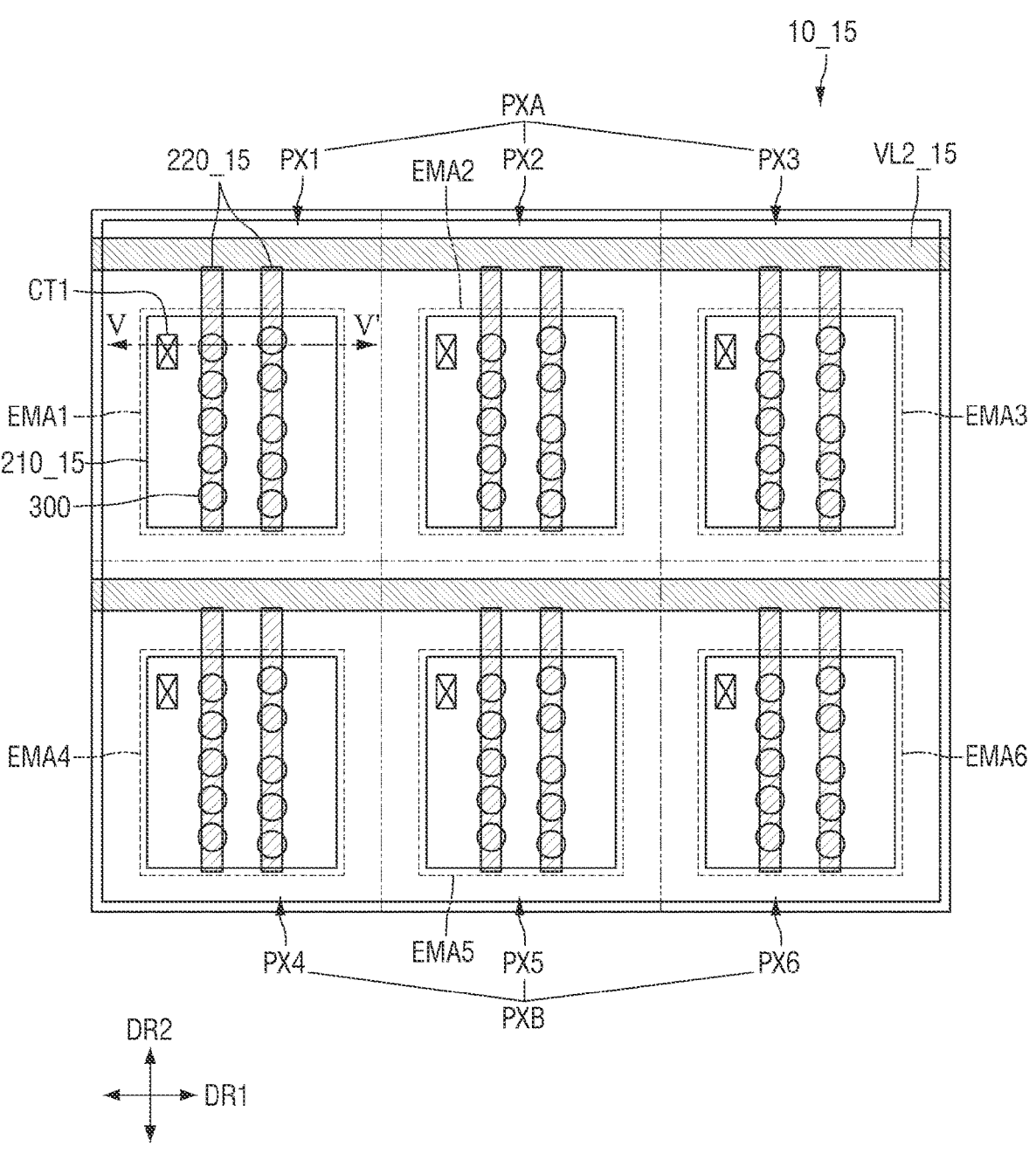
FIG. 33 is a plan view illustrating a first pixel and a second pixel of a display device according to one or more embodiments.
Figure 34:
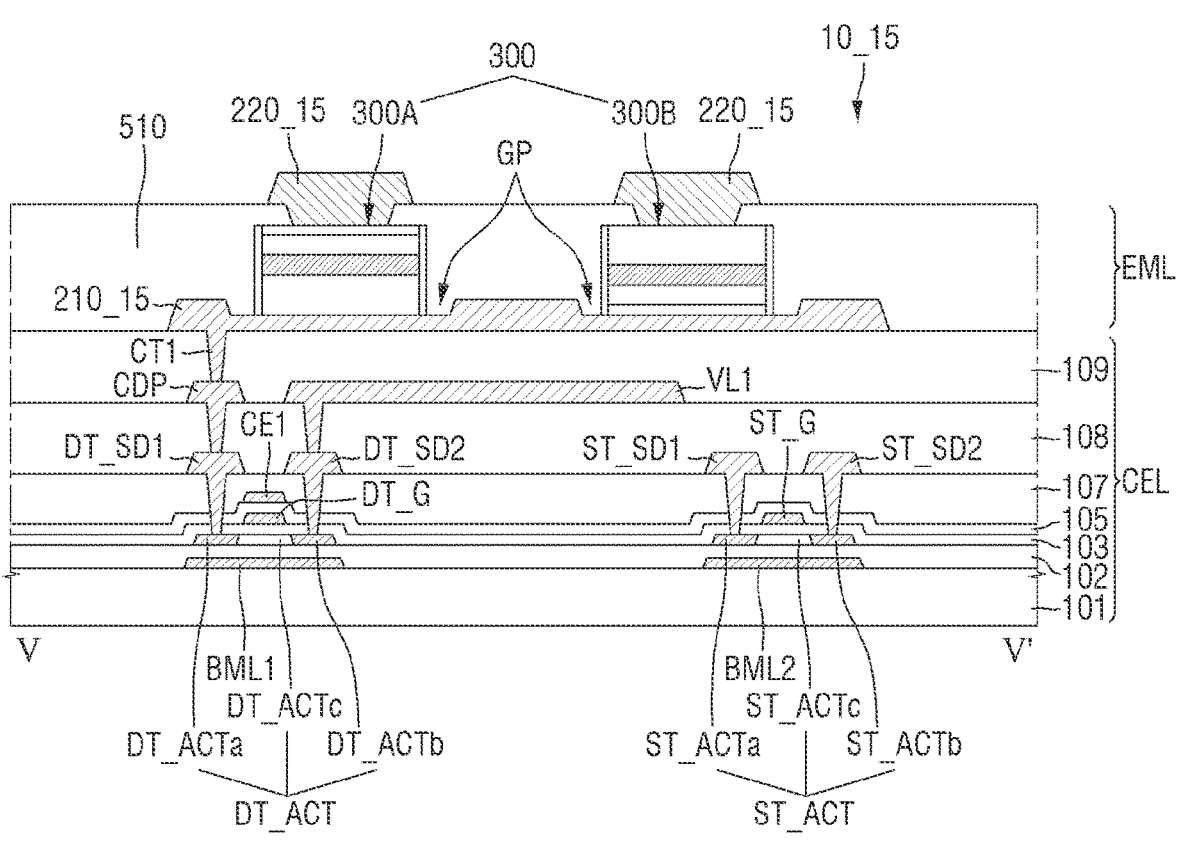
FIG. 34 is a cross-sectional view taken along the line V-V' of FIG. 33.

FIG. 33 is a plan view illustrating a first pixel and a second pixel of a display device according to one or more embodiments. FIG. 34 is a cross-sectional view taken along the line V-V' of FIG. 33.

Referring to FIGS. 33 and 34, in a display device 10_15 according to one or more embodiments, a plurality of light-emitting elements 300 may be arranged in one direction. A first electrode 210_15 of the display device 10_15 may include a groove portion GP formed to extend in one direction and formed by partially recessing an upper surface thereof, and the light-emitting elements 300 may be located in the groove portion GP of the first electrode 210_15. Unlike the display device 10 of FIG. 2, a second electrode 220_15 has a shape extending along a direction in which the light-emitting elements 300 are arranged, and may be located on the light-emitting elements 300. That is, in the display device 10_15 according to one or more embodiments, the first electrode 210_15 may include the groove portion GP, and the arrangement of the light-emitting elements 300 and the shape of the second electrode 220_15 may vary depending on the shape of the groove portion GP. The display device 10_15 of FIGS. 33 and 34 is different from that of the embodiments corresponding to FIGS. 2 and 3 in that the shape of each of the first electrode 210_15 and the second electrode 220_15 and the arrangement of the light-emitting elements 300 are different. Hereinafter, repeated descriptions will be omitted, and descriptions will be provided based on differences from the above-described contents.

The first electrode 210_15 may include the groove portion GP formed by partially recessing the upper surface thereof, and the groove portion GP may be formed to extend in one direction. For example, the groove portion GP may be formed to extend in the second direction DR2 on the first electrode 210_15. However, the present disclosure is not limited thereto, and the groove portion GP may extend in a direction different from the second direction DR2, for example, in the first direction DR1 or in an inclined direction with respect to the groove portion GP. In the drawing, the groove portion GP of the first electrode 210_15 is illustrated as extending in the second direction DR2 and being formed in two columns, but the present disclosure is not limited thereto. The groove portion GP of the first electrode 210_15 may be formed in a larger number or in a larger number of columns.

As the first electrode 210_15 includes the groove portion GP, the light-emitting elements 300 may be located on the groove portion GP of the first electrode 210_15. The groove portion GP may have a small height by partially recessing the upper surface of the first electrode 210_15, and when the light-emitting elements 300 are dispersed and precipitated in ink, the light-emitting elements 300 may be located in the groove portion GP formed in the first electrode 210_15. In one or more embodiments, when the ink in which light-emitting element 300 are dispersed is sprayed onto the first electrode 210_15, and then a physical force is applied to the ink or an electric field is formed, the light-emitting elements 300 may be located at suitable locations (e.g., a set or predetermined locations) of the first electrode 210_15 while changing the locations. Because the groove portion GP formed on the first electrode 210_15 has a height lower than the upper surface of the first electrode 210_15 and forms a stepped portion, the light-emitting elements 300 may be precipitated or located in the groove portion GP by a force applied from the outside. That is, the groove portion GP of the first electrode 210_15 may guide an area in which the light-emitting elements 300 are located, and thus the plurality of light-emitting elements 300 may be arranged in one direction according to the shape of the groove portion GP.

A first insulating layer 510 may be located on the first electrode 210_15 and a first planarization layer 109 to be around (e.g., to surround) an outer surface (e.g., an outer peripheral or circumferential surface) of the light-emitting element 300. However, unlike the display device 10 of FIG. 3, a thickness of the first insulating layer 510 may be greater than the sum of a height of the light-emitting element 300 and a thickness of the first electrode 210_15. That is, the first insulating layer 510 may be located to be around (e.g., to surround) and cover the outer surface (e.g., the outer peripheral or circumferential surface) of the light-emitting element 300. However, a contact hole passing through the first insulating layer 510 and exposing a portion of the upper surface of the light-emitting element 300 may be formed in the first insulating layer 510, and the second electrode 220_15 may be in contact with the light-emitting element 300 through the contact hole. However, the present disclosure is not limited thereto. In one or more embodiments, like in the display device 10 of FIG. 3, the first insulating layer 510 may have a thickness less than the sum of the height of the light-emitting element 300 and the thickness of the first electrode 210_15, and one end surface of the light-emitting element 300 may be exposed. In addition, the first insulating layer 510 may be formed as a single layer on the first planarization layer 109 to cover the plurality of sub-pixels PXn, and, in some cases, the first insulating layer 510 may correspond to each sub-pixel PXn to form an island or linear pattern. A description thereof may be the same as described above.

The second electrode 220_15 may be located on the first insulating layer 510 and the light-emitting elements 300, and may extend in one direction along a direction in which the light-emitting elements 300 are arranged. For example, the second electrode 220_15 may have a shape extending in the second direction DR2 according to the shape of the groove portion GP of the first electrode 210_15. As shown in the drawing, the second electrode 220_15 may be located in each sub-pixel PXn, and may be located in two columns with a shape extending in the second direction DR2 corresponding to locations in which the light-emitting elements 300 are located. That is, the second electrode 220_15 may extend in the second direction DR2 and may be located to overlap the groove portion GP of the first electrode 210_15. However, the present disclosure is not limited thereto. The second electrode 220_15 may have a shape extending in a different direction depending on the arrangement of the light-emitting elements 300 or the shape of the groove portion GP of the first electrode 210_15, or may be located in more columns. In addition, as described above, the second electrode 220_15 is not necessarily located in each sub-pixel PXn, and the second electrodes 220_15 located in each sub-pixel PXn may be integrated so that one second electrode 220_15 may also be located on the other sub-pixels PXn.

The second electrode 220_15 may be located substantially on the first insulating layer 510 and may be located to correspond to the locations in which the light-emitting elements 300 are located. For example, the second electrode 220_15 may be located in an area overlapping the light-emitting element 300 on the first insulating layer 510. The second electrode 220_15 may be in contact with the light-emitting element 300 through the contact hole passing through the first insulating layer 510 and exposing a portion of the upper surface of the light-emitting element 300.

According to one or more embodiments, a width of the second electrode 220_15 may be less than a width of each of the first electrode 210_15 and the light-emitting element 300. Because the second electrode 220_15 may be in contact with a portion of the light-emitting element 300 exposed through the contact hole of the first insulating layer 510, the second electrode 220_15 may not necessarily be formed to have a width greater than that of the light-emitting element 300. However, the present disclosure is not limited thereto, and the width of the second electrode 220_15 may be less than the width of the first electrode 210 and greater than the width of the light-emitting element 300.

Unlike the embodiments corresponding to FIG. 2, a second voltage line VL2_15 may have a shape extending in one direction with a line branch portion ("VLP" in FIG. 2) omitted. For example, the second voltage line VL2_15 may extend in the first direction DR1 similar to the line stem portion VLS to be located over the plurality of sub-pixels PXn. In one or more embodiments, the second electrode 220_15 may extend in one direction to be in direct contact with the second voltage line VL2. However, the present disclosure is not limited thereto. As will be described below, the arrangement and shape of the second voltage line VL2_15 may vary depending on the shape of the second electrode 220_15.

The display device 10_15 of FIGS. 33 and 34 includes the first electrode 210_15 and the groove portion GP, and the light-emitting elements 300 may be located in the groove portion GP of the first electrode 210_15. During a manufacturing process of the display device 10_15, the groove portion GP may guide the light-emitting elements 300 dispersed in an ink to be located in a corresponding location, and the light-emitting elements 300 may be arranged along the groove portion GP of the first electrode 210_15. In the display device 10_15, the light-emitting elements 300 located in each sub-pixel PXn may be arranged in one direction depending on the shape of the groove portion GP, and also, the second electrode 220_15 may have a corresponding shape depending on the arrangement of the light-emitting elements 300.

Figure 35:
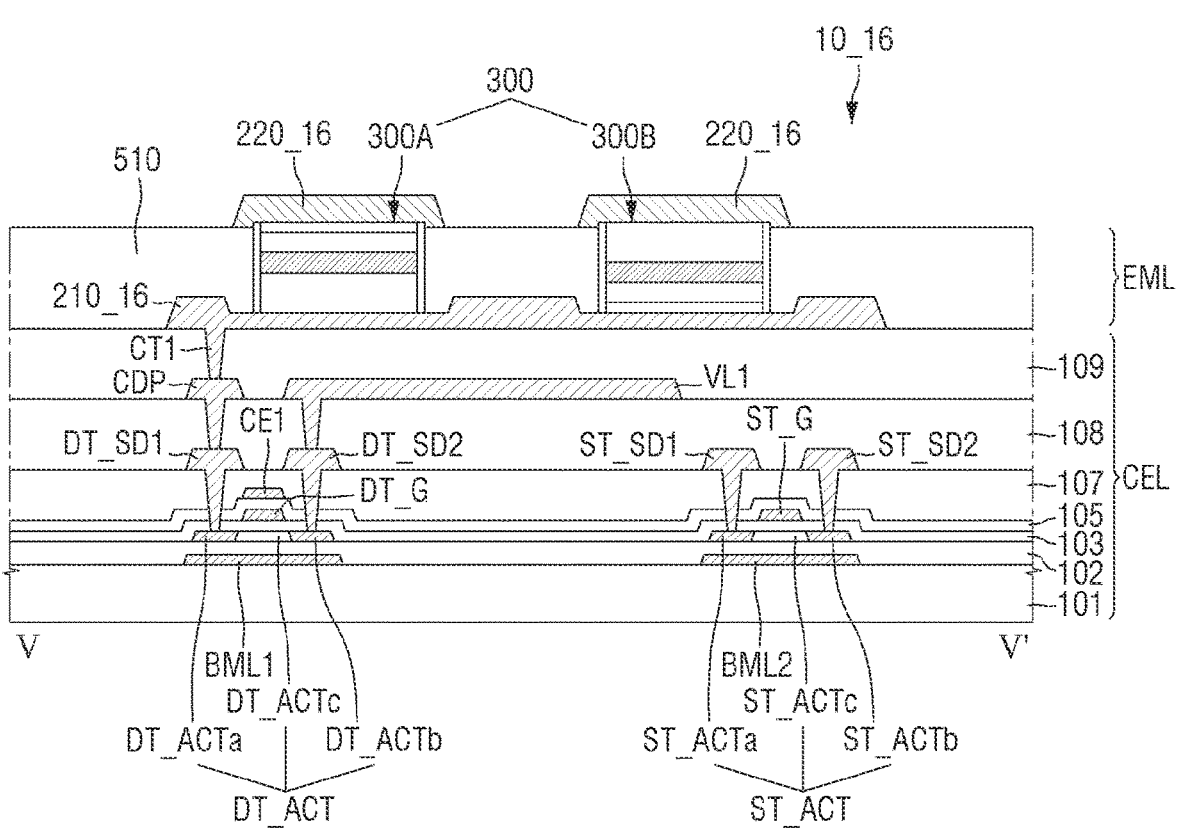
FIG. 35 is a cross-sectional view illustrating a portion of a display device according to one or more embodiments.

FIG. 35 is a cross-sectional view illustrating a portion of a display device according to one or more embodiments.

Referring to FIG. 35, in a display device 10_16 according to one or more embodiments, light-emitting elements 300 may be arranged in one direction, and a second electrode 220_16 may be located to cover an exposed one end surface of the light-emitting element 300. Unlike the display device 10_15 of FIG. 34, a thickness of a first insulating layer 510 may be less than the sum of a height of the light-emitting element 300 and a height of a first electrode 210_16, and one end surface of the light-emitting element 300 may be exposed. A width of the second electrode 220_16 may be formed to be greater than that of the light-emitting element 300 so that the second electrode 220_16 may be located to cover the exposed one end surface of the light-emitting element 300. The display device 10_16 of FIG. 35 is different from the display device 10_15 of FIG. 34 in that the width of the second electrode 220_16 and the thickness of the first insulating layer 510 are different. Because the rest of the description is the same, a redundant description will be omitted.

In one or more embodiments corresponding to FIG. 35, and like in FIG. 34, when the groove portion GP is formed in the first electrode 210_16, the light-emitting elements 300 may be guided to be located in corresponding locations. However, a portion of the upper surface of the first electrode 210_16 is not necessarily recessed, rather, the light-emitting elements 300 may be located at the corresponding locations through an insulating layer located on the first electrode 210_16. According to one or more embodiments, the display device 10 may further include an insulating layer located on the first electrode 210 so that the light-emitting elements 300 may be arranged in one direction.

Figure 36:
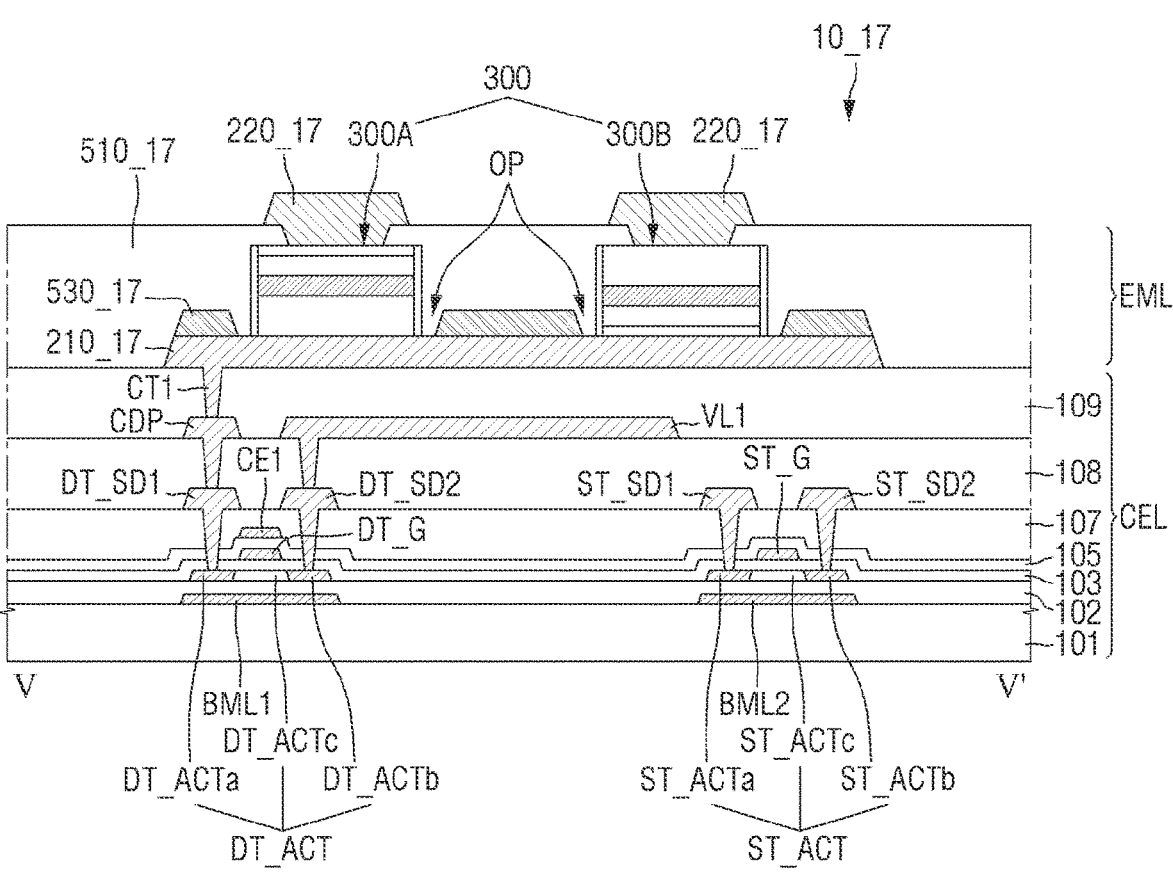
FIG. 36 is a cross-sectional view illustrating a portion of a display device according to one or more embodiments.

FIG. 36 is a cross-sectional view illustrating a portion of a display device according to one or more embodiments.

Referring to FIG. 36, a display device 10_17 according to one or more embodiments may further include a third insulating layer 530_17 located on a first electrode 210_17. The third insulating layer 530_17 may include an opening OP exposing a portion of an upper surface of the first electrode 210_17, and a light-emitting element 300 may be located in the opening OP to be electrically connected to the first electrode 210_17.

In detail, the third insulating layer 530_17 may be located on the first electrode 210_17 by including the opening OP exposing a portion of the upper surface of the first electrode 210_17. As an example, as shown in the drawing, the third insulating layer 530_17 may be located only on the first electrode 210_17, but the present disclosure is not limited thereto. As long as the third insulating layer 530_17 may expose a portion of the first electrode 210_17, the arrangement of the third insulating layer 530_17 may be variously modified. For example, in one or more embodiments, similar to a first insulating layer 510_17, the third insulating layer 530_17 may be entirely located on a first planarization layer 109, including the first electrode 210_17, and the opening OP may be formed to overlap the first electrode 210_17.

The third insulating layer 530_17 includes the opening OP, and thus a stepped portion may be formed in an upper surface of the third insulating layer 530_17. Similar to the groove portion GP formed in the first electrode 210_15 of FIG. 34, the opening OP of the third insulating layer 530_17 may guide the light-emitting elements 300 to be located on corresponding locations, for example, on the first electrode 210_17 exposed by the opening OP, and the light-emitting elements 300 may be arranged in a corresponding direction according to the shape of the opening OP. When the opening OP of the third insulating layer 530_17 has a shape extending in one direction, the plurality of light-emitting elements 300 may be arranged along the one direction in which the opening OP extends. However, the present disclosure is not limited thereto, and the opening OP formed in the third insulating layer 530_17 may have various arrangements and structures. The display device 10_17 according to one or more embodiments may further include the third insulating layer 530_17 in which the opening OP is formed to guide the light-emitting elements 300 to be located at corresponding locations.

In one or more embodiments, as described above, the same electrical signal may be applied to the light-emitting elements 300 of each of the sub-pixels PXn through a second electrode 220. Regardless of whether the light-emitting elements 300 are arranged in one direction, the second electrode 220 may be formed to be greater than the first electrode 210 of each sub-pixel PXn, or may be located beyond another adjacent sub-pixel PXn.

Figure 37:
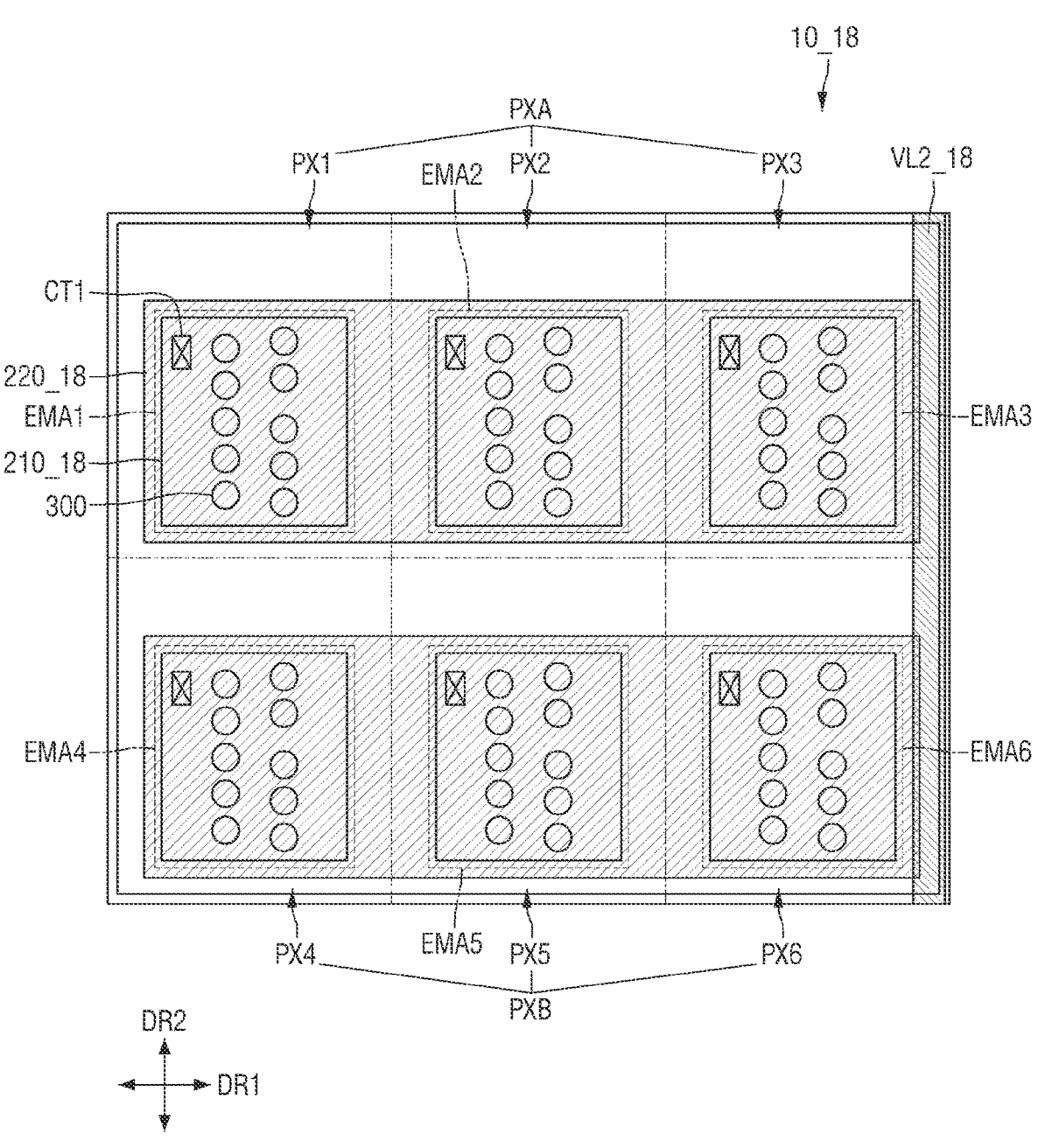
FIGS. 37 and 38 are plan views each illustrating a first pixel and a second pixel of a display device according to one or more embodiments.
Figure 38:
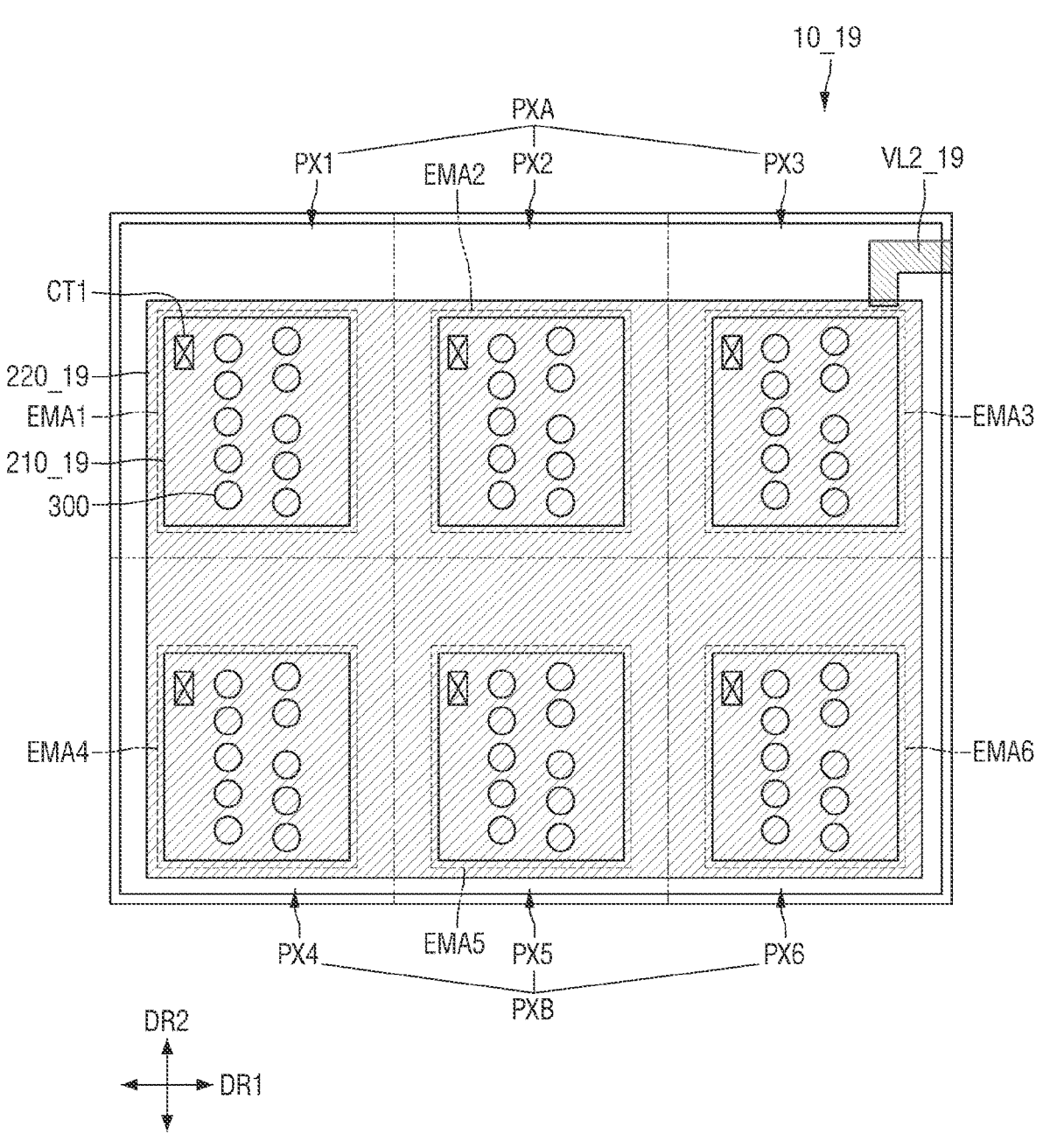

FIGS. 37 and 38 are plan views each illustrating a first pixel and a second pixel of a display device according to one or more embodiments.

Referring to FIG. 37, in a display device 10_18 according to one or more embodiments, light-emitting elements 300 located in each sub-pixel PXn may be arranged in one direction, and a second electrode 220_18 may extend in one direction to be located in each of pixels PXA and PXB and cover a plurality of sub-pixels PXn.

That is, the light-emitting elements 300 located in different sub-pixels may be electrically connected to the same second electrode 220_18. In this case, a second voltage line VL2_18 may not be located in each sub-pixel PXn, and may be located only in some sub-pixels PXn to be electrically connected to the second electrode 220_18. The display device 10_18 of FIG. 37 is different from the display device 10_15 of FIG. 33 in that the shape of the second electrode 220_18 and the arrangement of the second voltage line VL2_18 are different. Hereinafter, repeated descriptions will be omitted, and descriptions will be provided based on differences from the above-described contents.

The second electrode 220_18 may be electrically connected to the second voltage line VL2_18 to apply the same electrical signal to the plurality of sub-pixels PXn. Accordingly, one second electrode 220_18 may be located on some of the sub-pixels PXn to concurrently (e.g., substantially simultaneously) apply the same electrical signal thereto. In the drawing, the second electrode 220_18 is illustrated as being located to cover each of the pixels PXA and PXB. For example, one second electrode 220_18 may be located to have a width greater than that of a first electrode 210_18 and extend in the first direction DR1, but the present disclosure is not limited thereto. The second electrode 220_18 may not necessarily extend in the first direction DR1, and may be formed to cover the plurality of sub-pixels PXn to form an island or linear pattern over the entire surface of the display area DPA.

In one or more embodiments, the second electrode 220_18 may be formed to have a greater width and may be located to cover a larger number of sub-pixels PXn or pixels PXA and PXB.

Referring to FIG. 38, in a display device 10_19 according to one or more embodiments, one second electrode 220_19 may be located on a larger number of sub-pixels PXn and pixels PXA and PXB. One second electrode 220_19 may be located over a first pixel PXA and a second pixel PXB, and a plurality of light-emitting elements 300 located on first to sixth sub-pixels PX1, PX2, PX3, PX4, PX5, and PX6 may be electrically connected to the same second electrode 220_19. Furthermore, the second electrode 220_19 may be entirely located on a display area DPA, and the display device 10_19 may include only one second electrode 220_19. Other descriptions are the same as those described above, and thus a detailed description thereof will be omitted.

In one or more embodiments, the display device 10 may include the light-emitting elements 300 each having a width W greater than a height H, but the light-emitting elements 300 may not necessarily be located to face a constant direction. As described above, the light-emitting element 300 may include a first type light-emitting element 300A and a second type light-emitting element 300B. However, in one or more embodiments, the light-emitting element 300 may have a structure in which the width of the first semiconductor layer 310 is greater than that of the second semiconductor layer 320, and thus the light-emitting elements 300 located on the first electrode 210 may be located to face a downward direction with respect to the first semiconductor layer 310 having a relatively great width. Hereinafter, other embodiments of the light-emitting element 300 will be described.

Figure 39:
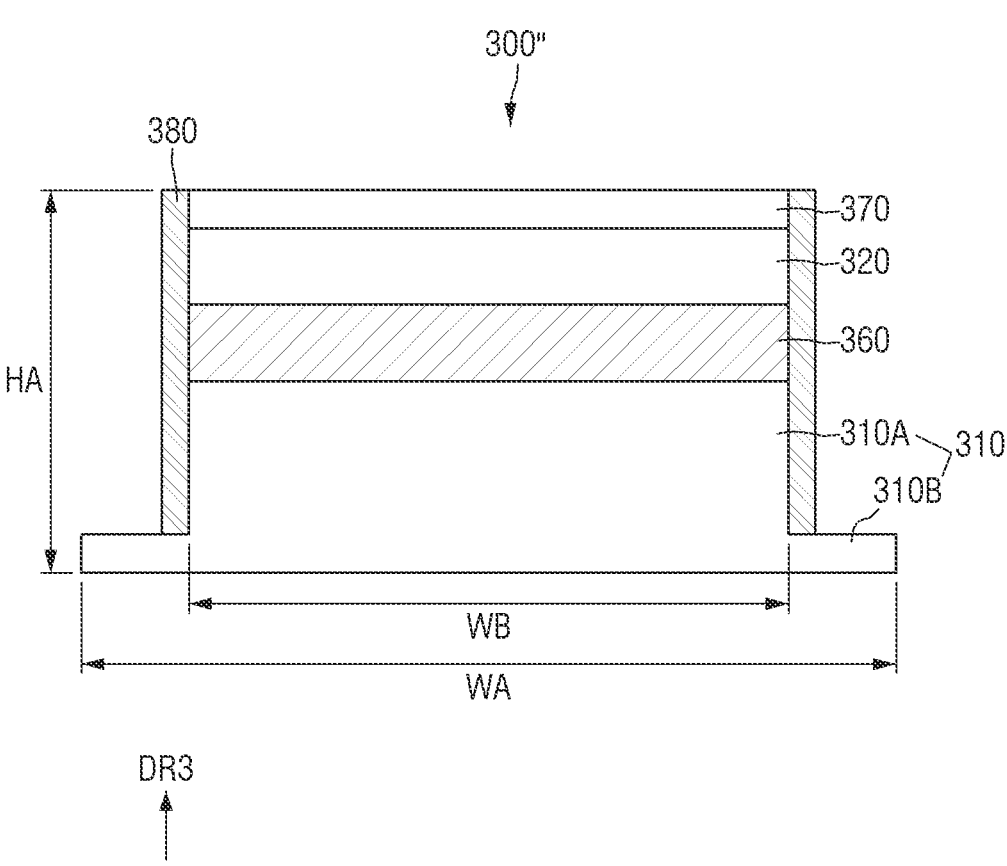
FIGS. 39 and 40 are cross-sectional views each illustrating a light-emitting element according to one or more embodiments.
Figure 40:
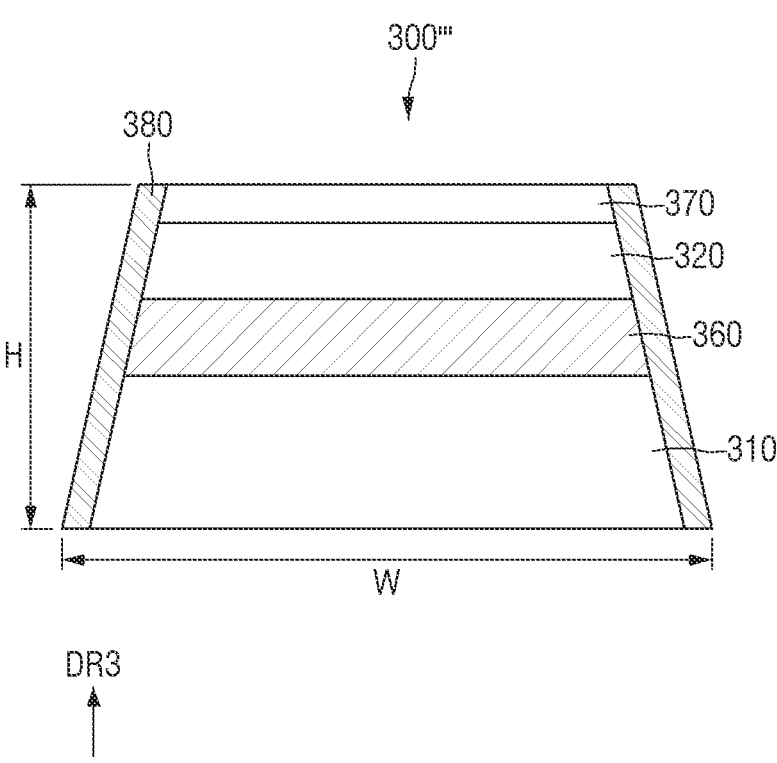

FIGS. 39 and 40 are cross-sectional views each illustrating a light-emitting element according to one or more embodiments.

First, referring to FIG. 39, in a light-emitting element 300″ according to one or more embodiments, a first semiconductor layer 310 may include a body portion 310A and an extension portion 310B. The light-emitting element 300″ of FIG. 39 is different from that of the embodiments corresponding to FIG. 4 in that the first semiconductor layer 310 further includes the extension portion 310B. Hereinafter, the structure of the first semiconductor layer 310 will be described in detail, and other descriptions will be omitted.

According to one or more embodiments, the first semiconductor layer 310 of the light-emitting element 300″ may include the body portion 310A on which an active layer 360 is located and the extension portion 310B having a greater width measured in one direction. A width WB of the body portion 310A of the first semiconductor layer 310 may be substantially the same as a width of each of a second semiconductor layer 320 and the active layer 360, and a width WA of the extension portion 310B of the first semiconductor layer 310 may be greater than the width of the body portion 310A.

An insulating film 380 may be located to be around (e.g., to surround) at least an outer surface (e.g., an outer peripheral or circumferential surface) of the active layer 360 and may be located to be around (e.g., to surround) only the body portion 310A of the first semiconductor layer 310. According to one or more embodiments, the insulating film 380 of the light-emitting element 300″ may be located to be around (e.g., to surround) an outer surface of the body portion 310A of the first semiconductor layer 310 but to expose an upper surface of the extension portion 310B. The light-emitting element 300″ of FIG. 39 may be manufactured by separating a first sub-semiconductor layer 3100′ (e.g., see FIG. 7), some of which remains after a first etch process ("1$^{st}$ etch" in FIG. 6), from a lower substrate 1000. The insulating film 380 may be formed through a process of disposing an insulating material to cover the first sub-semiconductor layer 3100′ and a semiconductor core 30 and then exposing an upper surface of a semiconductor core 30. Here, the insulating material formed on the first sub-semiconductor layer 3100′ may be removed, and thus the insulating film 380 may be formed to be around (e.g., surround) only the outer surface (e.g., an outer peripheral or circumferential surface) of the semiconductor core 30. That is, in the light-emitting element 300″, the insulating film 380 may be around (e.g., may surround) only the outer surface (e.g., an outer peripheral or circumferential surface) of the body portion 310A of the first semiconductor layer 310 and expose the upper surface of the extension portion 310B.

In the light-emitting element 300″ according to one or more embodiments, because the first semiconductor layer 310 includes the extension portion 310B having a greater width, based on a middle portion of the light-emitting element 300, one end of the light-emitting element 300, on which the first semiconductor layer 310 is located, may have a relatively larger mass than the other end thereof, on which the second semiconductor layer 320 is located.

Referring to FIG. 40, a light-emitting element 300‴ according to one or more embodiments may include a first semiconductor layer 310 having a width that is greater than a width of a second semiconductor layer 320 in the third direction DR3 and may have a shape whose width decreases from the first semiconductor layer 310 toward the third direction DR3 that is a direction in which the first semiconductor layer 310 and the second semiconductor layer 320 are stacked. That is, the light-emitting element 300‴ may have a shape whose side surface is inclined. Like the light-emitting element 300″ of FIG. 39, in the light-emitting element 300‴ according to one or more embodiments, the width of the first semiconductor layer 310 is formed to be greater than that of the second semiconductor layer 320 in the third direction DR3, and one end of the light-emitting element 300‴, on which the first semiconductor layer 310 is located may have a relatively larger mass than the other end thereof, on which the second semiconductor layer 320 is located.

During the manufacturing process of the display device 10, the light-emitting elements 300 dispersed in the ink may be precipitated due to the gravity or electric field and located on the first electrode 210. When both ends of the light-emitting elements 300 have a uniform width, the light-emitting elements 300 may be precipitated in the ink without directionality, and as shown in FIG. 3, the light-emitting element 300 included in the display device 10 may include a first type light-emitting element 300A or a second type light-emitting element 300B.

However, when the light-emitting element 300″ includes the first semiconductor layer 310 including the extension portion 310B having a greater width, or a width of the first semiconductor layer 310 is further increased, a probability that the light-emitting element 300″ is precipitated so that the first semiconductor layer 310 faces downward may increase when the light-emitting element 300″ is precipitated in the ink. During the manufacturing process of the display device 10, when the ink is sprayed onto the first electrode 210, the light-emitting elements 300″ may be precipitated and located on the first electrode 210. The probability that the light-emitting elements 300″ according to one or more embodiments are precipitated so that the first semiconductor layer 310 faces downward may increase, and in the display device 10, most of the light-emitting elements 300″ may each be the first type light-emitting element 300A of which the first semiconductor layer 310 is electrically connected to the first electrode 210.

Figure 41:
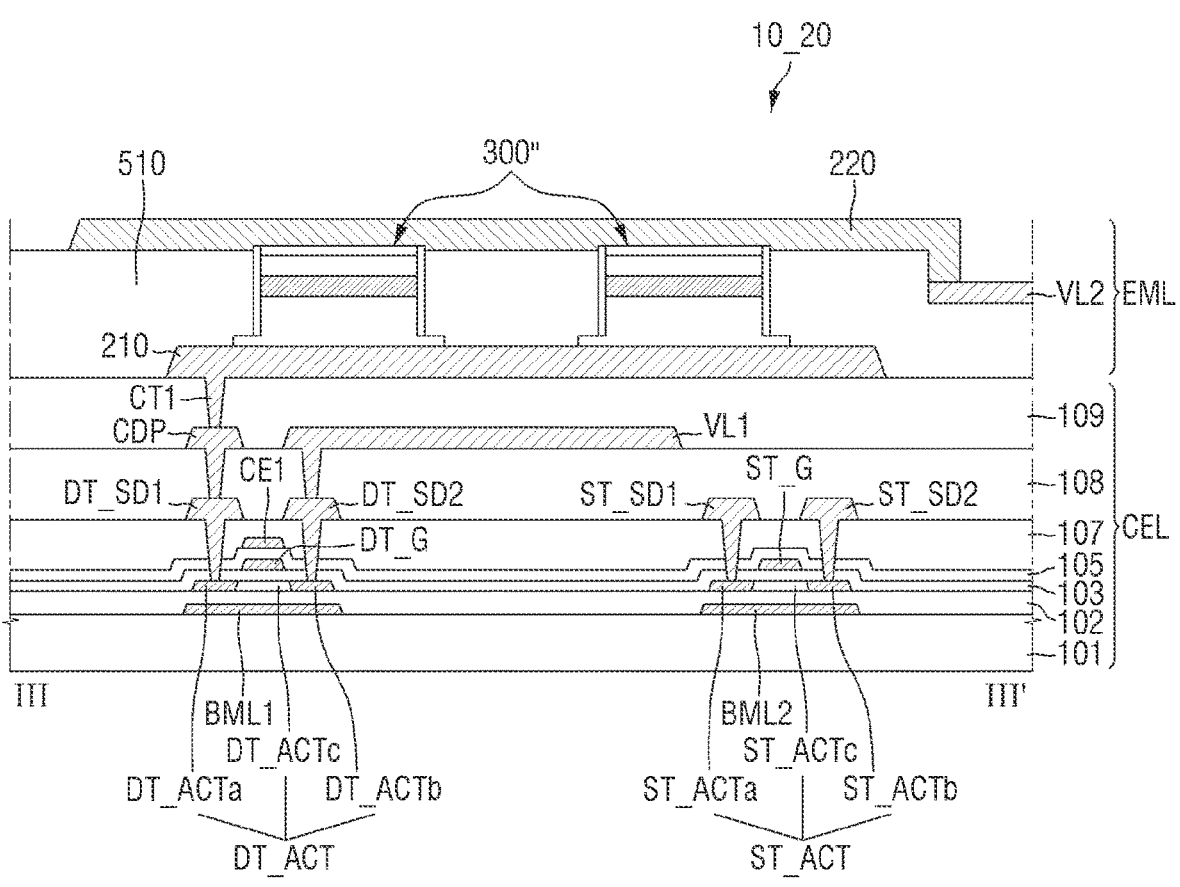
FIGS. 41 and 42 are cross-sectional views each illustrating a portion of a display device including the light-emitting element of FIG. 39.
Figure 42:
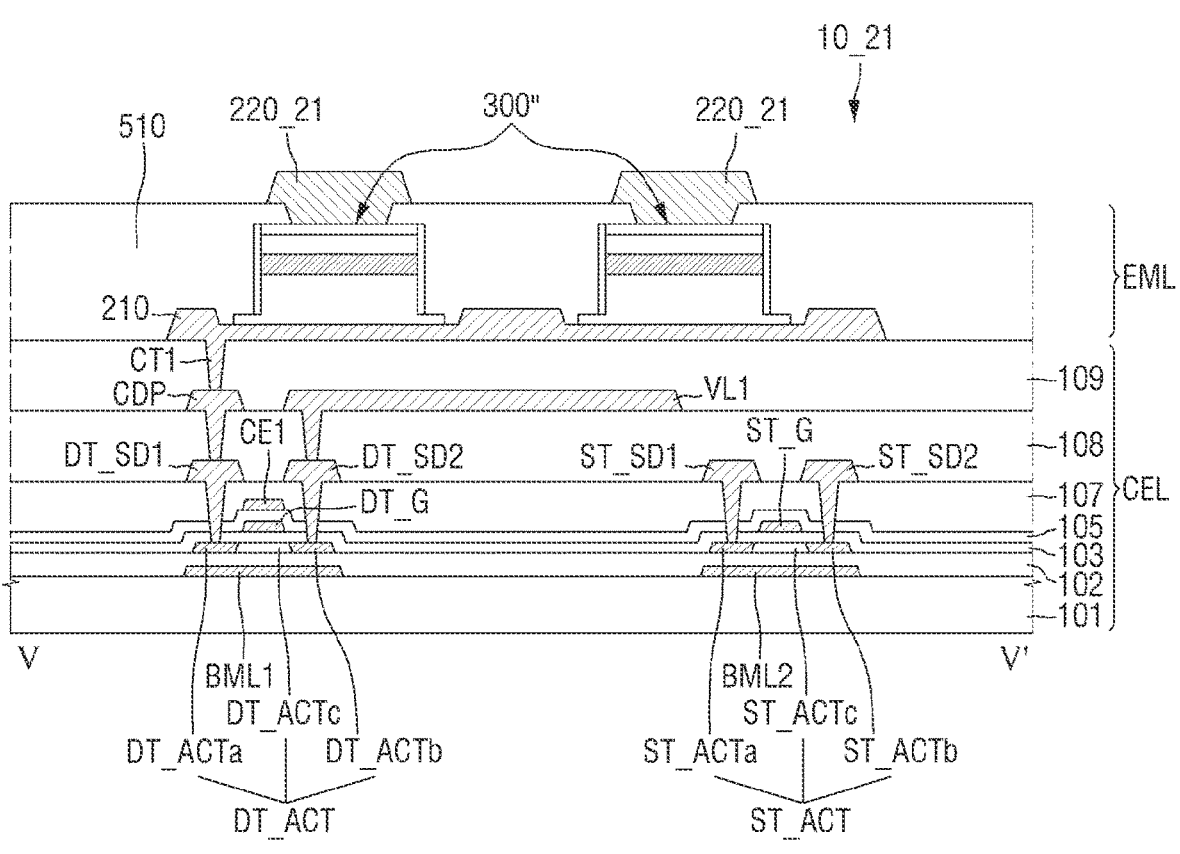

FIGS. 41 and 42 are cross-sectional views each illustrating a portion of a display device including the light-emitting element of FIG. 39.

Referring to FIGS. 41 and 42, display devices 10_20 and 10_21 according to one or more embodiments include the light-emitting element 300″ of FIG. 39, and the light-emitting elements 300″ may each be a first type light-emitting element 300A of which a first semiconductor layer 310 is electrically connected to a first electrode 210. The display device 10_20 of FIG. 41 illustrates an example in which the display device 10 of FIG. 3 includes the light-emitting element 300″ of FIG. 39, and the display device 10_21 of FIG. 42 illustrates an example in which the display device 10_15 of FIG. 34 includes the light-emitting element 300″ of FIG. 39. In addition, in one or more embodiments, the display devices 10_20 and 10_21 may also include the light-emitting element 300‴ of FIG. 40.

As described above, because the light-emitting elements 300″ and 300‴ of FIGS. 39 and 40 may each include the first semiconductor layer 310 including a portion having a greater width, a probability that the light-emitting elements are precipitated in a state of being dispersed in ink so that the first semiconductor layer 310 faces downward may increase. Accordingly, as shown in FIGS. 41 and 42, in the display device 10, the first semiconductor layers 310 of a larger number of light-emitting elements 300 may be electrically connected to the first electrode 210, and the second semiconductor layers 320 thereof may be electrically connected to the second electrode 220. That is, in the display device 10, a probability that the light-emitting elements 300 located in each sub-pixel PXn is the first type light-emitting elements 300A may be increased. Other descriptions may be the same as those described above, and thus, a detailed description thereof will be omitted.

In one or more embodiments, in the light-emitting element 300" of FIG. 39, the upper surface of the extension portion 310B of the first semiconductor layer 310 may be exposed without forming the insulating film 380 thereon. The display device 10 according to one or more embodiments may include the light-emitting element 300" of FIG. 39, and may further include a contact electrode in contact with the extension portion 310B of the first semiconductor layer 310 and the first electrode 210.

Figure 43:
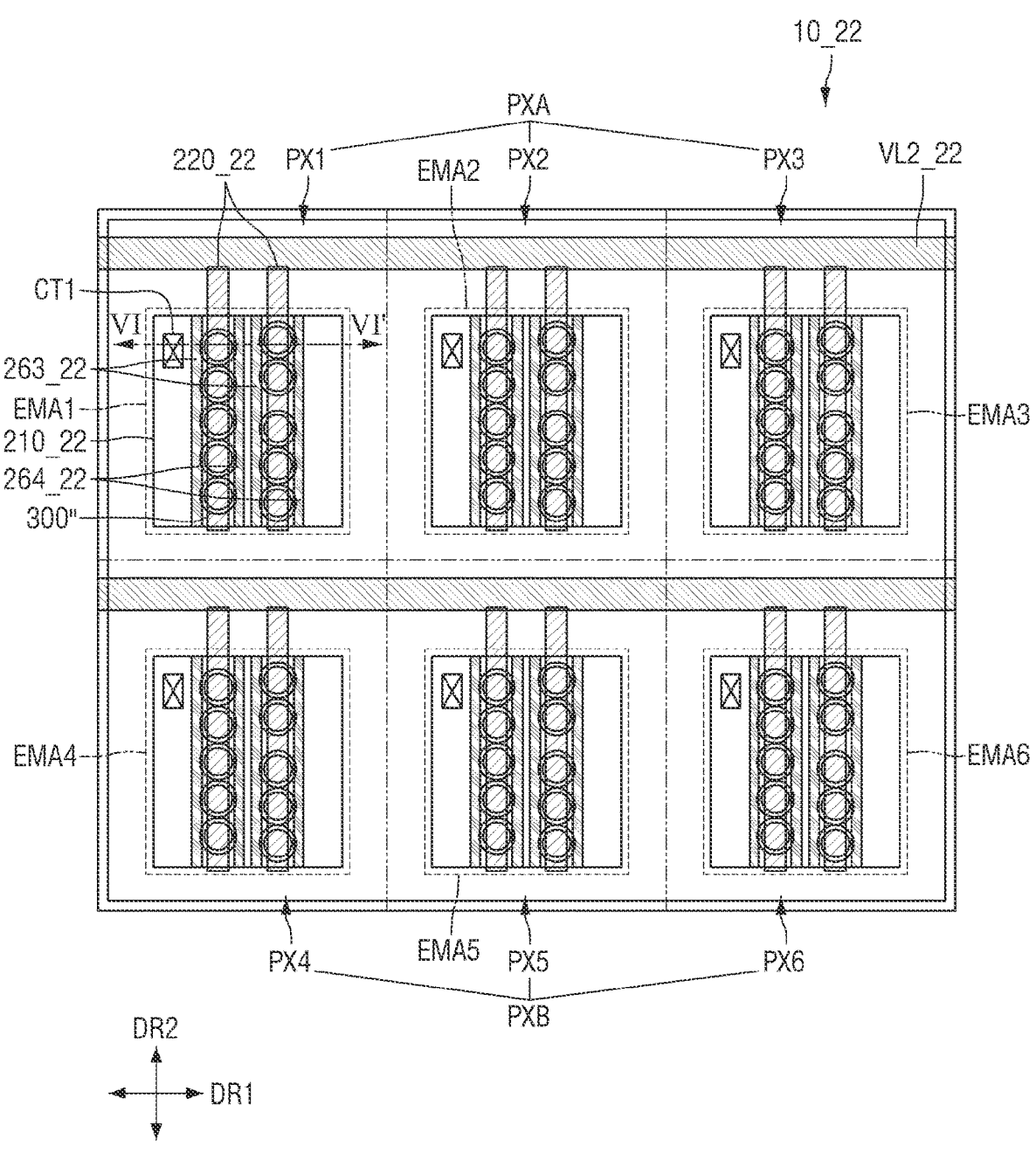
FIG. 43 is a plan view illustrating a first pixel and a second pixel of a display device according to one or more embodiments.
Figure 44:
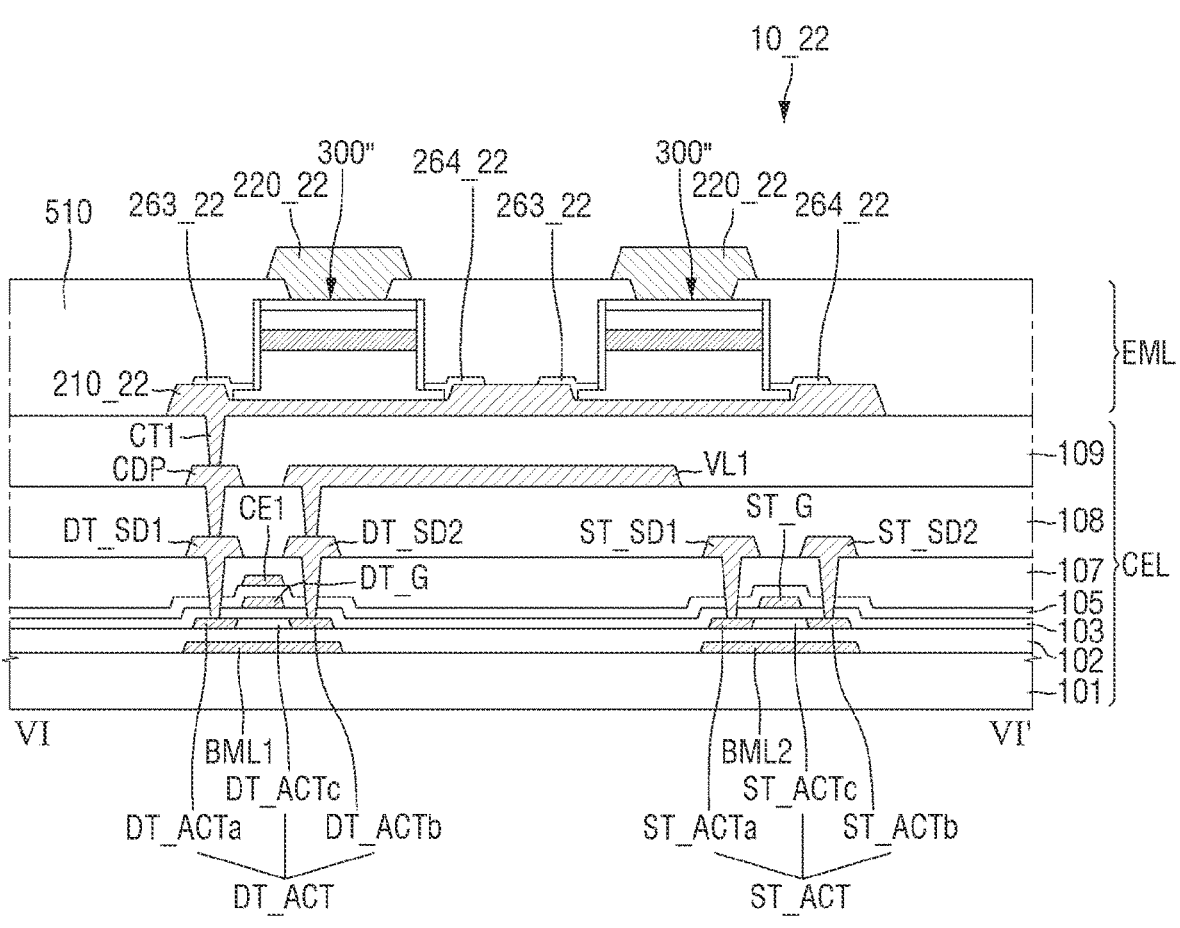
FIG. 44 is a cross-sectional view taken along the line VI-VI' of FIG. 43.

FIG. 43 is a plan view illustrating a first pixel and a second pixel of a display device according to one or more embodiments. FIG. 44 is a cross-sectional view taken along the line VI-VI' of FIG. 43.

Referring to FIGS. 43 and 44, a display device 10_22 according to one or more embodiments may include the light-emitting element 300" of FIG. 39, and may further include a third contact electrode 263_22 and a fourth contact electrode 264_22, which are in contact with the extension portion 310B of the first semiconductor layer 310. The display device 10_22 of FIGS. 43 and 44 is different from that of the embodiments corresponding to each of FIGS. 33 and 42 in that the display device 10_22 further includes the third contact electrode 263_22 and the fourth contact electrode 264_22. Hereinafter, repeated descriptions will be omitted, and descriptions will be provided based on differences from the above-described contents.

The display device 10_22 according to one or more embodiments may include the light-emitting element 300" of FIG. 39, and the light-emitting element 300" may be located in a groove portion GP of a first electrode 210_22. In one or more embodiments, the width of the extension portion 310B of the first semiconductor layer 310 of the light-emitting element 300" may be less than a width of the groove portion GP of the first electrode 210_22. Accordingly, the light-emitting elements 300" each including the first semiconductor layer 310 including the extension portion 310B may be located in the groove portion GP and may be arranged along one direction on the first electrode 210_22.

The third contact electrode 263_22 may be in contact with one side of the extension portion 310B of the light-emitting element 300" and the first electrode 210_22, and the fourth contact electrode 264_22 may be in contact with the other side of the extension portion 310B of the light-emitting element 300" and the first electrode 210_22. The third contact electrode 263_22 and the fourth contact electrode 264_22 may each extend in one direction, for example, in the second direction DR2, along the groove portion GP. The third contact electrode 263_22 and the fourth contact electrode 264_22 may be made of the same material as the first contact electrode 261_2 and the second contact electrode 262_2 described above. As an example, the third contact electrode 263_22 and the fourth contact electrode 264_22 may include a conductive material, such as ITO, IZO, ITZO, aluminum (Al), or the like.

The third contact electrode 263_22 and the fourth contact electrode 264_22 may be located to cover the exposed portion of the extension portion 310B. For example, the third contact electrode 263_22 and the fourth contact electrode 264_22 may be located to cover the upper and side surfaces of the extension portion 310B, and may be partially in contact with the insulating film 380 of the light-emitting element 300. In the light-emitting element 300", the first semiconductor layer 310 may be electrically connected to the first electrode 210_22 through the third contact electrode 263_22 and the fourth contact electrode 264_22 while being in direct contact with the first electrode 210_22. The third contact electrode 263_22 and the fourth contact electrode 264_22 may reduce contact resistance between the first semiconductor layer 310 and the first electrode 210_22 made of different materials.

In one or more embodiments, the third contact electrode 263_22 and the fourth contact electrode 264_22 may be in contact with the extension portion 310B of the light-emitting element 300" and the first electrode 210_22. That is, because the third contact electrode 263_22 and the fourth contact electrode 264_22 may be in contact with the same layers, portions thereof located adjacent to each other may be connected to each other to be integrated. For example, the fourth contact electrode 264_22 in contact with the light-emitting element 300" located on one groove portion GP and the third contact electrode 263_22 in contact with the light-emitting element 300" located on another groove portion GP may be located adjacent to each other, and may be integrated to form one contact electrode.

Figure 45:
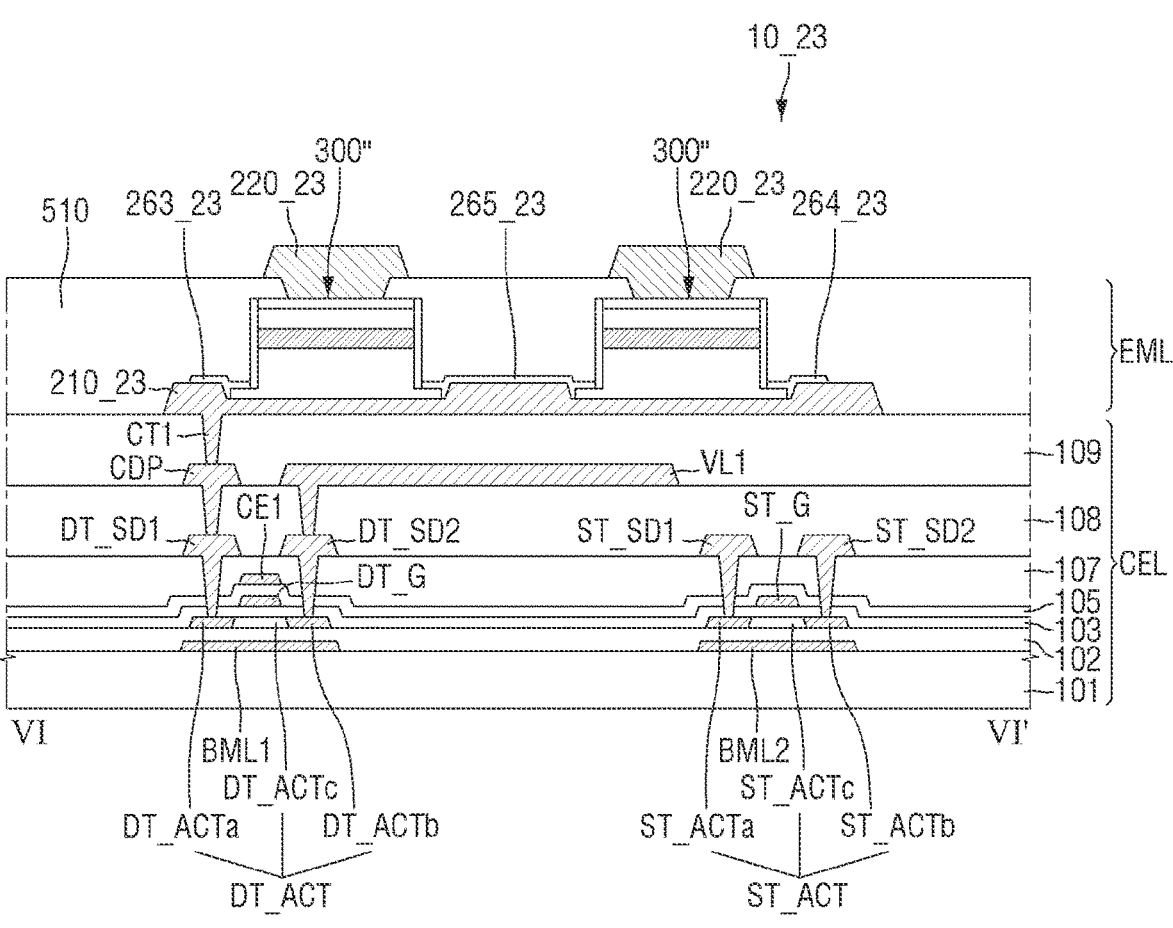
FIG. 45 is a cross-sectional view illustrating a portion of a display device according to one or more embodiments.

FIG. 45 is a cross-sectional view illustrating a portion of a display device according to one or more embodiments.

Referring to FIG. 45, a display device 10_23 according to one or more embodiments may include a third contact electrode 263_23 in contact with one side of the extension portion 310B of the light-emitting element 300", a fourth contact electrode 264_23 in contact with the other side of the extension portion 310B of another light-emitting element 300", and a fifth contact electrode 265_23 concurrently (e.g., substantially simultaneously) in contact with one side of the extension portion 310B and the other side of the extension portion 310B of another light-emitting element 300". The fifth contact electrode 265_23 may be formed by integrating the fourth contact electrode 26422 (FIG. 44) in contact with the light-emitting element 300" located in one groove portion GP and the third contact electrode 26322 (FIG. 44) in contact with the light-emitting element 300" located in another groove portion GP. The third contact electrode 263_23, the fourth contact electrode 264_23, and the fifth contact electrode 265_23 may each be in contact with the extension portion 310B of the light-emitting element 300" and a first electrode 210_23, and the first semiconductor layer 310 of the light-emitting element 300" may be electrically connected to the first electrode 210_23 through the third contact electrode 263_23, the fourth contact electrode 264_23, and the fifth contact electrode 265_23. Other descriptions may be the same as described above.

In one or more embodiments, during the manufacturing process of the display device 10, the light-emitting element 300 may be sprayed in a state of being dispersed in the ink. As described above, in the display device 10, different types of light-emitting elements 300 may be located in each sub-pixel PXn, and inks in which different light-emitting elements 300 are dispersed may be sprayed in different sub-pixels PXn. According to one or more embodiments, the display device 10 may further include a bank layer located at a boundary of each sub-pixel PXn to divide each of the sub-pixels PXn and reduce or prevent the likelihood of the ink overflowing during the manufacturing process.

Figure 46:
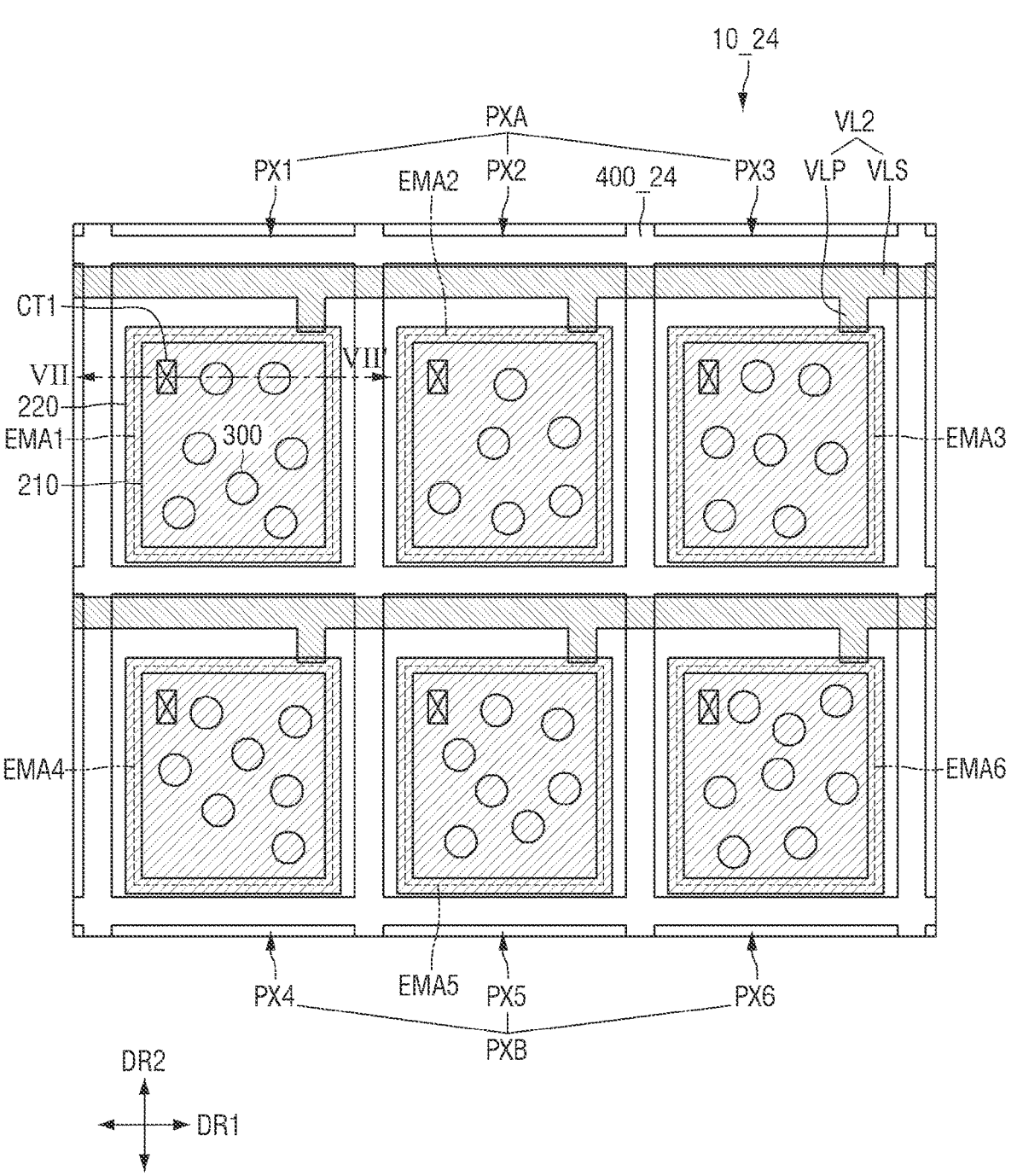
FIG. 46 is a plan view illustrating a first pixel and a second pixel of a display device according to one or more embodiments.
Figure 47:
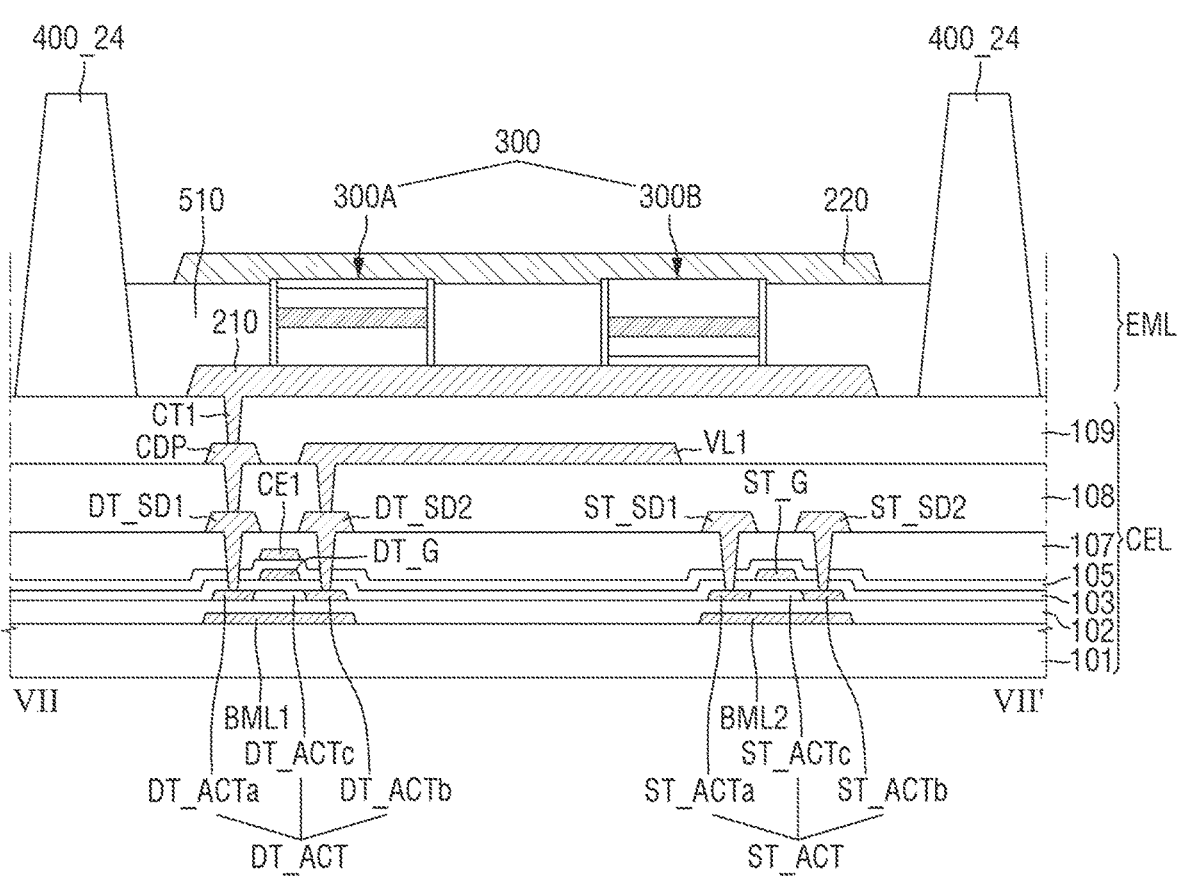
FIG. 47 is a cross-sectional view taken along the line VII-VII' of FIG. 46.

FIG. 46 is a plan view illustrating a first pixel and a second pixel of a display device according to one or more embodiments. FIG. 47 is a cross-sectional view taken along the line VII-VII' of FIG. 46.

Referring to FIGS. 46 and 47, a display device 10_24 may include a bank layer 400_24 located at a boundary of each sub-pixel PXn. The display device 10_24 of FIGS. 46 and 47 is different from that of the embodiments corresponding to FIGS. 2 and 3 in that the bank layer 400_24 is further located. Hereinafter, a duplicate description will be omitted and the bank layer 400_24 will be described in detail.

The bank layer 400_24 may be located on a first planarization layer 109. As shown in FIGS. 46 and 47, the bank layer 400_24 may be located at a boundary between each of the sub-pixels PXn. The bank layer 400_24 may be located to extend in the first direction DR1 and the second direction DR2, and may be located to be around (e.g., to surround) a portion of each of a first electrode 210, the second electrode 220, and a first insulating layer 510, including an area in which the first electrode 210 and light-emitting elements 300 are located. That is, the bank layer 400_24 may be located to be around (e.g., to surround) each sub-pixel PXn, and the bank layer 400_24 may form a grid pattern on the entire surface of a display area DPA.

According to one or more embodiments, a height of the bank layer 400_24 may be greater than a height of the first insulating layer 510 and a height of the light-emitting element 300. The bank layer 400_24 may divide adjacent sub-pixels PXn, and concurrently (e.g., substantially simultaneously), as will be described below, may reduce or prevent the likelihood of an ink overflowing to the adjacent sub-pixel PXn in an inkjet printing process for disposing the light-emitting element 300 during a manufacturing process of the display device 10. The bank layer 400_24 may separate inks in which different light-emitting elements 300 are dispersed in different sub-pixels PXn from each other to reduce or prevent mixture of the inks with each other. The bank layer 400_24 may include polyimide (PI), but the present disclosure is not limited thereto.

Figure 48:
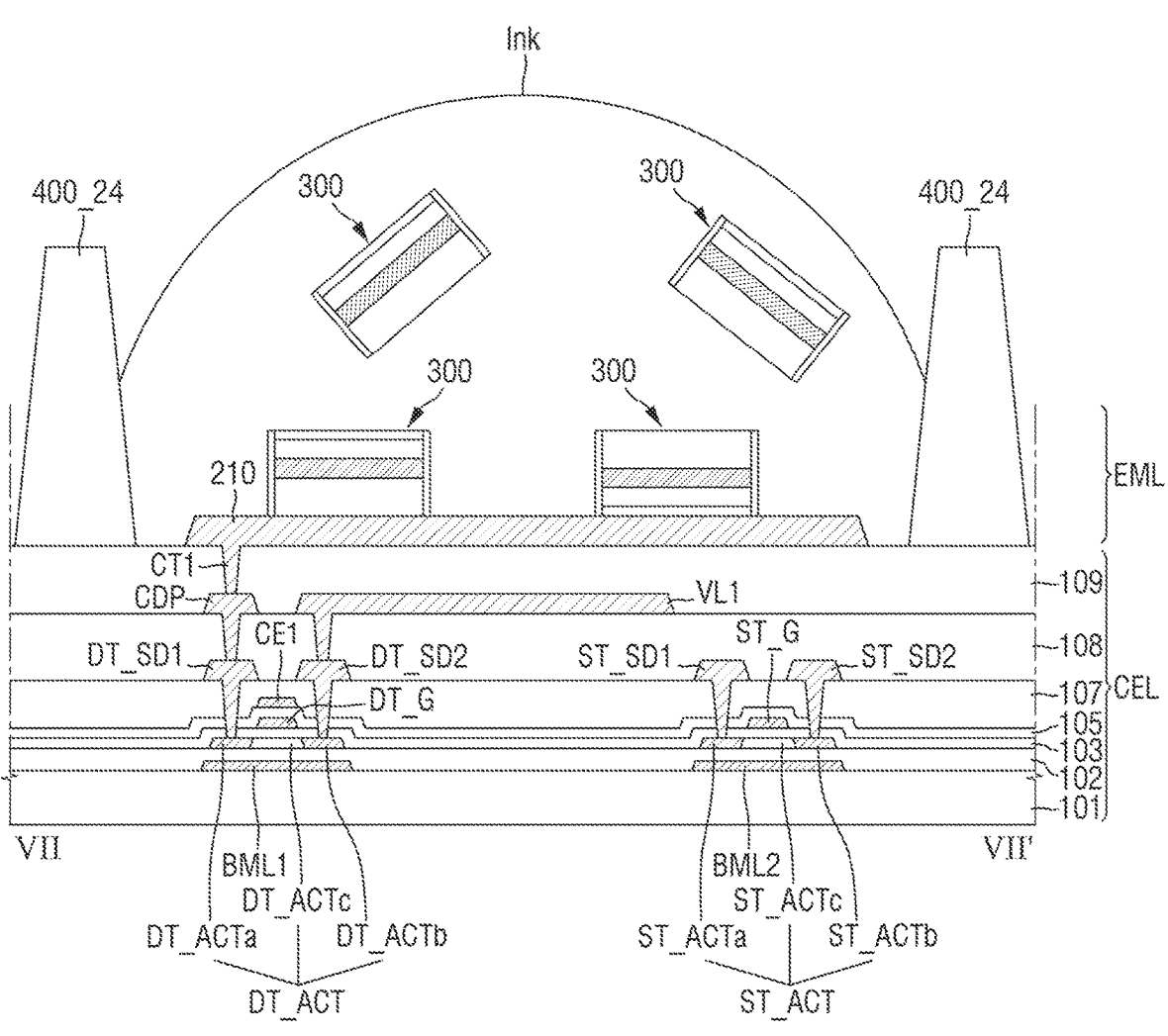
FIG. 48 is a cross-sectional view illustrating one operation of the manufacturing process of the display device of FIG. 46.

FIG. 48 is a cross-sectional view illustrating one operation of the manufacturing process of the display device of FIG. 46.

Referring to FIG. 48, when the ink "Ink" in which the light-emitting elements 300 are dispersed is sprayed onto the first electrode 210 during the manufacturing process of the display device 10_24, the ink "Ink" may be located in a space formed by the bank layer 400_24, and the bank layer 400_24 may reduce or prevent the likelihood of the ink "Ink" overflowing to another adjacent sub-pixel PXn. The ink "Ink" may be sprayed into the space formed by the bank layer 400_24, and the light-emitting elements 300 may be smoothly located on the first electrode 210. When each of the sub-pixels PXn includes different light-emitting elements 300, in the display device 10_24 including the bank layer 400_24, mixture of the light-emitting elements 300 that are located on different sub-pixels PXn with each other may be reduced or prevented.

In concluding the detailed description, those skilled in the art will appreciate that many variations and modifications can be made to the embodiments without substantially departing from the principles and scope of the present disclosure. Therefore, the embodiments of the present disclosure are used in a generic and descriptive sense only and not for purposes of limitation.

What is claimed is:

1. A display device comprising:
   a first substrate;
   a first electrode on the first substrate;
   a second electrode on the first electrode;
   a first light-emitting element and a second light-emitting element between the first electrode and the second electrode, each of the first light-emitting element and the second light-emitting element comprising one end electrically connected to the first electrode, and the other end electrically connected to the second electrode; and
   a first insulating layer between the first electrode and the second electrode to partially surround an outer surface of each of the first light-emitting element and the second light-emitting element,
   wherein each of the first light-emitting element and the second light-emitting element comprises:
      a first semiconductor layer doped with a first type of dopant;
      a second semiconductor layer doped with a second type of dopant different from the first type of dopant; and
      an active layer between the first semiconductor layer and the second semiconductor layer, wherein a length of each of the first light-emitting element and the second light-emitting element in a first direction, in which the first semiconductor layer, the active layer, and the second semiconductor layer are arranged, is less than a width thereof in a second direction that is perpendicular to the first direction, and
   wherein a distance between the active layer of the first light-emitting element and the first substrate is different from a distance between the active layer of the second light-emitting element and the first substrate.

2. The display device of claim 1, wherein:
   both ends of each of the first light-emitting element and the second light-emitting element are in direct contact with the first electrode and the second electrode.

3. The display device of claim 2, wherein:
   at least a partial area of the other end of each of the first light-emitting element and the second light-emitting element protrudes from an upper surface of the first insulating layer, and
   the second electrode covers the protruding other end.

4. The display device of claim 2, wherein a width of the second electrode measured in the second direction is greater than a width of the first electrode measured in the second direction.

5. The display device of claim 2, wherein a width of the second electrode measured in the second direction is less than the width of each of the first light-emitting element and the second light-emitting element measured in the second direction.

6. The display device of claim 1, further comprising:
   a first contact electrode on the first electrode; and
   a second contact electrode between the first insulating layer and the second electrode,
   wherein both ends of each of the first light-emitting element and the second light-emitting element are in direct contact with the first contact electrode and the second contact electrode.

7. The display device of claim 1, wherein the first electrode comprises:
   a first electrode base layer for reflecting light emitted from the first light-emitting element and the second light-emitting element; and
   a first electrode upper layer on the first electrode base layer.

8. The display device of claim 1, wherein:
   the first light-emitting element is a first type light-emitting element in which the first semiconductor layer is electrically connected to the first electrode; and
   the second light-emitting element is a second type light-emitting element in which the first semiconductor layer is electrically connected to the second electrode.

9. The display device of claim 1, further comprising a second insulating layer covering the first insulating layer and the second electrode.

10. The display device of claim 9, wherein at least one of the first insulating layer and the second insulating layer further comprises a scatterer.

11. The display device of claim 1, wherein:

the first electrode defines a groove portion that is level with an upper surface of the first electrode, and each of the first light-emitting element and the second light-emitting element are in the groove portion.

12. The display device of claim 11, wherein the first semiconductor layer of each of the first light-emitting element and the second light-emitting element comprises:

a body portion in which the active layer is located; and an extension portion having a width in the second direction that is greater than a width of the body portion, and that is less than a width of the groove portion.

13. The display device of claim 12, further comprising:

a third contact electrode in contact with one side of the extension portion of the first light-emitting element and the first electrode; and a fourth contact electrode in contact with an other side of the extension portion of the first light-emitting element and the first electrode.

14. The display device of claim 1, further comprising a third insulating layer on the first electrode, and defining an opening exposing a portion of an upper surface of the first electrode, and having each of the first light-emitting element and the second light-emitting element therein.

15. A display device comprising:

a first substrate having pixels thereon;

a first electrode on the first substrate, and in the pixels;

a second electrode partially overlapping the first electrode; and a first light-emitting element and a second light-emitting element, each of the first light-emitting element and the second light-emitting element having a width that is greater than a separation distance between the first electrode and the second electrode, and comprising:

one end electrically connected to the first electrode;

another end electrically connected to the second electrode, a first semiconductor layer doped with a first type of dopant;

a second semiconductor layer doped with a second type of dopant that is different from the first type of dopant; and an active layer between the first semiconductor layer and the second semiconductor layer, wherein a distance between the active layer of the first light-emitting element and the first substrate is different from a distance between the active layer of the second light-emitting element and the first substrate.

16. The display device of claim 15, wherein:

the first electrode is in a first pixel of the pixels; and the first light-emitting element is between the first electrode and the second electrode.

17. The display device of claim 16, wherein the second electrode is in the first pixel, and has a width that is greater than a width of the first electrode measured in one direction.

18. The display device of claim 17, further comprising a third electrode on the first substrate of a second pixel of the pixels, wherein the second electrode partially overlaps the third electrode in the second pixel, and wherein a third light-emitting element is between the second electrode and the third electrode.

19. The display device of claim 16, further comprising a bank layer on the first substrate to at least partially surround each of the pixels.

20. The display device of claim 15, wherein:

the first electrode defines a groove portion extending in one direction, and defined by a recessed portion of an upper surface of the first electrode; and each of the first light-emitting element and the second light-emitting element is in the groove portion and arranged along the one direction.

21. The display device of claim 20, wherein the second electrode extends in the one direction, and overlaps the groove portion of the first electrode.

* * * * *